United States Patent [19]
Watanabe et al.

[11] Patent Number: 5,910,019
[45] Date of Patent: Jun. 8, 1999

[54] METHOD OF PRODUCING SILICON LAYER HAVING SURFACE CONTROLLED TO BE UNEVEN OR EVEN

[75] Inventors: Hirohito Watanabe; Ichiro Honma, both of Tokyo, Japan

[73] Assignee: NEC Corporation, Tokyo, Japan

[21] Appl. No.: 08/829,358

[22] Filed: Apr. 2, 1997

Related U.S. Application Data

[62] Division of application No. 08/611,178, Mar. 5, 1996.

[51] Int. Cl.⁶ ................................................. H01L 21/00
[52] U.S. Cl. ...................... 438/488; 438/482; 438/486; 438/489; 438/442; 438/481; 438/488
[58] Field of Search ..................... 438/482, 488, 438/486, 489, 442, 481

[56] References Cited

U.S. PATENT DOCUMENTS

| | | | |
|---|---|---|---|
| 4,497,683 | 2/1985 | Celler et al. | 438/413 |
| 4,966,861 | 10/1990 | Mieno et al. | 438/442 |
| 5,147,826 | 9/1992 | Liu et al. | 438/486 |
| 5,561,074 | 10/1996 | Koide et al. | 438/159 |

*Primary Examiner*—Charles Bowers
*Assistant Examiner*—Thanh Nguyen
*Attorney, Agent, or Firm*—Foley, Hoag & Eliot, LLP

[57] ABSTRACT

A method of forming a silicon layer disclosed herein includes the steps of depositing an amorphous silicon layer on a substrate, irradiating a silane gas to the substrate, and performing an annealing process in a high vacuum or in an inert gas. The amorphous silicon layer is thereby converted into a silicon layer having an uneven surface caused by hemispherical or spherical silicon grains. The annealing process may be performed while irradiating a hydrogen gas or an oxidizing gas. In this case, such a silicon layer that has an even surface is formed.

2 Claims, 36 Drawing Sheets

| GROWTH MODE | SUPPLY | REACTION |
|---|---|---|
| 1. Epitaxy | $\Delta V \propto F_S \cdot S \cdot \Delta t$<br>$\Delta \ell = \Delta V / S$<br>$\propto \Delta t$ | $\Delta V \propto N_S \cdot S \cdot \Delta t$<br>$\Delta \ell = \Delta V / S$<br>$\propto \Delta t$ |
| 2. HSG | $\Delta V \propto \pi\{(r+f_S)^2 - r^2\} \cdot \Delta t$<br>$f_S >> r \; \Delta(r^3) \propto \Delta V$<br>$\propto \pi \cdot f_S^2 \cdot \Delta t$<br>$f_S << r \; \Delta(r^3) \propto \Delta$<br>$\propto 2\pi r \cdot f \cdot \Delta$ | $\Delta V \propto N_S \cdot S_{HSG} \cdot \Delta t$<br>$\Delta r = \Delta(r^3)/3r^2$<br>$\propto \Delta V / S_{HSG}$<br>$= N_S \cdot \Delta t$ |
| 3. HSG (Mushroom) | $\Delta(r^3) \propto \Delta$<br>$\propto f_S \cdot \Delta t$ | $\Delta V \propto N_S \cdot S_{HSG} \cdot \Delta t$<br>$\Delta r = \Delta(r^3)/3r^2$<br>$\propto \Delta V / S_{HSG}$<br>$= N_S \cdot \Delta$ |
| 4. HSG (Plateau) | $L \cdot \Delta(r^2) \propto \Delta t$<br>$\propto 2\pi \cdot r \cdot f_S \cdot \Delta t$ | |

FIG. 8

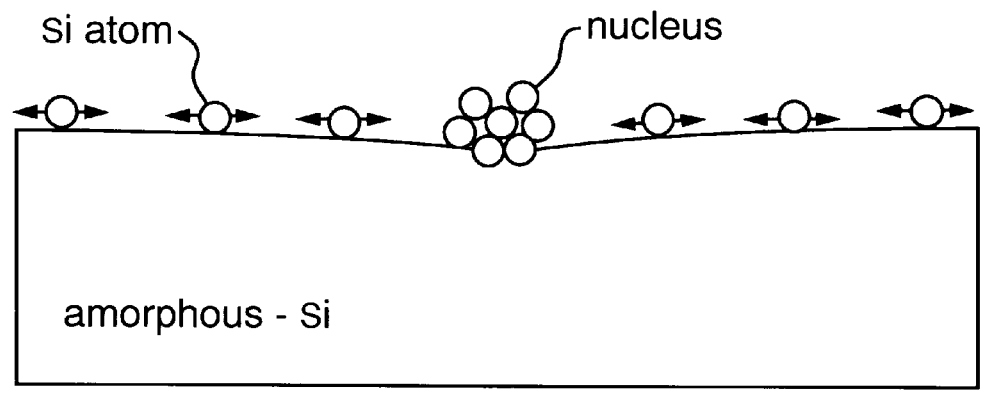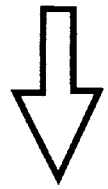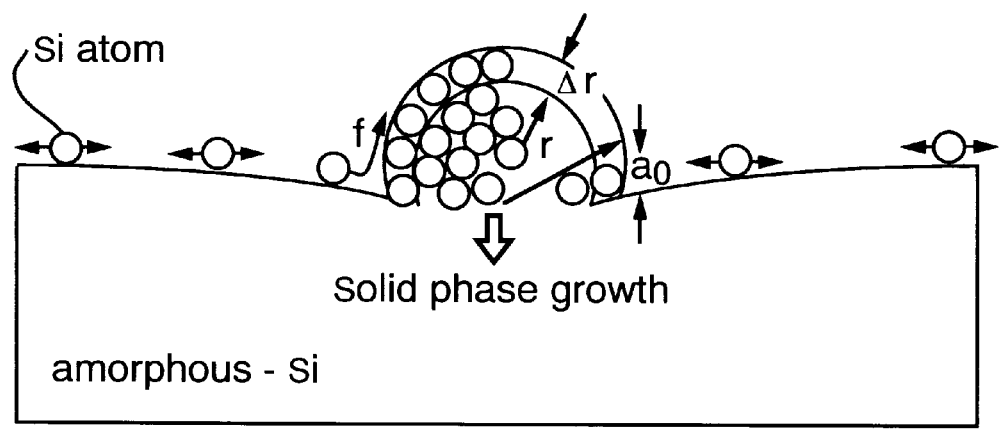
FIG. 9

METHOD OF PRODUCING SILICON LAYER HAVING SURFACE CONTROLLED TO BE UNEVEN OR EVEN

This application is a division of application Ser. No. 08/611,178, filed Mar. 5, 1996.

BACKGROUND OF THE INVENTION

The present invention relates to a method of fabricating a semiconductor device and, more particularly, to a method of producing a silicon layer having a surface controlled to be uneven or even. A silicon layer having an uneven surface may be used for an capacitor electrode in a dynamic random access memory (DRAM) cell, and a silicon layer having an even surface may be used for a thin-film-transistor in a static random access memory (SRAM) cell.

Recently, the areas of section available for formation of capacitors are decreasing with the smaller cell sizes due to the increase in the degree of integration of DRAMs. Accordingly, stacked or other type capacitors having larger plate surface areas have been used in order to have satisfactory levels of capacity The cell areas, however, must be further reduced as the degree of integration of DRAMs is increased to as high as 64 Mbits and even 256 Mbits, and even with the above-mentioned structures, the insulated plates are required to be ultra-thin. Here, it is to be noted that the thinnest film of $SiO_2/Si_2N_4$ which has become practical is on the order of 4 nm, and thus the above-mentioned problem is difficult to solve by merely thinning the plate films.

A technical solution to this problem is described in Japanese Laid-Open Patent Publication HEI 3-272165. This publication describes that deposition of a silicon film by LPCVD (Low Pressure Chemical Vapor Deposition) involves production of hemispheric silicon grains (hereunder referred to only as "grains") at a temperature around which the crystal state of the film changes from an amorphous to a polycrystalline state. Since application of these grains to electrodes results in provision of irregularities to the electrodes which contribute to much greater amount of accumulated charges, that process is very effective.

The irregularities due to grains, however, can grow only within a certain range of temperatures. There still remains the additional problem of difficult control of grain sizes, etc.

A method as a solution to the problem is described in Japanese Laid-Open Patent Puglication HEI 5-304273. This publication discloses a method of growing mushroom-shaped grains by first irradiating the clean surface of an amorphous silicon electrode with disilane gas ($Si_2H_6$ gas) to form micro-crystal nuclei thereon, and then attaching, to the micro-crystal nuclei, silicon atoms which migrate on the surface of the amorphous silicon.

This method allows density-controlled, uniform dispersion of grains on the electrode surface. Accordingly, the method is a very effective one to be applied to devices.

In this connection, "Solid State Devices and Materials" issued in 1992 describes, on page 422, that grains with controlled sizes and a density may also be formed on an electrode of phosphorous-doped amorphous silicon, under the title: "Hemispherical" Grained Silicon (hereunder abbreviated to "HSG-Si") Formation on in-situ Phosphorous-Doped Amorphous-Si Using the Seeding Method."Accordingly, the above-mentioned method has the advantage of eliminating the need for impurity-doping processing such as ion implantation which causes deformation of the grains, which processing is otherwise required after formation of irregularities on the surface of the amorphous silicon electrode.

In addition, on page 259 of "International Electron Devices Meeting" it is stated that even electrodes having cylindrical structures may have irregularities thereon which are due to micro-crystals, under the title. "A New Cylindrical Capacitor Using Hemispherical Grained Si (HSG-Si) for 256-Mbit DRAMs." This technology has made possible 256-Mbit DRAMs. For the foregoing reasons, it is understood that the method described in the above publication HEI 5-304273 is a very effective one.

The above-described method, however, has the drawback of failing to form irregularities on amorphous silicon having a phosphorus content of over $5\times10^{20}$ atoms/cm$^3$. The reason for this drawback is that the formation of the irregularities is prevented by the phosphorus on the surface of the film, and this will be described in more detail later.

Also, an additional drawback is that the respective grains cannot grow to a satisfactory degree in cases where the sidewall, etc. of the cylindrical electrode is thin, since the formation of irregularities proceeds with supply of atoms from the amorphous silicon.

SUMMARY OF THE INVENTION

It is therefore an object of the present invention to provide a method of producing a silicon layer which allows formation of an electrode while controlling the particle diameters, density and sizes.

Another object of the present invention is to provide a method of forming a silicon layer which allows satisfactory growth of hemispherical or spherical silicon grains even on such an electrode with a thin sidewall as a cylindrical electrode Still another object of the present invention is to provide a method of forming an electrode which allows formation of irregularities due to grains even on an amorphous silicon layer having a phosphorus concentration of over $5\times10^{20}$ atoms/cm$^3$.

In addition, since there is a demand in the field of semiconductor devices for establishing techniques for forming silicon films with even surfaces or surfaces free from irregularities, it is also an object of the present invention to provide a method of forming such films.

According to one aspect of the present invention, there is provided a method of fabricating a semiconductor device comprising the steps of subjecting a semiconductor substrate having an amorphous silicon layer to a silane gas and performing an annealing process within an atmosphere of a high vacuum or an inert gas containing neither hydrogen nor oxygen, such a silicon layer that has an uneven surface being thus obtained.

There is provided in accordance with another aspect of the present invention a method of fabricating a semiconductor device comprising the steps of forming an amorphous silicon layer by use of a silance gas and then introducing a gas containing hydrogen or oxygen, such a silicon layer that has an even surface being thus obtained.

The present inventors have found that irradiation of the surface of amorphous silicon with a silane gas ($SiH_4$ gas) results in selective growth of the amorphous silicon. Here, the "selective growth" means that the amorphous silicon grows on itself, but not on the oxide film upon irradiation with silane gas. In this connection, the selectivity is judged to be high in cases where it is easy to maintain such a state as to allow deposition of silicon on the amorphous silicon, but not as to allow growth of silicon on the oxide film Conversely, the selectivity is judged to be low in cases where silicon tends to grow even on the oxide film in the same manner as on the amorphous silicon film.

After this selective growth of the amorphous silicon, continuous annealing treatment of the film at the same or higher temperatures in such an atmosphere as a high vacuum or as an inert gas results in elimination of the hydrogen which has terminated the silicon on the surface of the film and in starting the migration of the silicon atoms. The atoms migrating on the surface of the amorphous silicon form crystal nuclei on the amorphous silicon. Once these crystal nuclei are formed, the silicon atoms migrating on the surface of the amorphous silicon film are captured by the crystal nuclei and their sizes increase. Irregularities are thus formed on the surface of the electrode.

On the other hand, in cases where the amorphous silicon, which has been subjected to selective growth, undergoes temperature reduction while being maintained in an atmosphere of hydrogen or an oxidizing gas which is continuously introduced into the chamber, no micro-crystals are formed on the surface of the amorphous silicon since the silicon atoms do not migrate. Therefore, it is desired to use the above-mentioned process in order to obtain an amorphous silicon film with a smooth surface.

On the contrary, in the method disclosed in the above publication HEI 5-304273, crystal nuclei are formed directly on both of the amorphous silicon layer and the silicon oxide layer. Specifically, in cases where disilane gas is employed, since clusters of $Si_2$, $Si_3$ or the like are formed by pyrolysis in the growth chamber, the deposited film itself combines the clusters thereby providing a high-order bond of silicon. Accordingly, these combined ones are formed as crystal nuclei on the surface of the amorphous silicon film. These clusters tend to readily adhere onto the oxide film, and thus may also impair the selectivity.

On the other hand, in the case of the use of a silane gas, clusters are hard to produce as compared with the case where disilane gas or the like is used. It is easily imagined that the reason is in the number of silicon atoms in silane gas being 1, for which more numbers of reactions are needed than the case of the use of disilane gas in order to obtain clusters comprising high-order-bonded silicon.

Another possible cause is the tendency of disilane gas to undergo pyrolysis more readily at identical temperatures. Accordingly, since almost no clusters are present in the course of deposition of the film by silane gas, the process of deposition of amorphous silicon becomes the main reaction, as the $SiH_2$ formed by decomposition of the silane gas is inserted through its substitution for the hydrogen on the surface of the amorphous silicon.

The production of the clusters influences the crystallinity of the silicon deposited on the amorphous silicon film, as mentioned above, and further has a stronger influence on the selectivity. Specifically, the process of the deposition of the film on the silicon proceeds through the process of placement of $SiH_2$ in the place from which the hydrogen, which had been substituted for the silicon on the surface, has been extracted. Accordingly, if the film is formed only by the latter process, no silicon film is deposited on the oxide film since no SiH bond is present thereon. In practice, however, in cases where clusters are formed in the atmosphere, the clusters adhere to the oxide film as well. As a result, a silicon film is deposited around the section of adhesion of the silicon. The result is impairment of the selectivity.

In order to reduce the clusters which cause lowering in the selectivity, it is also important to decrease the probability of collision between the gaseous substances in the gas phase. This effect is also observed when disilane gas is used, and further it has been found that the selectivity is maintained for a remarkably prolonged period in cases where the partial pressure of the silane gas is $1 \times 10^{-3}$ Torr or less. This is assumed to have resulted from largely suppressed production of the clusters due to the reduced pressure, for the reasons mentioned above.

In addition, as will be detailed later, the concentration of phosphorus on the film surface must be lowered in order to form micro-crystals on the phosphorus-doped amorphous silicon and to form irregularities on the electrode surface. As a method of meeting this requirement, a technique has been developed which allows growth of micro-crystals at a lower concentration of phosphorus by deposition of a non-doped amorphous silicon film on a phosphorus-doped amorphous silicon film.

It has also been found that when microcrystals are being formed on the amorphous silicon by annealing, the density of the nuclei may be maintained if the wafer surface is irradiated with oxygen after the lapse of time required for the density of the nuclei to increase to a certain value. Furthermore, although the density of the nuclei does not increase after irradiation with oxygen, the nuclei grow if annealing is continued. Accordingly, the density and the sizes of the irregularities on the electrode surface may be controlled by the above-mentioned process.

BRIEF DESCRIPTION OF THE DRAWINGS

The above and other objects, features and advantages of the present invention will be more apparent from the following description taken in conjunction with the accompanying drawings, in which:

FIG. 8 is a chart indicative of mechanism of growth of silicon grains;

FIG. 9 is a diagram illustrative of growth mechanism of a silicon grain on an amorphous silicon layer;

DETAILED DESCRIPTION OF THE PREFERRED EMBODIMENTS

Now, the description will be made on preferred embodiments of the present invention.

Embodiment 1

In the first embodiment of the present invention, the surface of a 6-inch silicon substrate was subjected to thermal oxidation treatment to cover the entire surface of the wafer with a 100 nm-thick silicon oxide film On this oxide film, there was deposited a 50 nm-thick, non-doped amorphous silicon film by a LPCVD method Silane gas (diluted with 20% He) was used for the deposition under the conditions growth pressure, 1 Torr; and growth temperature 510° C.

Subsequently, a resist pattern was formed on the amorphous silicon by lithography Dry etching processing was performed using the resist pattern as the mask to form an amorphous silicon pattern. Thereafter, the wafer was washed with a solution prepared by mixing ammonia, an aqueous hydrogen peroxide and purified water to remove the contaminants on its surface, and then immersed in an aqueous solution with a $HF/H_2O$ ratio of 1/30 for 30 seconds to remove off the spontaneous oxide film on the amorphous silicon pattern. A silicon film region and a silicon oxide film region were thus formed separately on the surface of the wafer. Here, HF is hydrogen fluoride.

Subsequently, the wafer was led into a vertical LPCVD reactor heated to 530° C. Since this apparatus is equipped with a vacuum load-locking mechanism, the wafer may be introduced into the reaction chamber without undergoing oxidation of the silicon electrode surface.

Here, the degree of vacuum which has been attained in the reaction chamber is $1\times10^{-8}$ Torr. The wafer was maintained in this chamber for 30 minutes to a constant wafer temperature, and was then irradiated with 50 SSCM (CC/min.) of silane gas (diluted with 20% He) at different pressures. The control of the pressure was performed to 1, 0.1, 0.01, 0.001 and 0.0006 Torr with an automatic pressure control valve arranged upsteam from a turbomolecular pump, for formation of a film.

After the formation of the film, hydrogen gas was flowed in the chamber for 30 minutes under such conditions as to produce a pressure of 10 Torr. The wafer was taken out after its temperature had been decreased to 450° C. in the atmosphere of hydrogen gas. The reason why the hydrogen gas was introduced is that hydrogen prevents the migration of the silicon atoms on the surface.

Figure 1:
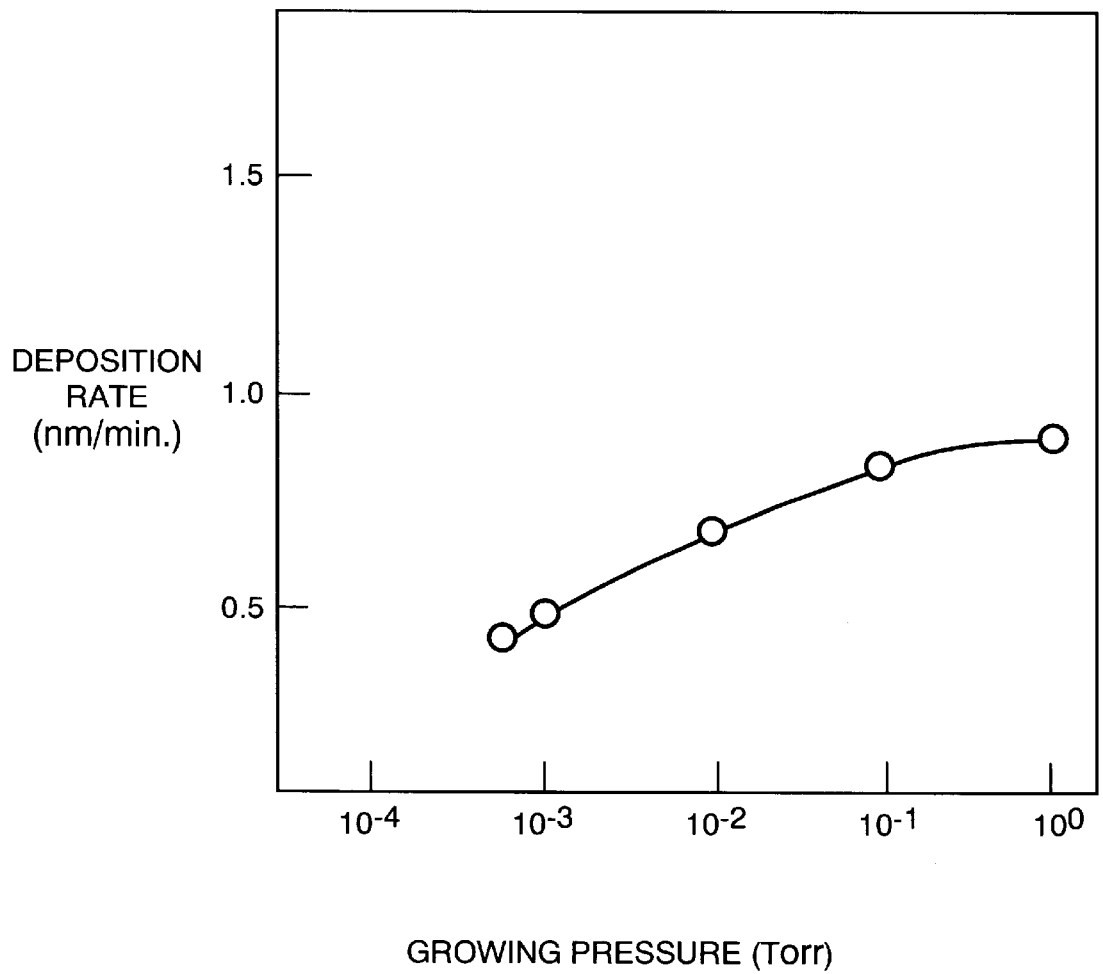
FIG. 1 is a graph illustrative of a film depositing rate to a pressure of an amorphous silicon layer according to a first embodiment of the present invention.

In this connection, FIG. 1 illustrates the speed of formation of the film on the silicon electrode at the respective pressures. Examination of this drawing reveals that the film formation speed increases somewhat as the pressure increases. However, the film formation speed increases to approximately twice at most with a change in the pressure by three orders of magnitude.

Figure 2:
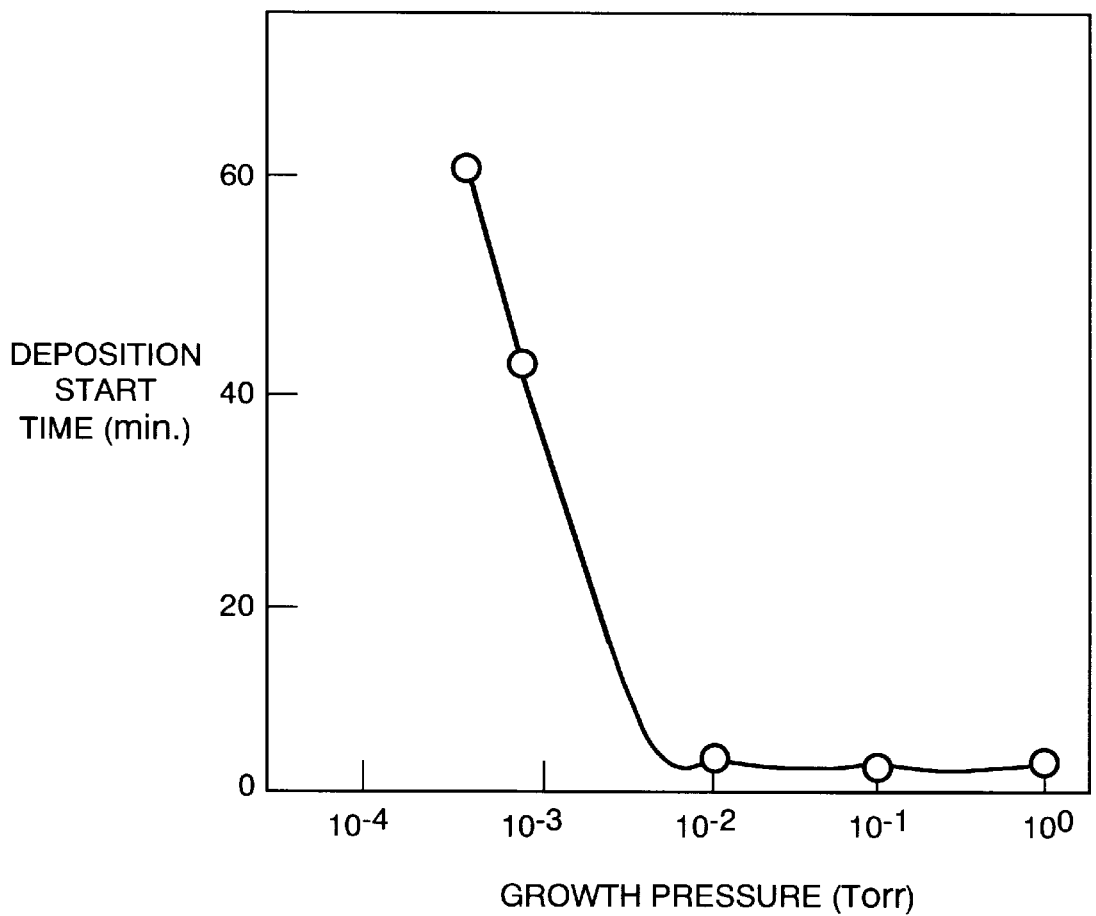
FIG. 2 is a graph illustrative of a deposition starting time to a pressure of the silicon layer.
Figure 3:
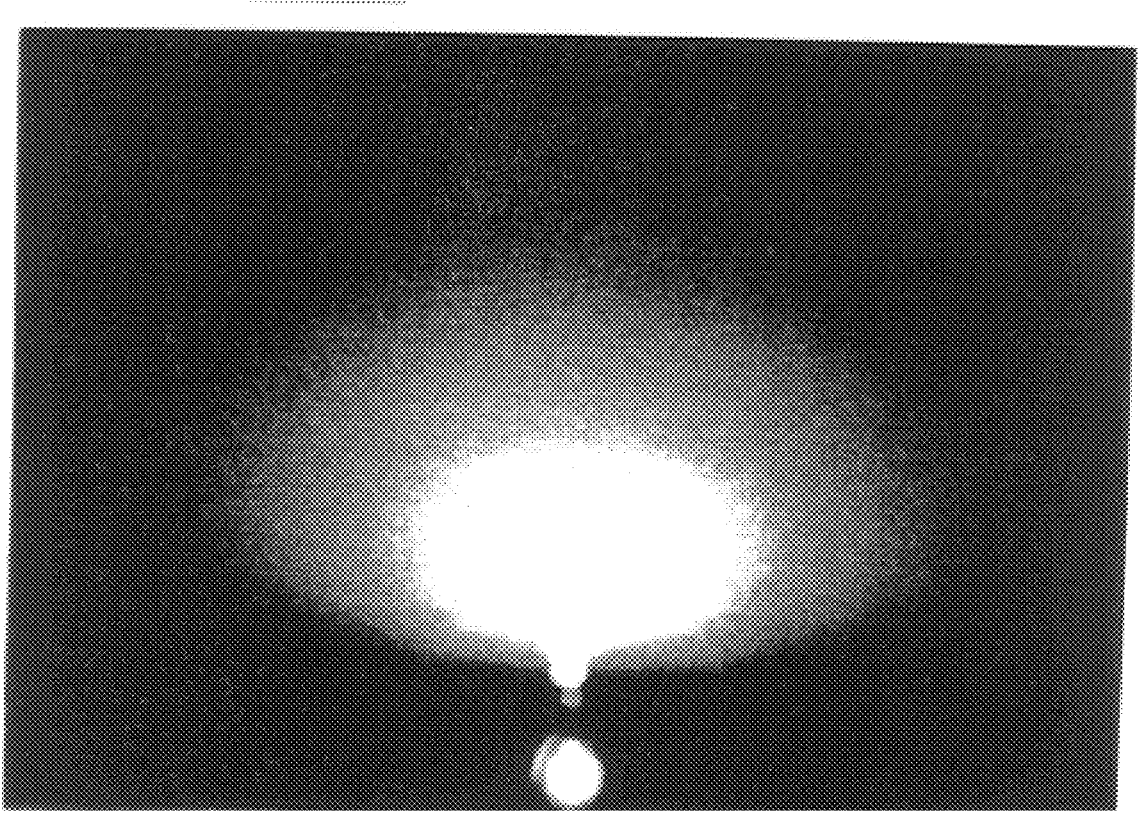
FIG. 3 is a view illustrative of a reflection high energy electron diffraction image of the silicon layer.

FIG. 2 illustrates start times for the deposition of the silicon film on the oxide film at 550° C. This drawing shows that the selectivity increases sharply in cases where the growth pressure is a degree of vacuum of $1\times10^{-3}$ Torr or less. In practice, growing at $6\times10^{-4}$ Torr for 60 minutes results in selective growth of a 60 nm-thick silicon film only on the amorphous silicon electrode. The crystallinity of this film is shown in FIG. 3 which is a view illustrative of the result of Reflection High Energy Electron Diffraction (hereunder abbreviated to "RHEED") thereof. Examination of this drawing reveals that amorphous silicon has been deposited on the electrode. The film analyzed by RHEED is a sample prepared by depositing a film with silane gas and then decreasing the temperature in hydrogen gas, as will be described later.

Separately, for comparison, the growth was attempted with disilane gas (diluted with 20% He) at $6\times10^{-4}$ Torr. As a result, the selectivity was impaired in approximately 3 minutes. In addition, a film of polycrystal silicon was formed on the amorphous silicon.

Embodiment 2

A description will now be made below on a second embodiment of the present invention.

A thermal oxidation treatment was applied onto a 6-inch silicon substrate, and the entire surface of the wafer was covered with a 100-cm oxide film. Phosphate glass was laid on this oxide film to a height of 200 nm, and then a CVD oxide film was formed. Contact holes were formed through the oxide film, and cylindrical electrodes were formed with a phosphorus-doped amorphous silicon film. Contaminants on the electrode surfaces were washed off with a solution prepared by mixing ammonia, an aqueous hydrogen peroxide and purified water, and the spontaneous oxide film on the cylinder electrodes were removed by immersion in an aqueous solution with a $HF/H_2O$ ratio of 1/30 for 30 minutes. A silicon film region and a silicon oxide film region are formed on the wafer surface in this way.

Figure 4:
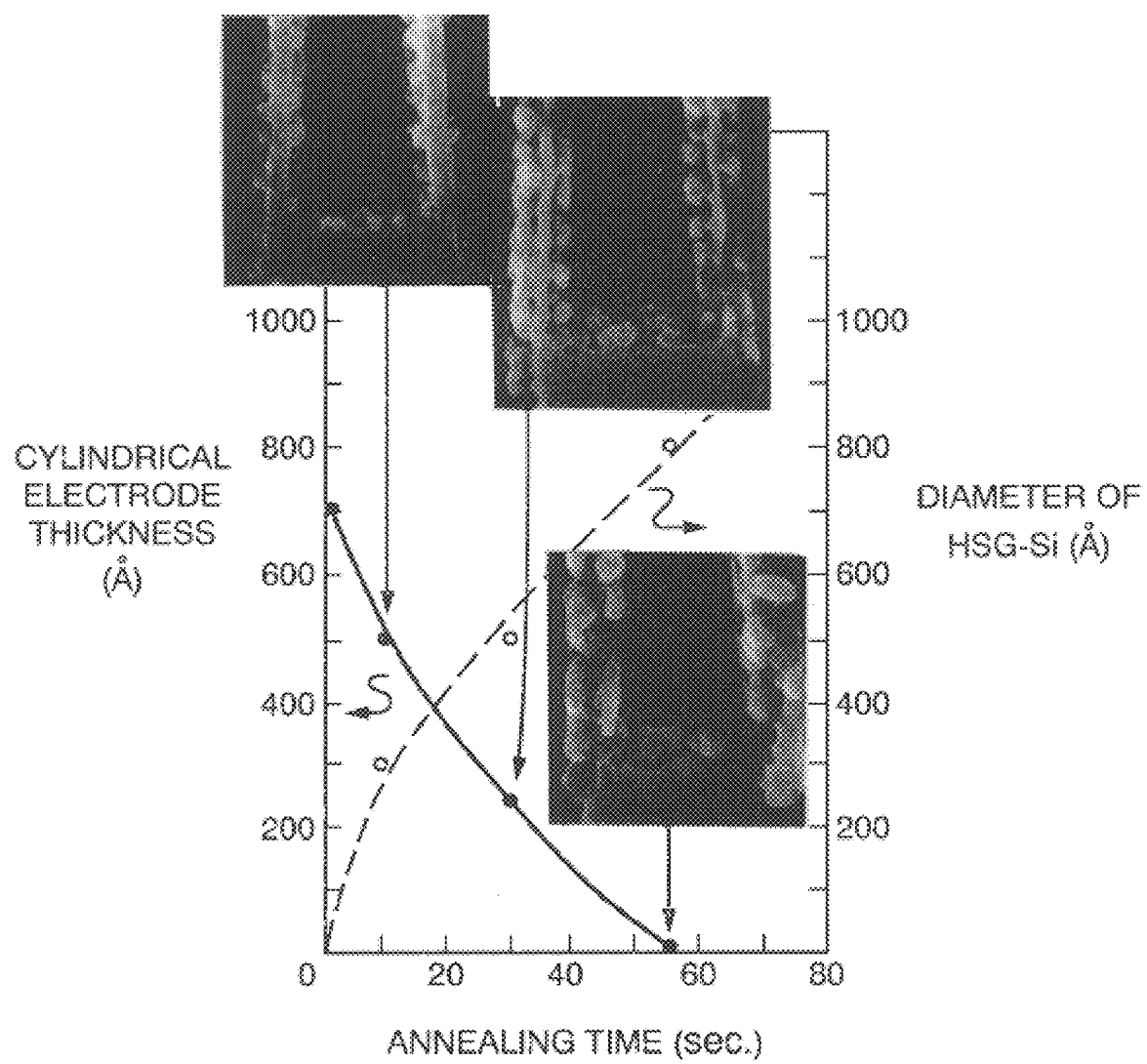
FIG. 4 is a view illustrative of electrode thickness and HSG-Si diameter vs. UHV annealing time of an amorphous silicon layer according to a second embodiment of the present invention.

Then, the UHV-CVD apparatus (SRE612 manufactured by ANELVA) was used for irradiation with disilane and annealing treatment. The shapes of the electrodes treated in this way are shown in FIG. 4. The same drawing shows values of the thickness of the electrode excluding HSG-Si for the annealing time (Electrode thickness) and of diameter of the HSG-Si. It is apparent from FIG. 4 that annealing treatment in a high vacuum contributes to the increased number of the grains formed on the electrode surfaces.

It is also apparent that the cylindrical electrodes become thinner as the number of the grains increase. This is because the growth of the grains formed on the electrode surfaces are based on supply of silicon from the electrodes. Accordingly, in cases where the cylindrical electrodes are very thin, there is presented the problem that a sufficient number of grains to increase the area cannot be formed since the number of the atoms to be supplied to the grains decreases. This problem, however, may be easily solved by the following technique for selective growth of amorphous silicon.

The apparatus used in this example is a vertical LPCVD reactor. Since this apparatus is equipped with a vacuum load-locking mechanism, wafers may be introduced into the reaction chamber without undergoing oxidation of the surfaces of the silicon electrodes. Here, the degree of vacuum which can be attained in the reaction chamber is $1\times10^{-8}$ Torr. The wafer was maintained in this chamber for 30 minutes to a constant wafer temperature, and was then irradiated with 50 SSCM of silane gas (diluted with 20% He) at 0.006 Torr.

Figure 5A:
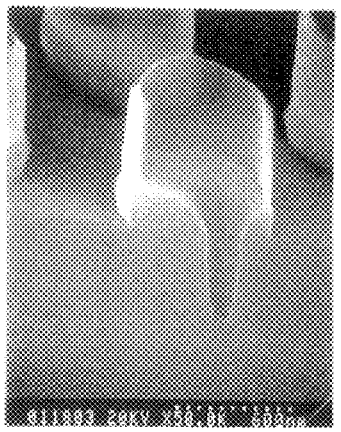
FIGS. 5(a) to 5(c) are diagrams illustrative of cylinder electrodes.

FIG. 5(a) shows the shapes of the cylindrical electrodes prior to the film forming treatment. Referring to the same drawing, it is apparent that the thickness of each electrode is 20 nm or less. Accordingly, if the electrodes are subjected to treatment for formation of micro-crystal nuclei, only grains which are as short as approximately 10 nm are formed. In addition, since the electrodes treated in this way are thin, they are susceptible to mechanical stress.

Figure 5B:
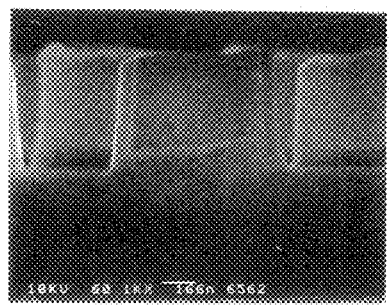

FIG. 5(b) shows the shapes of the electrodes prepared by formation of a film using a vertical LPCVD apparatus at 560° C. for 45 minutes, followed by supply of a flow of hydrogen gas in the chamber for 30 minutes under such a condition to produce a pressure of 10 Torr therein and by decreasing the temperature to 450° C. while being maintained in the atmosphere of hydrogen gas. Referring to the same drawing, it is apparent that the electrodes are thicker. The film deposited on the electrodes was made of amorphous silicon.

Figure 5C:
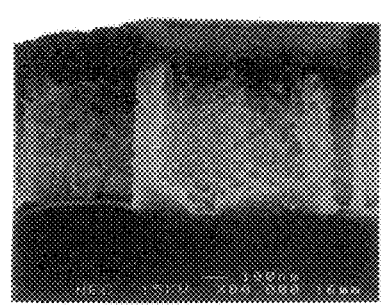

FIG. 5(c) shows the shapes of electrodes prepared by formation of a film using a vertical LPCVD apparatus at 560° C. for 45 minutes, followed by annealing in a high vacuum for 40 minutes. Referring to the same drawing, it is understood that larger grains were formed on the electrode surfaces since the cylinder electrodes had become thicker. The result of investigation of the amount of the stored charge with the electrodes was that the amount was 2.2 times that with conventional cylindrical electrodes. Here, this process may be utilized in cases where silane gas is used, but cannot be utilized if disilane gas is used. This is because applicable of disilane gas to electrodes of amorphous silicon results in deposition of a poly-crystal film.

Embodiment 3

A description will now be given of a method of forming hemispherical or spherical silicon grains on the surface of a phosphorus (hereunder referred to as "P")-doped amorphous silicon film.

This example also includes descriptions of limitations of prior art methods and advantages of the present method. First, the process of formation of crystal nuclei on P-doped amorphous silicon will be described based on the results of disilane gas irradiation and continuous annealing.

First, experimental procedures will be described.

A P-doped amorphous silicon film with an even film surface was deposited on a thermally oxidized silicon substrate. The P-doped amorphous silicon was formed by a LPCVD method using silane gas and $PH_3$ gas at 510° C. A film with a P concentration of $1\times10^{20}$ (atoms/cm$^3$) and a film with a P concentration of $5\times10^{20}$ (atoms/cm$^3$) were used as the P-doped amorphous silicon film. The amorphous silicon film was patterned by exposure to light and reactive ion etching.

Thereafter, the film was washed with a solution prepared by mixing ammonia, an aqueous hydrogen peroxide and purified water, and the spontaneous oxide films on the electrode surfaces were removed with a dilute aqueous HF solution. A UHV-CVD apparatus (SRE612 manufactured by ANELVA) was used to form HSG-Si.

An SEM (S900 manufactured by Hitachi, Ltd.) was used to measure diameters of the HSG-Si. In addition, observation with a TEM (H-9000UHR manufactured by Hitachi, Ltd.) was made to assess fine structures of the grains.

Here, the accelerating voltage was 300 kV. In addition, analysis of P concentrations of the HSG-Si grains formed on the P-doped amorphous silicon and of the amorphous silicon was performed by an EDX method (KEVEX DELTA plus quantitative total system and Energy Dispersive X-ray analyzer (Energy Dispersive X-ray)). Here, the electron-beam accelerating voltage was set to 100 kV, the electron-beam diameter to 1 nm, and the sample absorption current to $10^{-9}$ A.

Thermal desorption of hydrogen, silicon hydride and P from the surface of the P-doped amorphous silicon was analyzed by a TDS (Thermal Desorption Spectroscope; thermal desorption analysis) method. The analysis was made within a range of 200° C. to 800° C. at a temperature-rise rate of 75° C./min. The analysis was performed with a P-doped amorphous silicon film from the surface of which the spontaneous oxide film has been removed with a HF solution.

The process of growth of the silicon grains will now be described.

Figure 6:
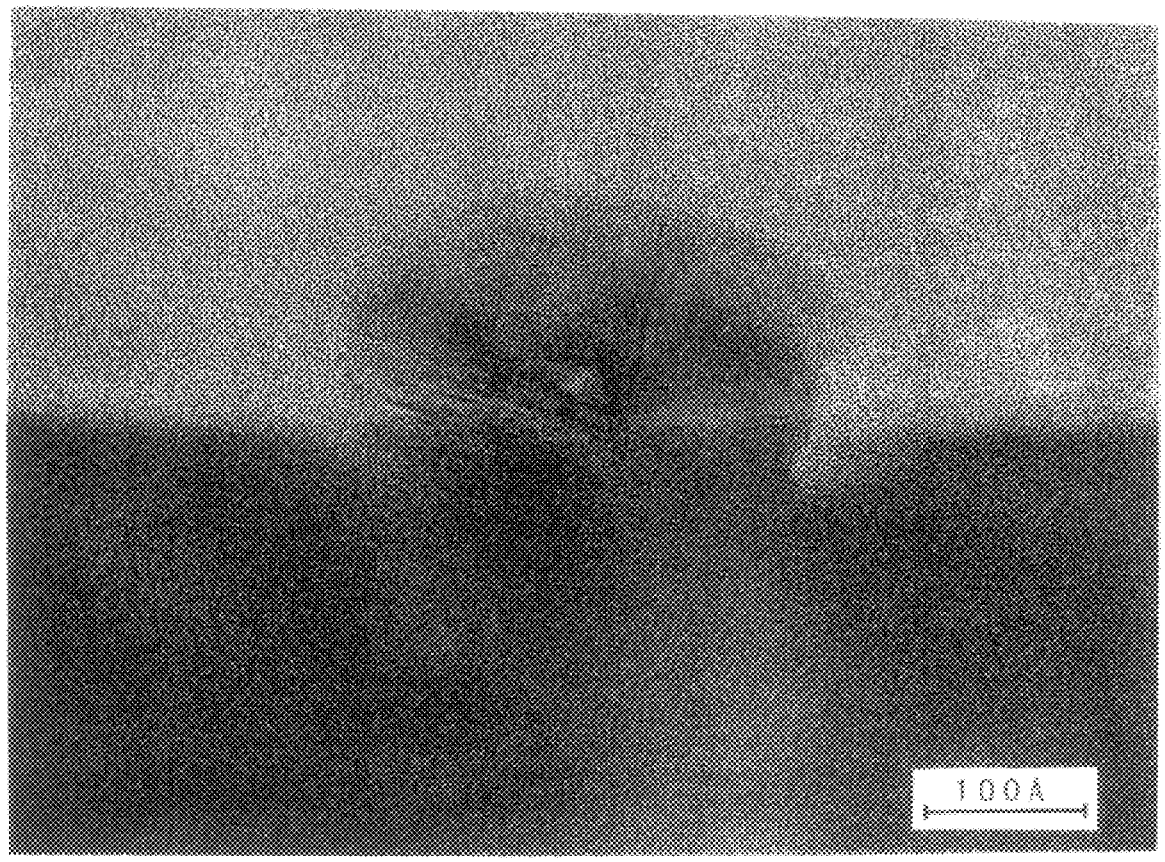
FIG. 6 is a diagram illustrative of silicon grain formed on a surface of an amorphous silicon layer.

FIG. 6 shows a TEM image of a section of one of the micro-crystals with a grain size of 80 nm which was formed on the P-doped amorphous silicon having a P concentration of $1\times10^{20}$ (atoms/cm$^3$). This shows that the micro-crystals formed on the P-doped amorphous silicon are hemispheric Further, it is apparent that the amorphous silicon film has a dent along the periphery of each grain. The shown shape bears a strong resemblance to the shape of each hemispheric grain formed on the non-doped amorphous silicon film which was mentioned above.

Referring to FIG. 6 in practice, it is apparent that stacking faults and twinning planes are generally present extending from the center of each grain located at almost the same level as the surface of the amorphous silicon, to the surface of each gain. Further, as mentioned above, it is apparent that the amorphous silicon film has a dent along the periphery of each grain.

Based on this, the process of growth of the micro-crystals on P-doped amorphous silicon may be imagined to be as follows First, crystal nuclei are formed on the surface of P-doped amorphous silicon film by irradiation with disilane. Then, the procedures pass the process of capture of the silicon atoms or P atoms migrating on the surfaces, by the nuclei. The grains grow and the amorphous silicon have dents along the peripheries of the grains by passing the process.

The reason why the grains become hemispheric is supposed that the atoms supplied from the amorphous section migrate adequately even on the grains in the same manner as in the case of the non-doped amorphous silicon. Sections in the grains on which defects are centered correspond to the cores formed by the disilane irradiation Since the grains grow around these cores, twinning planes and stacking faults are formed from the cores to the surfaces.

Accordingly, it is supposed that also with respect to P-doped amorphous silicon films, the grains on the surface of the amorphous silicon grow through the process wherein the atoms migrating on the film surface are captured by the micro-crystal nuclei. In addition, the shapes of the grains shown in FIG. 6 suggest that the dent sections along the peripheries of the grains and the HSG-Si have almost the same volume.

Since the P content of the P-doped amorphous silicon is $10^{20}$ (atoms/cm$^3$), the P atoms in the P-doped amorphous silicon comprise approximately 0.2 atom % of the silicon. This suggests that the HSG-Si is formed by migration of at least the silicon atoms on the surface of the P-doped amorphous silicon.

On the other hand, with the film having a P concentration of $5\times10^{20}$ (atoms/cm$^3$) formation of micro-crystal nuclei after the disilane irradiation was confirmed; nevertheless, growth of the micro-crystal nuclei were not caused even by annealing treatment.

An explanation will now be given regarding the process of formation of grains on the surface of an amorphous silicon film with a P concentration of $1\times10^{20}$ (atoms/cm formation of hemispheric grains on which has been confirmed.

Figure 7:
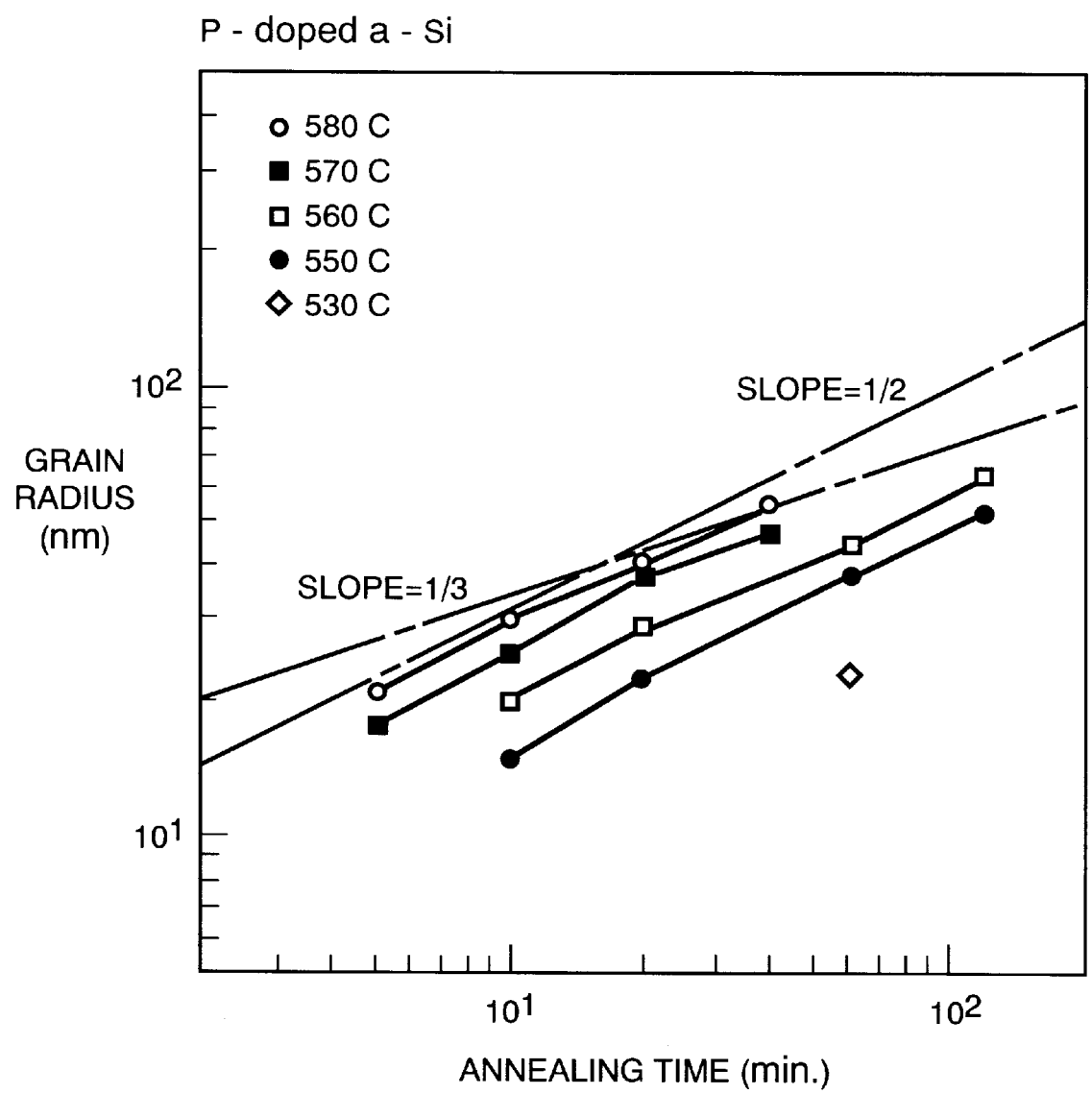
FIG. 7 is a graph illustrative grain radius to annealing time of an amorphous silicon layer.

As mentioned above, possible rate-determining factors with respect to the growth of grains on such amorphous silicon include the process of capture of silicon atoms dispersing on grain surfaces (the rate is determined by the reaction), the process of dispersion of the atoms to be supplied to the grain surfaces (the rate is determined by the feed) and the process of production of the atoms which migrate (the rate is determined by the feed). In order to determine the rate-determining process with respect to the formation of the HSG-Si on the P-doped amorphous silicon, the progress of change in the sizes (2r) of the hemispheric grains on the P-doped amorphous silicon film with a change in the annealing time in a high vacuum after the disilane irradiation was checked. The results are illustrated in FIG. 7.

The experiment was carried out setting temperatures for the disilane irradiation and annealing to 530° C., 550° C., 560° C., 570° C. and 580° C. The result was that the slope was approximately ½ regardless of the grain sizes, and thus it has been found that $r^2$ is in proportion to the time t during the growth of the grains.

In this connection, FIG. 8 shows the process of growth of the micro-crystals on the amosphous silicon in the state where the rate is determined by the reaction and the feed.

For comparison, the same drawing shows the process of growth in the state where the rate is determined by the feed and the reaction, with respect to the epitaxial growth. In the drawing, the broken lines indicate the surface geometries after a lapse of minute times Δt, Δv indicates the increase in volume after a lapse of minute times Δt, $F_s$ indicates the number of atoms supplied per unit area, $N_s$ is the density of the growth sites on the crystal surface, $f_s$ is the average length of migration on the amorphous silicon surface, and $S_{HSG}$ is the surface area of the HSG.

Referring to the same drawing, it is apparent that the respective growth modes have different time-dependent particle sizes. In cases where the rate is determined by the reaction (crystallization) on the growth surface, the growth rate (the rate of increase in particle size) is constant. In cases where the rate is determined by the feed, the time dependency changes depending on the manner of change in the shape, and the dependency is represented by the proportional relationship between the first through third power of the particle size and the time t.

In cases where the growth rates of the micro-crystals on the silicon surface are determined by the process of capture of the silicon atoms dispersing on the surfaces of the hemispheric or spheric micro-crystals on the amorphous silicon, the increase rates of the grain radii (r) should increase linearly with respect to-the time. Therefore, it is understood that the process is not rate-determining for the growth of the grains on the P-doped amorphous silicon.

In cases where the micro-crystals on the amorphous silicon grow in the region where the feed is rate-determining, the process of growth changes depending on the geometries of the grains. Being hemispheric, the grains grow with a proportional relationship between $r^2$ and the time t.

When the sizes of the hemispheric grains increase, plateau-shaped grains are formed since the silicon atoms supplied to the grains are captured before they reach the centers of the grains. In this case, the grain sizes increase in proportion to the time.

In cases where the surface is terminated with hydrogen, the grains grow as spheres, as detailed in Example 2. In this case of growth of the grains as spheres, $r^3$ increases with the time t.

For the foregoing facts, it is apparent that the micro-crystals on the P-doped amorphous silicon grow as hemispheric grains in the region where the feed is rate-determining.

In cases where micro-crystal nuclei were formed on the non-doped amorphous silicon by irradiation with disilane, the process of their growth was observed in early stages of growth of the grains. The rate-determining factor in this case is known to be the process of production of the silicon which migrates.

In either case, the growth of the grains is caused by a phenomenon which will be explained below.

That is, as the formation of the HSG-Si advances, the area of sections of contact between the peripheries of the grains and the amorphous silicon increases. The length of the circumference of contact between each grain and the amorphous silicon provides the uptake port for the silicon atoms dispersing on the surface.

In others, as shown in FIG. 9, since the area of the uptake section for the migrating silicon atoms necessary for the growth of the HSG-Si increases linearly with respect to the time, the number of the captured atoms increases with the time. The process of this growth is represented by the following expression, as mentioned above.

$$d(2\pi r(t)^3/3V_0)/dt = 2\pi r(t)a_0 f \qquad (1)$$

This equation leads to the following equation:

$$r^2 = 2a_0 V_0 ft \qquad (2)$$

Here, $v_0$ is the volume ($nm^3$) of each silicon atom, and f is the flow rate (atoms·min$^{-1 \cdot nm-1}$) of the atoms per unit time which flow from the amorphous silicon into each grain.

Based on the results mentioned above, it is understood that $r^2$ is in proportion to the time f·t during the growth on the P-doped amorphous silicon having a P concentration of $1 \times 10^{20}$ (atoms/cm$^3$), and the supply rate f of the silicon atoms or P atoms supplied onto the micro-crystals is rate-determining for the growth of the grains.

Figure 10:
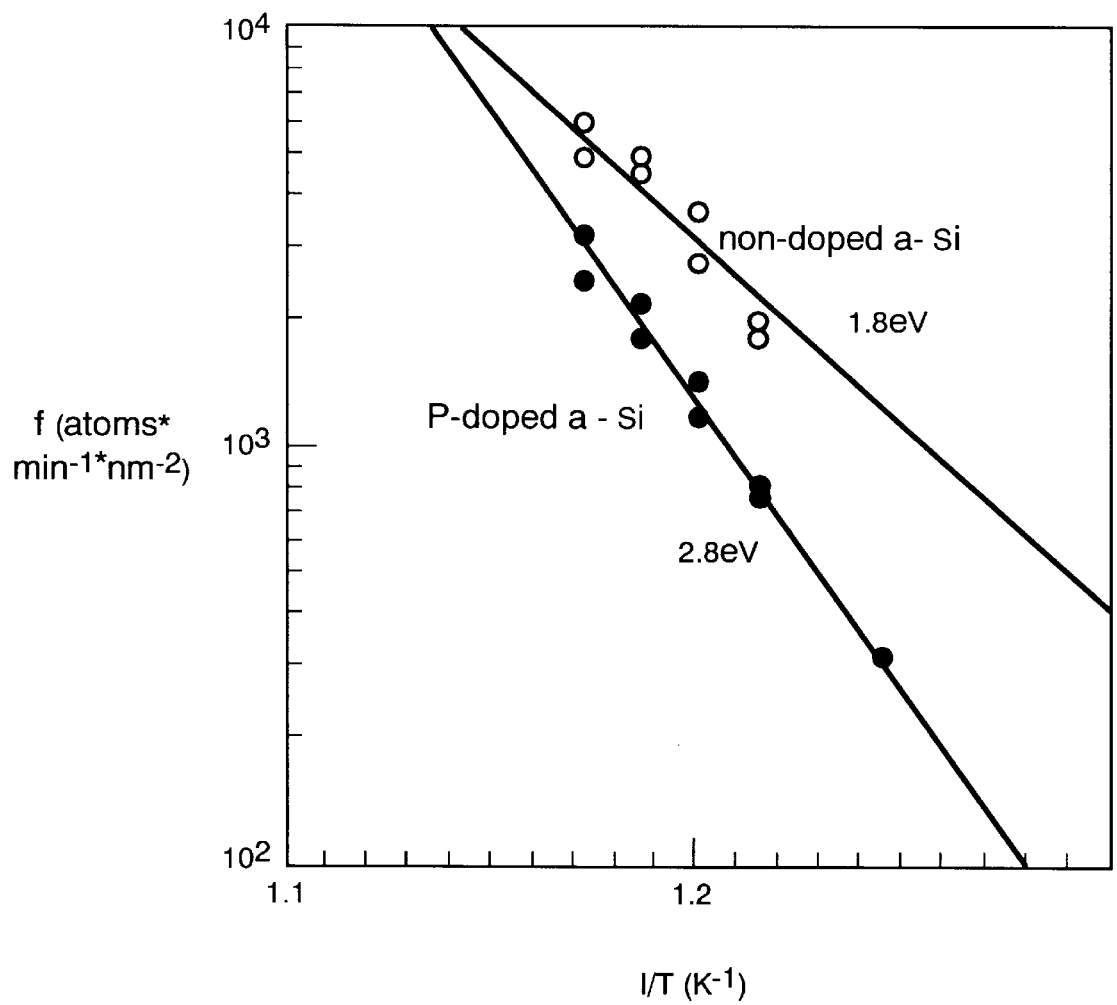
FIG. 10 is a graph illustrative of growth mechanism of silicon grains on a P-doped silicon layer and a non-doped silicon layer.

Therefore, in order to make a close examination of this process, an Arrhenius plot of f was prepared This is shown in FIG. 10.

The activation energy by annealing treatment for the growth of the grains on the P-doped amorphous silicon was on the order of 2.8 eV. This activation energy is understood to be greater than the activation energy (2.4 eV) for the growth of the micro-crystals on the non-doped amorphous silicon. Greatly different points of the micro-crystal growth process on the P-doped amorphous silicon from on the non-doped amorphous silicon include provision of the hemispheric grain regardless of the grain sizes.

As mentioned above, it has been found that a phenomenon occurs on the film of amorphous silicon having a P concentration of $1 \times 10^{20}$ (atoms/cm$^3$), in which at least the silicon atoms migrate on the film surface and are captured by the micro-crystal nuclei. In this connection, it is to be noted that inclusion of P in the amorphous silicon resulted in increase of the activation energy for the growth of the micro-crystals to approximately 2.8 eV.

Therefore, in order to investigate whether the P atoms migrate in the same manner as the silicon atoms or behave otherwise during the growth of the micro-crystal nuclei, EDX was used to analyze the composition of the grains and the amorphous silicon.

Figure 11:
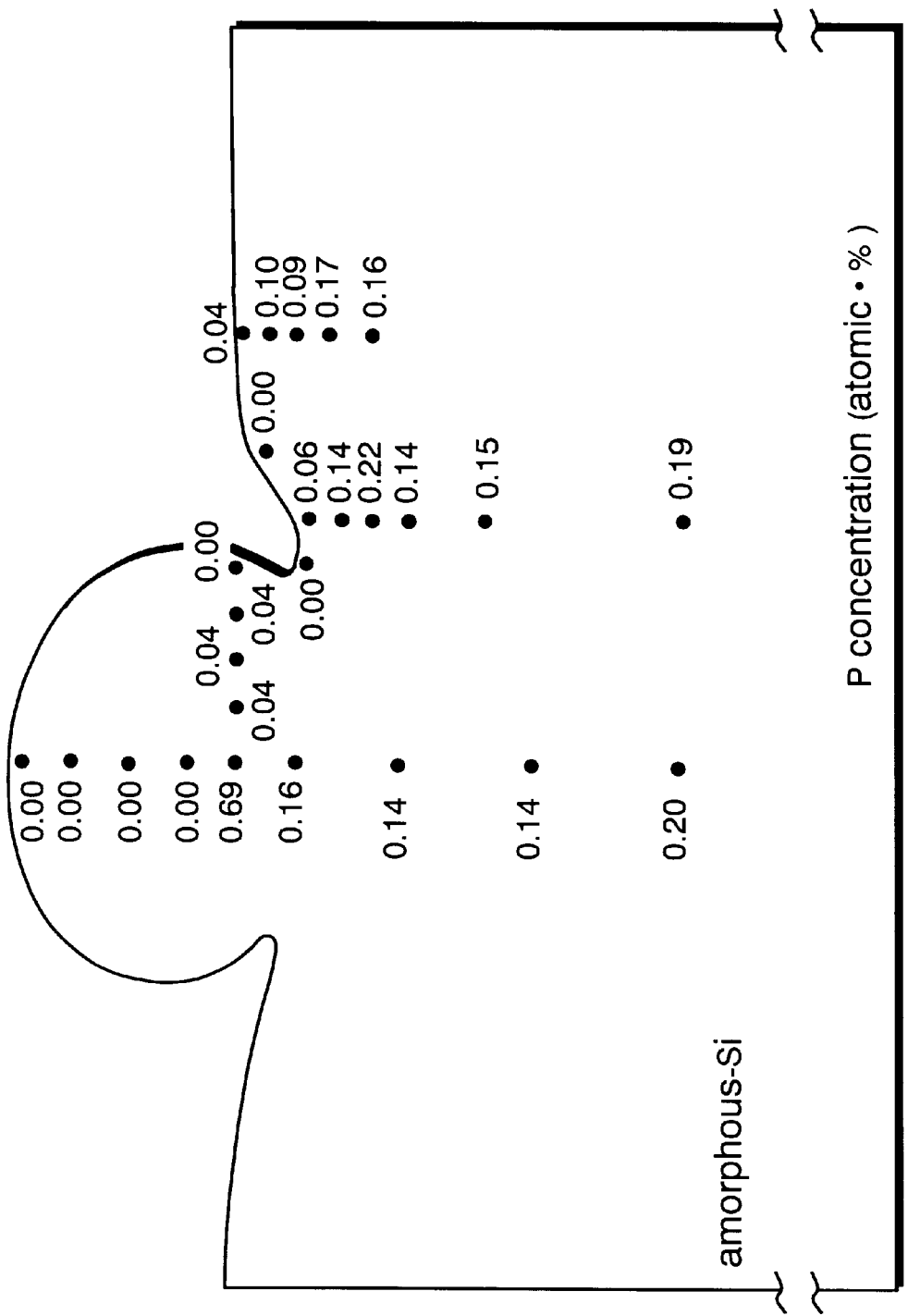
FIG. 11 is a diagram illustrative of concentration distribution of phosphorus on periphery of a grain.

FIG. 11 shows the P concentrations of the grains and their environs formed on the P-doped amorphous silicon at $1 \times 10^{20}$ (atoms/cm$^3$). Referring to the same drawing, it is apparent that parts of the grains vertically thrusting above the surface of the P-doped amorphous silicon contain little P.

This suggests that the surface migration rates of the P-atoms are extremely low as compared with the silicon, or the P does not pass the process of dispersion on the surface of the amorphous silicon film and supply to the grains. In addition, it is apparent that the P concentration of the uppermost surface of the P-doped amorphous silicon film on the periphery of each grain is extremely low.

This is a very strange phenomenon. If the surface diffusion rate of the P atoms is very low, then the P concentration of the uppermost surface of the amorphous silicon on the periphery of each grain should be increased. Also, in cases where there exists no surface migration, it is supposed that the P not taken by the grains precipitates on the surface of the amorphous silicon.

Possible reasons why the P atom concentration is lowered near the surface during the growth of the HSG-Si include the process of diffusion of the P into the amorphous silicon or the process of desorption of the P atoms on the film surface. If the P atoms on the film surface diffuse into the inside of the film, then the diffusion may surely be confirmed as change in the P concentration inside the film.

The results of the EDX, however, show that the P concentrations of the P-doped amorphous silicon near the grains decreased abruptly near the uppermost surface. In addition, the P concentrations in the surfaces of the dent sections of the P-doped amorphous silicon on the peripheries of the grains decrease. For this, it is difficult to conclude that the P on the film surface has diffused into the film.

Thermal Desorption Spectroscopy (TDS) was used to examine whether the P atoms are desorbed from the surface of the P-doped amorphous silicon. The measurement was conducted using films of P-doped amorphous silicon having P concentrations of $1 \times 10^{20}$ (atoms/cm$^3$) and $5 \times 10^{20}$ (atoms/cm$^3$) and from the surfaces of which the spontaneous films have been removed with a HF solution.

Figure 12A:
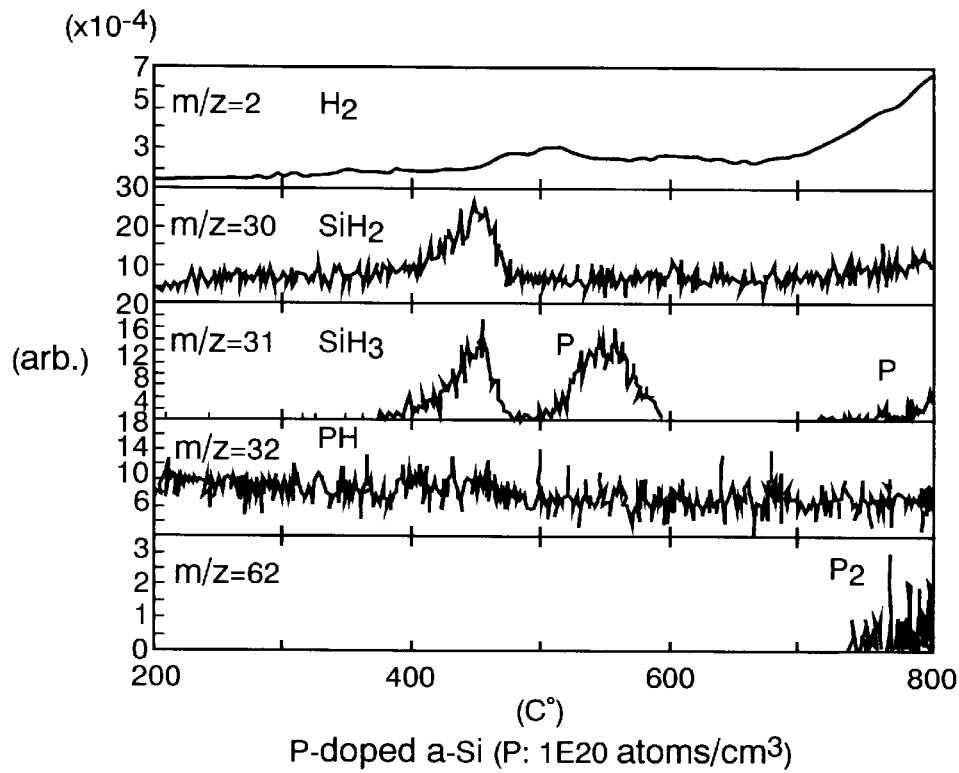
FIGS. 12(a) and 12(b) are graphs illustrative of desorption of hydrogen, $SiH_2$, $Si_2H_6$, P and P from a P-doped amorphous silicon layer.

FIGS. 12(a) and (b) show the results of the measurement with respect to P, hydrogen (H$_2$) and silicon hydride. The same drawings show the relationship between the temperature and the amount of the desorbed gas. Referring to the same drawings, desorption of hydrogen from the P-doped amorphous silicon films having surfaces from which the spontaneous oxide films have been removed with a HF solution was observed at 470° C. and 520° C. The peaks observed at 470° C. and 520° C. correspond to the peaks β1 and β2 observed with respect to the desorption of hydrogen from a silicon substrate having a hydrogen-terminated surface. The peaks β1 and β2 reflect the processes of desorption of hydrogen from the dihydride phase and the monohydride phase of the silicon film surface.

For the foregoing facts, the peaks are supposed to correspond to desorption of the hydrogen which has terminated the silicon bonds on the film surface, by the treatment with a HF solution.

The P desorption process may be confirmed in two temperature regions. Specifically, there are peaks which appear in a range of 500° C. to 600° C. and in a range of 700° C. or more. The desorption of the P observed from 500° C. to 600° C. is believed to be desorption of the P as atom. This desorption was confirmed with a sample having a P concentration of $1 \times 10^{20}$ (atoms/cm$^3$). On the other hand, the desorption at 700° C. or higher are observed for both P atoms and P$_2$ molecule. The desorption intensity was higher for the film having a P content of $5 \times 10^{20}$ (atoms/cm$^3$). The desorption at 700° C. or higher is supposed to be desorption of P$_2$ molecules. It is supposed that the P atoms were observed by decomposition in the mass spectrometer and a double charge of the molecule.

As mentioned above, the grains are hard to take in the P atoms immediately after the formation of the HSG-Si on the surface of P-doped amorphous silicon (P: $1 \times 10^{20}$ (atoms/cm$^3$). However, if the P does not diffuse into the grains, then the use as a device cannot be realized in practice since a depletion layer is formed in the storage electrode of the capacitor.

Figure 13:
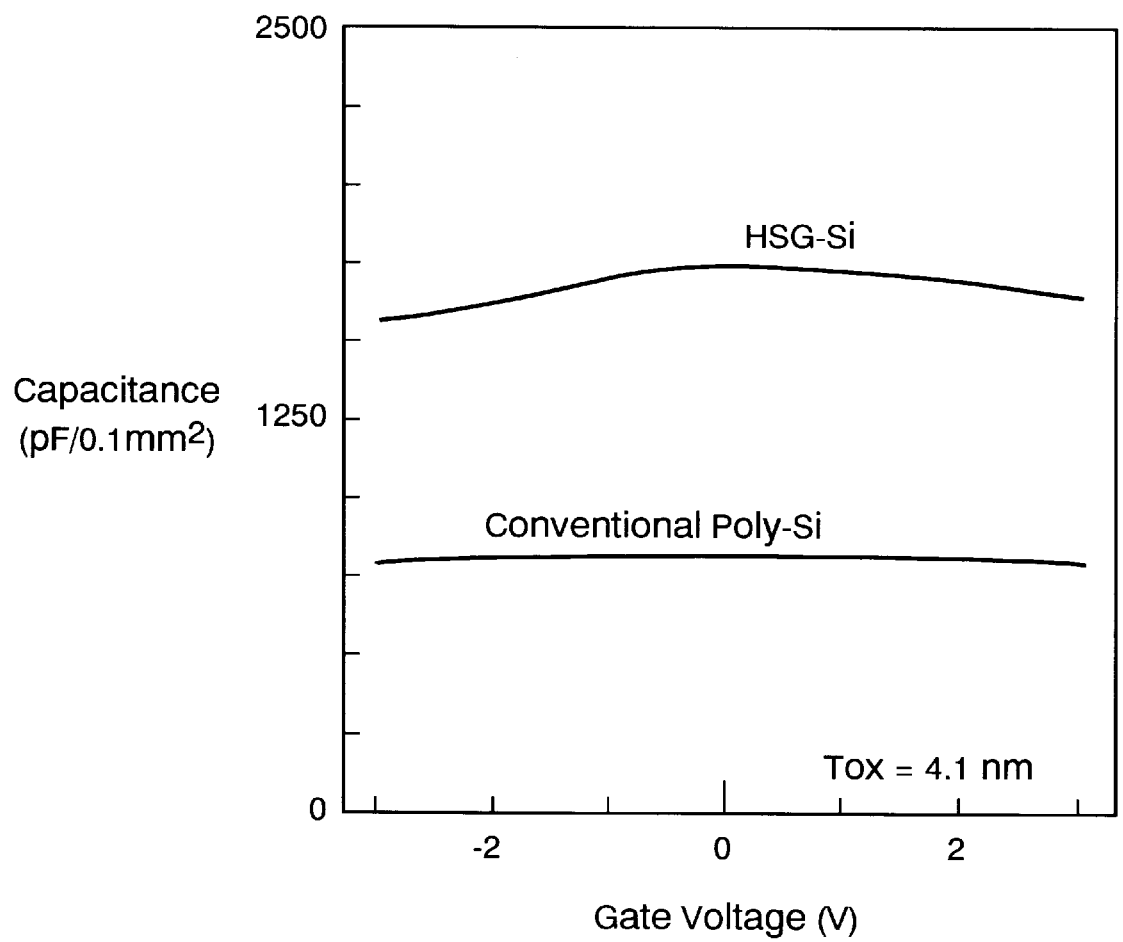
FIG. 13 is a graph illustrative of storage capacitance to gate voltages.

The result of formation of a capacitor and evaluation of its characteristics will now be explained. FIG. 13 shows the relationship between the storage capacitance of the capacitor and the gate electrode. Referring to the same drawing, it is apparent that the impurity is added satisfactorily, but in such an amount that a depletion layer does not spread in the storage electrode.

Results of EDX analysis of the P concentrations of the grains after formation of the storage electrode have revealed that $5 \times 10^{19}$ (atoms/cm$^3$) of P are taken by the grains. This suggests that the P diffuses from the inside of the P-doped amorphous silicon into the grains by passing the process of formation of the capacitor. The temperature of the process of formation of the capacitor is approximately 800° C., higher as compared with the temperature for the formation of the grains on the P-doped amorphous silicon (approximately 550° C.). It is supposed that the P diffused into the grains by being subjected to this thermal treatment.

However, it becomes necessary to set special conditions in order to diffuse the P into the HSG-Si without changing the state of the irregularities on the surface of the electrode when subjected to this thermal treatment For example, the film surface is not terminated with anything immediately after the formation of the HSG-Si. If the electrode in this state is directly heated to approximately 800° C., then the silicon constituting the HSG-Si again migrates on the surface. This results in destruction of the irregularities on the surface.

Accordingly, it is important to immobilize the silicon atoms on the surface of the electrode even by heating. As a method of accomplishing this objective, it has been found that exposure to an atmosphere of ammonia (NH$_3$) immediately after the formation of the HSG-Si and thermal treatment in the atmosphere are very effective. As mentioned above, the film surface is clean immediately after the formation of the HSG-Si. It has been found that feed of a flow of ammonia gas at the same temperature as for the formation of the HSG on such surface immediately results in termination of the silicon on the surface with nitrogen. This nitrogen, different from the hydrogen or the like, is not desorbed even by heating and remains steady on the surface of the silicon film As a result, the impurity may be diffused into the grains without changing the surface state of the electrode having the formed HSG-Si.

In this connection, the exposure to the ammonia gas may be carried out in the chamber for the formation of the HSG or may be conveyed to another chamber for the exposure. In cases where the exposure is carried out in the same chamber, the film may be heated in another gas atmosphere after exposure at the same temperature as for the formation of the HSG. Alternatively, the film may be treated by heating while being exposed to the ammonia. In addition, the film may be exposed to ammonia at the same temperature as for the formation of the HSG, and then may be annealed in another apparatus.

In cases where the film is exposed to ammonia in another apparatus after the formation of the HSG, it is important to flow ammonia at a temperature lower than the temperature for the formation of the HSG and then to increase the temperature. This is because the form of the HSG-Si changes if it is heated to temperatures higher than the temperature for the formation of the HSG prior to its nitriding. Accordingly, once the nitriding has occurred around the temperature for the formation of the HSG, there is no need to place limits on the atmosphere during the temperature increase thereafter. In addition, since the resulting nitride film is very thin, it does not adversely affect the characteristics of the capacitor even if it is not removed after the treatment. Accordingly, it may be left as such, regardless of the type of the insulated plates. Of course, it may be removed.

The cause of the above-mentioned phenomenon will now be discussed.

As mentioned above, addition of P atoms even in a slight amount on the order of $1 \times 10^{20}$ atoms/cm$^3$ to the inside of the amorphous silicon film result in the formation of hemispheric grains since the silicon atoms migrate on the surface. However, it has also been found that the activation energy for the growth of the grains increases as well. Also, as mentioned above, in cases where the P concentration of P-doped amorphous silicon is $5 \times 10^{20}$ atoms/cm$^3$ or more, although surely microcrystals are formed upon irradiation with disilane, the microcrystals grow little even treated by annealing.

Such being the case, first the process of growth of the hemispheric grains formed on the P-doped amorphous silicon will be discussed.

As mentioned above, addition of P atoms even in a slight amount on the order of $1 \times 10^{20}$ atoms/cm$^3$ to the inside of an amorphous silicon film result in the growth of hemispheric grains. Candidates for the rate-determining factor in the growth of the grains with a proportional relationship between $r^2$ and f·t include the process of diffusion of the atoms supplied to the surfaces of the grains or the process of production of the atoms which migrate. In order to determine which is the rate-determining factor, it is necessary to elucidate the behavior of the P atoms.

Turning back to FIG. 11, it is apparent that P does not diffuse into the HSG-Si grains. From this fact, it is understood that there is neither process of surface migration of the P atoms at a very low speed nor process of diffusion of the P atoms on the surface of the amorphous silicon film and supply to the grains.

If either of the processes mentioned above occurs, then the P concentrations of the uppermost surface of the amorphous silicon film on the peripheries of the grains should increase. However, since the uppermost surface of the P-doped amorphous silicon has lowered P concentrations, as mentioned above, either phenomenon of the diffusion of the P atoms on the film surface into the film or desorption from the uppermost surface of the film into the gas phase should have occurred.

Figure 12B:
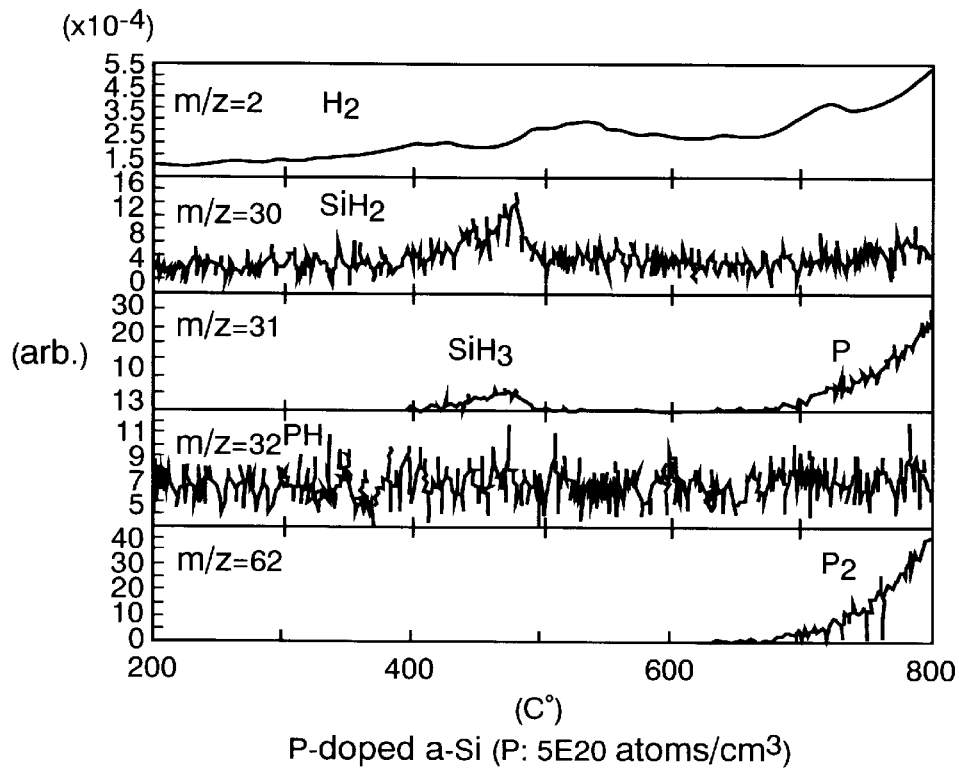

The results of the EDX prove that the P concentrations near the surface of the P-doped amorphous silicon film decrease toward the film surface. On the other hand, the results of the TDS analysis (FIG. 12) prove that there occurs the process of desorption of the P atoms on the uppermost surface of the P-doped amorphous silicon having a P concentration of $1 \times 10^{20}$ atoms/cm$^3$. If this phenomenon has occurred, it is understood why the surface of the P-doped amorphous silicon has lowered P concentrations.

The results of the EDX prove that most of the atoms constituting the grains and the surface of the amorphous silicon on the peripheries of the grains are of silicon. This leads to the conclusion that during the formation of the HSG-Si, the P atoms are desorbed from the surface, different from the silicon atoms which migrate on the surface of the amorphous silicon and are taken in by the grains.

On the other hand, in the case of the P-doped amorphous silicon having a P concentration of $5 \times 10^{20}$ atoms/cm$^3$ which does not undergo desorption of P around 500° C., the micro-crystals formed on the surface of the amorphous silicon do not grow even treated by annealing. The results of the TDS analysis prove that this film little undergoes desorption of the P atoms within the range of 500° C. to 600° C. This leads to the conclusion that the silicon atoms cannot diffuse on the surface of the P-doped amorphous silicon film unless the P atoms are not desorbed from the film surface.

The desorption of the P from the P-doped amorphous silicon will now be considered.

The results of the EDX prove that the P concentrations gradually decrease toward the film surface, starting at a depth of approximately 10 nm from the surface in cases where the surface of the P-doped amorphous silicon film having a P concentration of $1\times10^{20}$ atoms/cm$^3$ is treated for the formation of HSG-Si. This suggests that the P atoms diffuse in the amorphous silicon on the order of 500° C. and the P atoms are desorbed upon reaching the surface.

In addition, the TDS analysis has revealed that the P desorption reaches its peak around 550° C. From this at first glance it seems that the P desorption is the desorption of only the P on the uppermost surface.

Here, the TDS analysis is a method for analysis of the gas which is desorbed from P-doped amorphous silicon when the film is heated at a given temperature-rise rate.

When heated, P-doped amorphous silicon crystallizes on the order of 600° C. P-doped amorphous silicon has high electrical resistance. The degree of the resistance, however, drops sharply when crystallized. This is because the P atoms in P-doped amorphous silicon which do not form a sufficient network with the silicon, are combined with the silicon atoms when crystallized and are made active electrically.

From the foregoing facts, the significance of the fact that desorption of the P atoms has its peak when measured by TDS may be determined as follows.

Bonds between the P and silicon in P-doped amorphous silicon are weak. In addition, most of the dangling bonds of the silicon and P are terminated with hydrogen. For this, the P atoms diffuse in the silicon film even around 500° C. In the course of this diffusion, the P atoms which have reached the surface are desorbed from the film surface. During this process, the P is desorbed as atom. However, it is imagined that when the temperature of the P-doped amorphous silicon is increased as the analysis advances, and the P-doped amorphous silicon is eventually crystallized, the bonds between the P and silicon are reinforced and the diffusion coefficient of the P decreases. This seems to have caused prevention of the desorption of the P and provision of the peak in the desorption at a certain temperature This process seems to be the mainstream of the formation of the HSG-Si on the P-doped amorphous silicon having a P concentration of $1\times10^{20}$ atoms/cm$^3$.

Next, desorption of P from P-doped amorphous silicon having a P concentration of $5\times10^{20}$ atoms/cm$^3$ will be discussed.

It is known that in case where spontaneous oxide film-free silicon doped with P to a high concentration is heated, P starts to be piled up on the surface on the order of 500° C. The P piled up on the surface are desorbed mainly as $P_2$ molecule at 700° C. or higher. The process of desorption as $P_2$ molecule, is the desorption of the P—P bonds resulting from the silicon-P bonds on the silicon surface.

From the foregoing, the process of desorption of the P from the amorphous silicon film doped with P to a high concentration may be described as follows.

In cases where P-doped amorphous silicon is heated to around 500° C., the temperature for the formation of HSG-Si, the P diffuses in the film and the P atoms are precipitated on the surface. The precipitated P is desorbed from the film surface as atom However, since the P diffuses from the inside of the film to its surface at speeds overwhelming the amount of the P desorbed from the surface, P is piled up (precipitated) on the surface. The P atoms in this state cannot be desorbed one by one due to their interaction. Therefore, it is imagined that the tendency to be desorbed as $P_2$ molecule is accelerated at 700° C. or more. In other words, the difference from the film having a P concentration of $1\times10^{20}$ atoms/cm$^3$ is the difference in precipitation rate of P on the surface. Desorption of P atoms could not be confirmed by the described measurement in cases where the spontaneous oxide film was removed from the surface of the P-doped amorphous silicon having a P concentration of $5\times10^{20}$ atoms/cm$^3$. However, it is supposed that actually the desorption occurred, but below the sensitivity of the detection system.

For the above-mentioned facts, it is supposed that the reason for no formation of HSG-Si on the P-doped amorphous silicon having a P concentration of $5\times10^{20}$ atoms/cm$^3$ is the temperature for the desorption of the $P_2$ molecules which is higher than the temperature for the formation of HSG-Si, for which the P has been precipitated on the surface of the amorphous silicon at temperatures within the range of temperatures for forming the HSG-Si. This proves that desorption of the P as P atom at approximately 500° C. is the rate-determining process in the formation of the HSG-Si. This means that the process of desorption of the P from the film surface at temperatures within the range of temperatures for forming the HSG-Si becomes the rate-determining process in the migration of the silicon atoms which is required for the growth of the HSG-Si.

Hemispheric grains are formed on the P-doped amorphous silicon film whatever the grain size. On the other hand, in the case of the grains on the non-doped amorphous silicon, hemispheric grains grew in early stages of the growth at the rate under control of the dissociation energy of the hydrogen terminating the film surface.

However, as the desorption of the hydrogen terminating the surface of the amorphous silicon advanced, mainly silicon atoms were supplied via the dent sections (sections not influenced by the termination with hydrogen) of the silicon film on the peripheries of the grains and spheric grains grew. Nevertheless, determination of the rate by the hydrogen desorption without depending on the grain size was not confirmed within the temperature range for experiments on the growth of grains on the P-doped amorphous silicon. This fact may be explained as follows.

The results of the TDS analysis prove that the desorption of the hydrogen terminating the surface of the silicon film occurs at lower temperatures than the desorption of the P. Particularly, it is apparent that the large-scale desorption of the hydrogen from the Si-H occurs at temperatures slightly lower than the temperatures at which the P is desorbed. This suggests that the reason why the hydrogen desorption has no effect on the growth of the micro-crystals on the P-doped amorphous silicon is in the P desorption temperatures being lower than the hydrogen desorption temperatures.

Discussion will now be made regarding the reason why the grains on P-doped amorphous silicon are hemispheric whatever the grain size.

Figure 14A:
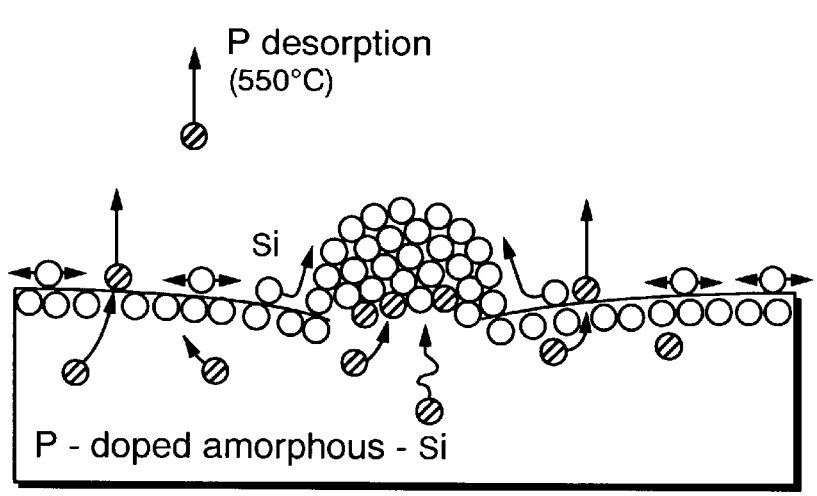
FIGS. 14(a) and 14(b) are diagrams illustrative of the process of growth of grains.
Figure 14B:
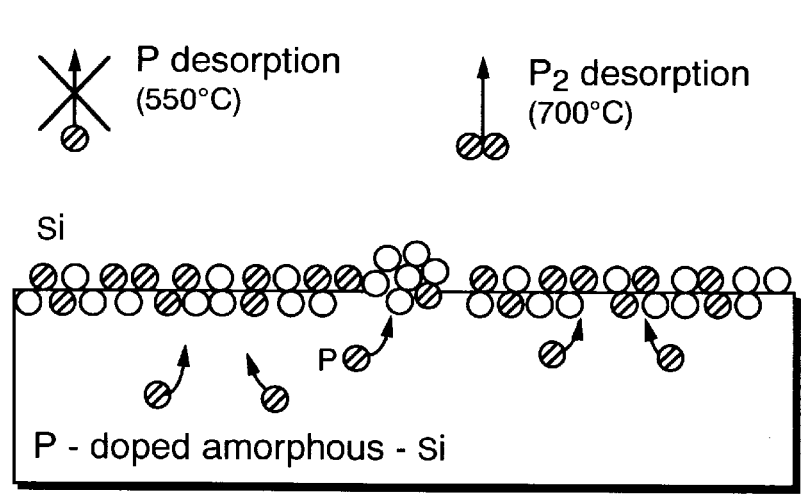

FIG. 14 is a schematic view of the process of formation of HSG-Si on P-doped amorphous silicon.

As mentioned above, the flow rate f of silicon atoms supplied to grains on a P-doped amorphous silicon film is determined by desorption of the P. The P-doped amorphous silicon film was formed by an LPCVD method using silane gas and PH$_3$ gas. Accordingly, the concentration distribution of P in the film prior to the formation of HSG-Si is uniform This means that the rate-determining factor P in the formation of the HSG-Si is distributed uniformly in the film. Since only the film surface is terminated with hydrogen on the non-doped amorphous silicon, the process of production of the silicon atoms which migrate only on the film surface was influenced by the desorption of the hydrogen. However, in cases where P is uniformly distributed in the film, even if the silicon atoms which may migrate are produced in the uppermost surface by the desorption of the P from the uppermost surface, the silicon atoms cannot migrate since P is now present in the new uppermost surface. Therefore, this process is believed to determine the rate of the grain growth whatever the grain size. More specifically, different from the case of non-doped amorphous silicon, since the rate-determining process is uniformly present even inside the film as mentioned above and thus the process of supply of the silicon in the section free from the rate determination by the desorption of the P does not become manifest, the hemispheric grains grow regardless of the grain size.

For the foregoing facts, the process of growth of micro-crystals on P-doped amorphous silicon is imagined as follows.

At temperatures within the range of 500° C. to 580° C., the temperatures for the formation of HSG-Si, the P-doped amorphous silicon film is kept in an amorphous state. In this state, the P atoms diffuse in the amorphous silicon film The P atoms which have reached the surface are desorbed from the surface. As a result, the P concentrations near the surface of the P-doped amorphous silicon film are decreased. The decrease in the P concentration allows migration of the silicon atoms on the film surface and their supply to the micro-crystals. This allows growth of the grains. Since the temperature is constant even if the silicon atoms on the film surface are used up as the growth of the grains advances, the HSG-Si continues growing, because the process of diffusion and the process of desorption of the P have reached an equilibrium For the foregoing reasons, the activation energy for the growth of micro-crystals on P-doped amorphous silicon is believed to be the sum of the diffusion and desorption energies of the P in the P-doped amorphous silicon. Based on the thickness of the layer near the surface of the P-doped amorphous silicon which has a lower P concentration, the migration length of the P is believed to be on the order of 10 nm.

As mentioned above, the P on the surface of the P-doped amorphous silicon having a P concentration of $1 \times 10^{20}$ atoms/cm$^3$ is desorbed from the surface of the amorphous silicon, but not being supplied to the grains through the migration on the surface. The steps which are involved in the process of supply of the P to the grains will now be discussed.

From the results of the EDX shown in FIG. 11, it is apparent that P is taken in at positions near the points at which the grains started to grow, immediately after the formation of the HSG-Si. However, no P is taken in on the peripheries of the grains. This proves that the P supplied to the grains have come from below the grains. In addition, the grains take in high concentrations of P through thermal treatment around 800° C. during the process of formation of a capacitive insulated film. This process is believed to be caused by thermal diffusion of the P atoms.

The following facts have been found as a result of investigation of formation of the HSG-Si on the P-doped amorphous silicon by irradiation with disilane gas molecular beams and subsequent annealing treatment. The silicon atoms migrate on the surface of the P-doped amorphous silicon and are supplied to the grains. The rate of this migration of the silicon atoms is determined by the process of desorption of the P atoms from the uppermost surface of the film. Accordingly, the activation energy 2.9 eV for the formation of micro-crystals on P-doped amorphous silicon is greatly different from the activation energy 2.3 eV for the formation of HSG-Si on non-doped amorphous silicon. As a result, since the P is not desorbed from the surface of the film having a high concentration of P at the processing temperature, the micro-crystals do not grow. Accordingly, it is important to reduce the P concentration of the film surface.

Up to this point, the process of formation of micro-crystals on P-doped amorphous silicon has been described. The description has revealed that the micro-crystals cannot grow even by irradiation with disilane gas and continuous annealing treatment if the amorphous silicon contains a high concentration of P.

It will now be described that the problem may be solved through irradiation with disilane gas and continuous annealing treatment.

First, conditions for experiments conducted using this method will be described below. A P-doped amorphous silicon film with an even film surface was deposited on a thermally oxidized silicon substrate. The P-doped amorphous silicon was formed by an LPCVD method using disilane gas and PH$_3$ gas at 510° C. The films having P concentrations of $3 \times 10^{20}$ atoms/cm$^3$ and $5 \times 10^{20}$ atoms/cm$^3$ were used as the P-doped amorphous silicon film. The amorphous silicon film was patterned by exposure to light and reactive ion etching. Thereafter, the film was washed with a solution prepared by mixing ammonia, an aqueous hydrogen peroxide and purified water, and then the spontaneous oxide film was removed from the electrode surface with a dilute aqueous solution of HF.

The wafer with the above-described P-doped amorphous silicon formed thereon was led into a vertical LPCVD reactor heated to 560° C. Since this apparatus is equipped with a vacuum load-locking mechanism, the wafer may be introduced into the reaction chamber without undergoing oxidation of the silicon electrode surfaces.

Here, the degree of vacuum which has attained in the reaction chamber is $1 \times 10^{-8}$ Torr. The wafer was maintained in this chamber for 30 minutes to a constant temperature, and then silane gas (diluted with 20% He) at a flow rate of 50 SSCM was led into the chamber, and the film was formed at 0.006 Torr.

By this treatment, an amorphous silicon film is selectively formed on the P-doped amorphous silicon This selectively grown film is formed of only silane gas (diluted with 20% He), and thus should be free from impurities. Actually, however, P was observed in the grown film.

Figure 15:
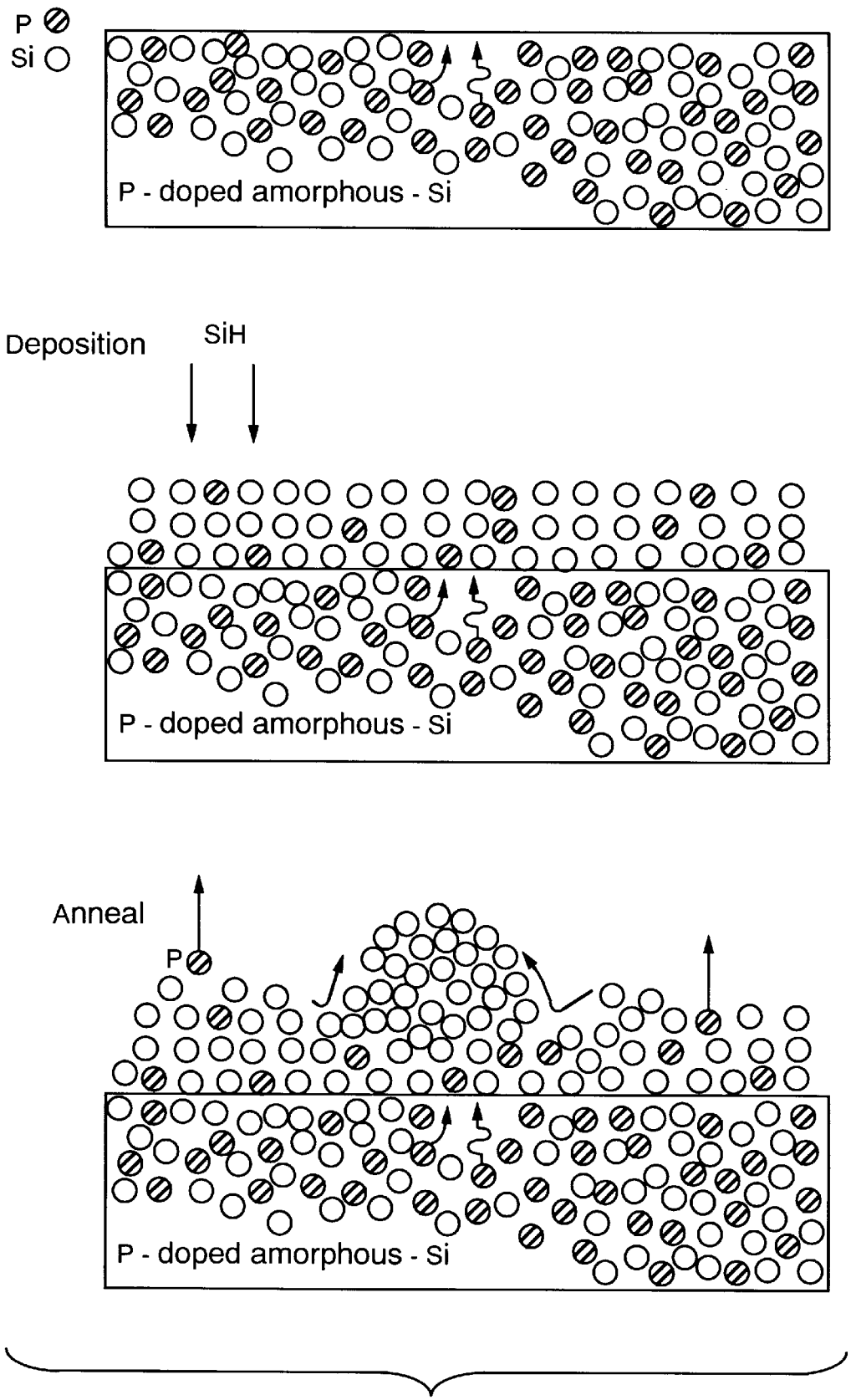
FIG. 15 is diagram illustrative of the process of growth of silicon grain by irradiation of silane gas.

The reason therefor will be explained with reference to FIG. 15, in case where a film of non-doped amorphous silicon is formed on a sample doped with P to a high concentration, the slope of P concentration is produced. Accordingly, the P diffuses into the film of the non-doped amorphous silicon in the course of growth of the amorphous silicon. The above-described results of the EDX prove that the P diffuses in the film at this temperature.

However, since the diffusion length is as short as 20 nm or less, the P concentration may be decreased near the film surface wherein the HSG-Si is formed. As a result, in the same manner as the above-described film having the lower P concentration of $1 \times 10^{20}$ atoms/cm$^3$, P is desorbed from the film surface at the temperatures for forming the micro-crystals, and thus the formation of irregularities on the electrode surfaces is accomplished.

Figure 16:
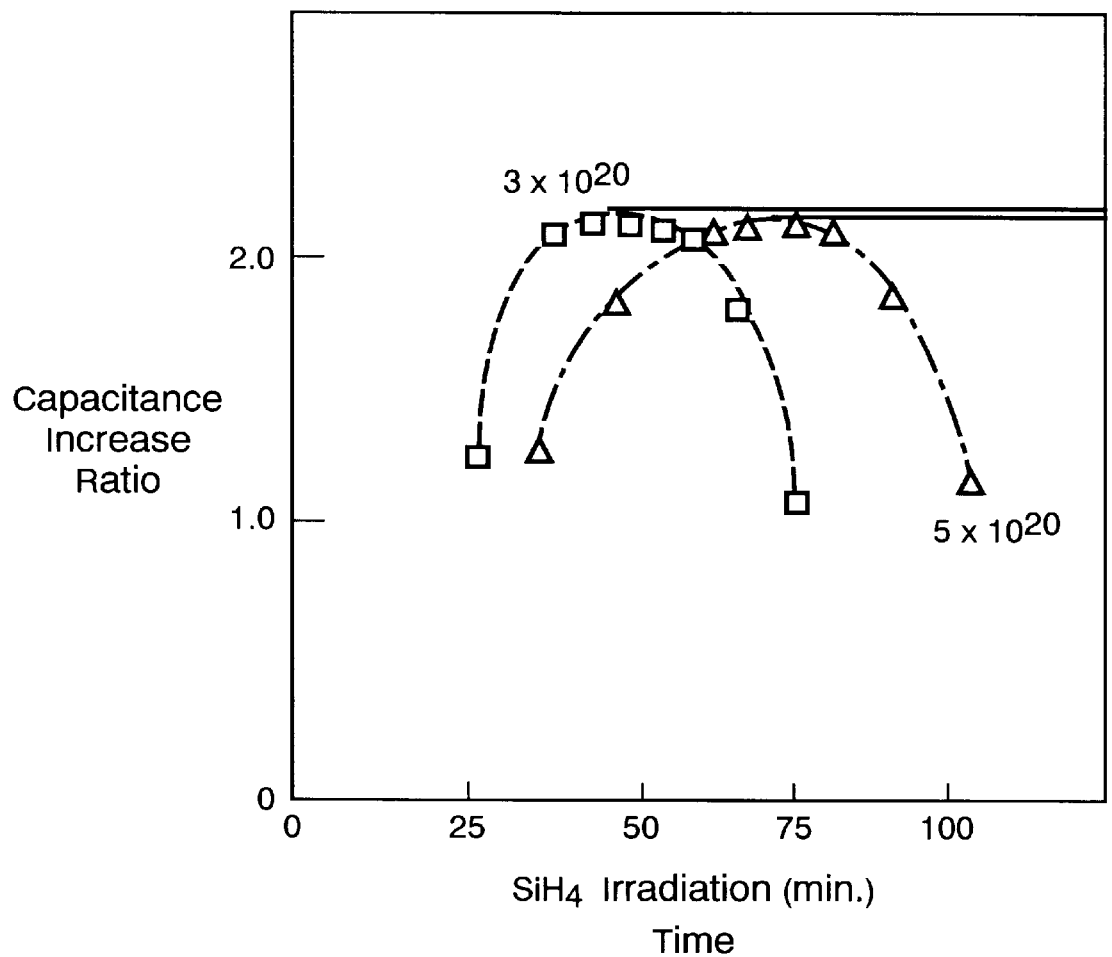
FIG. 16 is a graph illustrative of capacitance increase ratio to silane irradiation time.

FIG. 16 shows the volume increase ratios actually observed when the films having P concentrations of $3 \times 10^{20}$ atoms/cm$^3$ and $5 \times 10^{20}$ atoms/cm$^3$ were irradiated with silane gas for different hours and then treated by annealing in nitrogen for forty consecutive minutes. It is apparent from FIG. 16 that the surface area has increased since the formation of micro-crystals even on the surface of the P-doped amorphous silicon having the higher P concentration has become possible as well. However, in order to form irregularities on films having higher P concentrations, it is necessary to have a prolonged irradiation time of silane gas. This is because the growth of a thick film is required to grow the amorphous silicon and to lower the P concentration of the film surface, as mentioned above. In addition, the lowered attachment coefficient of silance gas due to the dense P is believed to be a contributing factor.

As mentioned above, irradiation with silane gas alone fails to directly deposit micro-crystal nuclei on P-doped amorphous silicon. However, growing of a non-doped amorphous silicon on the P-doped silicon causes lowering in the P concentration of the film surface and desorption of the P from the film surface. As a result, the silicon atoms migrate on the surface due to the thermal energy, and micro-crystal nuclei are formed on the film surface. The silicon atoms are captured by these micro-crystal nuclei, and the micro-crystals grow in this way. Accordingly, even if the P concentration of the surface of the amorphous silicon film is high, it is possible to form micro-crystals on the surface in the process which utilizes irradiation with silane gas, since the P concentration of the uppermost surface may be lowered. In this way, irregularities may be formed on the surface to increase the surface area.

Also, it is understood that the volume increase ratio falls if the silane gas irradiation process is carried out over a prolonged period. This is because, as will be indicated in Embodiment 4 given below, the grain size is decreased. The volume increase ratio is prevented from falling by formation of micro-crystals of relatively large size through irradiation with oxygen in 5 minutes after the start of the annealing. Details thereof will be described in Example 5 given below.

Embodiment 4

As mentioned above, application of silane gas onto amorphous silicon causes selective growth of the amorphous silicon. It has also been described above that micro-crystals are formed by thermal energy through annealing treatment in a high vacuum after the amorphous silicon has grown. It has also been described that the grain size has poor uniformity for this reason. An approach for solving this problem will now be described.

P-doped amorphous silicon (P: $3 \times 10^{20}$ atoms/cm$^3$) with an even film surface was deposited on a thermally oxidized silicon substrate. The P-doped amorphous silicon was formed by an LPCVD method using silane gas and PH$_3$ gas at 510° C. The amorphous silicon film was patterned by exposure to light and reactive ion etching. Thereafter, the film was washed an aqueous solution prepared by mixing ammonia, an aqueous hydrogen peroxide and purified water, and then the spontaneous oxide film was removed from the electrode surfaces with a dilute aqueous solution of HF. The wafer with the above-described P-doped amorphous silicon formed thereon was led into a vertical LPCVD reactor heated to 560° C. Since this apparatus is equipped with a vacuum load-locking mechanism, the wafer may be introduced into the reaction chamber without undergoing oxidation of the silicon electrode surfaces. Here, the degree of vacuum which was attained in the reaction chamber is $1 \times 10^{-8}$ Torr. The wafer was maintained in this chamber for 30 minutes to a constant temperature, and then 50 SSCM of silane gas (diluted with 20% He) was led into the chamber, and the film was formed at 0.006 Torr for 40 minutes. By this treatment, an amorphous silicon film is selectively formed on the P-doped amorphous silicon. Then, annealing in a high vacuum was conducted continuously. This treatment results in formation of micro-crystals on the amorphous silicon electrodes.

Oxygen was led into the chamber for 1 minute (0.01 Torr) at 5 minutes, 10 minutes and 20 minutes into the annealing treatment in a high vacuum, and the samples were again annealed in a high vacuum for 40 minutes, 35 minutes and 25 minutes, respectively. The results are shown in FIG. 17.

Figure 17A:
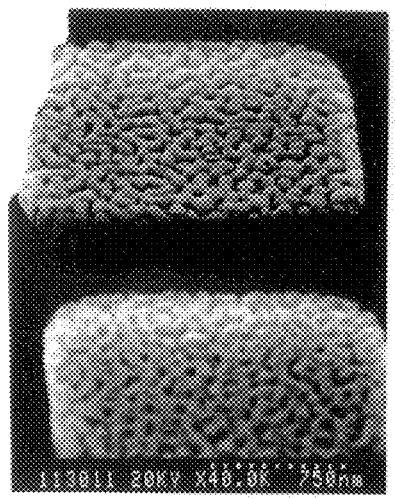
FIGS. 17(a) to 17(c) are diagrams illustrative of the state of silicon layer subject to oxygen irradiation.
Figure 17B:
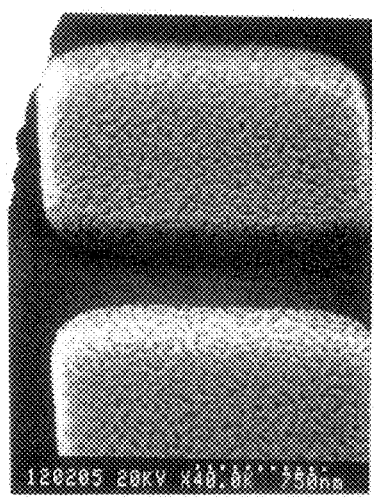
Figure 17C:
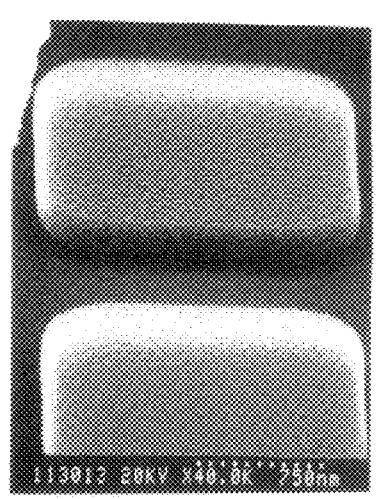

Referring to the same drawing, it is apparent that in cases where oxygen was led after the 5-minute annealing in a high vacuum and then the 40-minute re-annealing treatment was conducted (see FIG. 17(a)), the density of the grains is low, and the grain size has increased. It is also apparent that in cases where oxygen was led after the 10-minute annealing in a high vacuum and then the 35-minute re-annealing treatment was conducted (see FIG. 17(b)), the grain density is roughly twice that of the sample which has received the led oxygen after the 5-minute annealing. It is also apparent that the sample which has undergone the 20-minute annealing in a high vacuum, subsequent oxygen irradiation and the 25-minute re-annealing (see FIG. 17(c)) have a higher grain density. In addition, the grain size decreases as the grain density increases.

FIG. 16 referred to above shows two lines (broken and solid lines) illustrating different volume increase ratios in regions with prolonged irradiation times, the broken line is for the silane gas irradiation followed by the continuous annealing treatment, while the solid line is for the oxygen irradiation according to Embodiment 4 which was conducted 5 minutes after the annealing started.

Reasons for the occurrence of the above-mentioned facts will now be described. Micro-crystals are formed by thermal energy through annealing in a high vacuum of the amorphous silicon formed by application of silane gas onto amorphous silicon. The number of these micro-crystals increases as the annealing time is prolonged. Accordingly, the introduction of oxygen suppresses the migration of the silicon atoms on the film surface. Therefore, it is supposed that the production of the nuclei stops upon irradiation with oxygen.

The growth of the grains will now be considered.

If the oxygen irradiation completely prevents the migration of the silicon atoms, then no grains should grow. Actually, however, it is confirmed that the grains grow if treated by annealing after the oxygen irradiation.

The reason therefor will now be explained with reference to FIG. 18. The surface of the amorphous silicon film is oxidized at the instant when irradiated with oxygen. The resulting oxide film, however, is a rough and very thin film. Accordingly, though the silicon film which migrate on the silicon surface are surely present, the total of the silicon which migrates decreases. As a result, it is unlikely that micro-crystals are formed on the film surface. The reason therefor is believed that the possibility of disappearance of the nuclei increases since it takes much time until the nuclei reaches the critical nucleus size. The micro-crystals which have reached the critical nuclei size or greater, however, grow by capturing the silicon atoms. The forms of the micro-crystals change as they grow, since the silicon atoms near the micro-crystal nuclei are used up.

Figure 18:
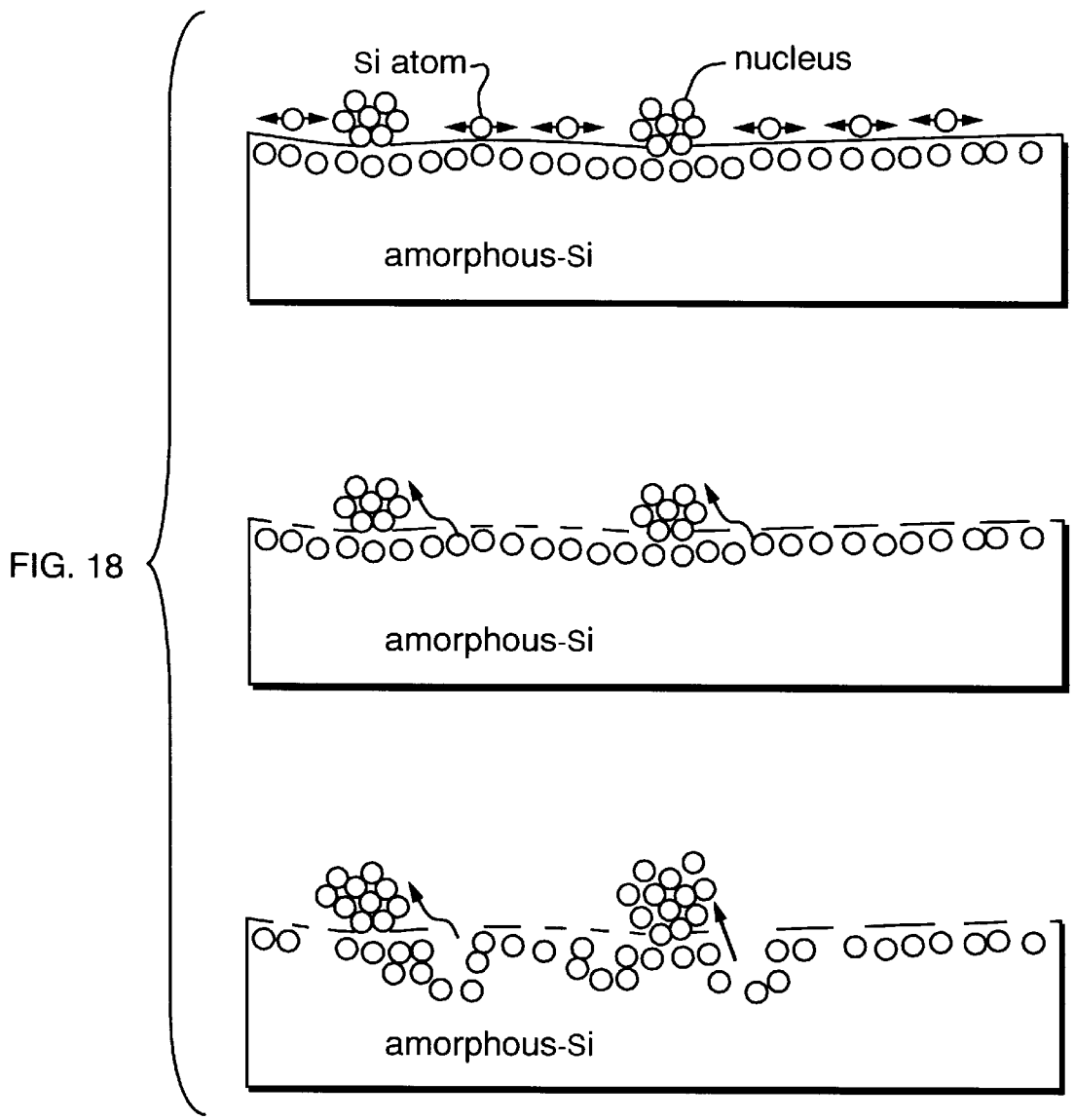
FIG. 18 is a diagram illustrative of the effects of oxygen irradiation.

As a result, as shown in FIG. 18, the surface area of sections which produce silicon atoms only-on the peripheries of the nuclei increases. Accordingly, the density of the nuclei does not increase higher than that at the time of the oxygen irradiation, and there occurs only enlargement of the micro-crystals. The grain density and size may be controlled in this way.

As mentioned above, amorphous silicon may be selectively grown on amorphous silicon by thermally treating a substrate with an amorphous silicon layer from which the spontaneous oxide surface film has been removed in a high vacuum or inert gas and then exposing the substrate to silane gas. Here, higher levels of selectivity may be accomplished by setting the partial pressure of the silane gas to $1 \times 10^{-3}$ Torr or less.

In addition, by decreasing the temperature of the substrate after the thermal treatment, under exposure to a hydrogen-containing gas or an oxidizing gas, formation of micro-crystals on the surface of the amorphous silicon film may be prevented. By thermally treating the substrate in a non-oxidizing gas atmosphere after the thermal treatment, irregularities due to the micro-crystals may be formed on the amorphous silicon. By irradiating the substrate with oxygen gas after the thermal treatment in the atmosphere of a non-oxidizing gas and then thermally treating the substrate in an atmosphere of a non-oxidizing gas, the micro-crystals may continue growing while maintaining the nucleus density established at the time of the irradiation treatment.

The micro-crystals may be doped with an impurity by thermally treating a substrate with an amorphous silicon layer doped with phosphorus, in a high vacuum or inert gas, forming irregularities due to the micro-crystals through thermal treatment of the substrate in an atmosphere of a non-oxidizing gas and then thermally treating the substrate at higher temperatures. In the present embodiment, P-doped amorphous silicon was used as the amorphous silicon doped with an impurity. Amorphous silicon containing added As (arsenic) or doped with As has the same properties as P-doped amorphous silicon. Accordingly, As-doped amorphous silicon may be used as the amorphous silicon.

Embodiment 5

Description will be made below on the fifth embodiment of the present invention.

A P-doped amorphous silicon layer (P: $3 \times 10^{20}$ atoms/cm$^3$) with an even film surface was deposited on a thermally oxidized silicon substrate. This P-doped amorphous silicon layer was formed by an LPCVD method using silane gas and $PH_3$ gas at 510° C. The amorphous silicon film layer was then patterned by exposure to light and reactive ion etching. Thereafter, the film was washed by an aqueous solution prepared by mixing ammonia, an aqueous hydrogen peroxide and purified water, and then the spontaneous oxide film was removed from the electrode surfaces with a dilute aqueous solution of HF. The wafer with the above-described P-doped amorphous silicon layer formed thereon was led into a vertical LPCVD reactor heated to 560° C. Since this apparatus is equipped with a vacuum load-locking mechanism, the wafer is introduced into the reaction chamber without undergoing oxidation of the silicon electrode surfaces. Here, the degree of vacuum which has attained in the reaction chamber is $1 \times 10^8$ Torr. The wafer was maintained in this chamber for 30 minutes to a constant temperature, and then 50 SSCM of silane gas (diluted with 20% He) was led into the chamber, and the film was formed at 0.006 Torr.

Figure 19:
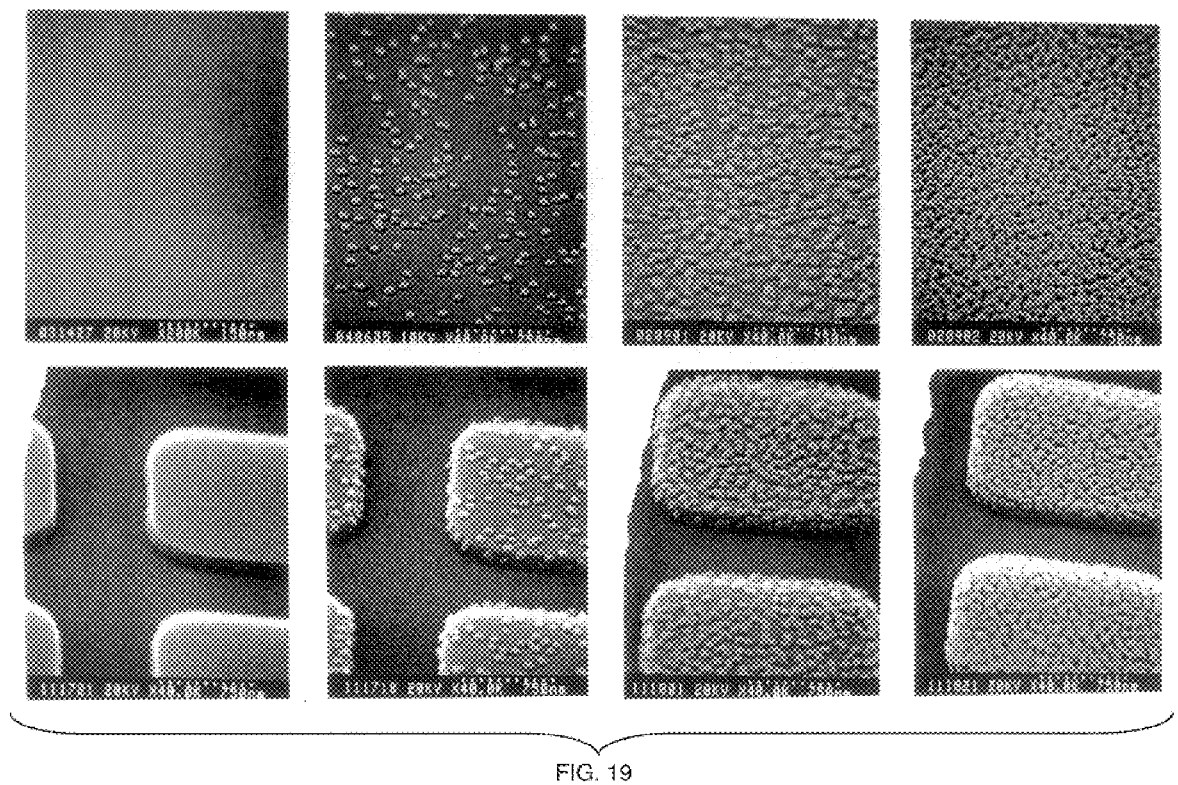
FIG. 19 is a diagram illustrative of the surface state of a silicon layer by forming irradiation of silane gas on an amorphous silicon layer.

In this embodiment, the irradiation time of silane gas was varied in order to confirm the effect of forming an amorphous silicon film on the P-doped amorphous silicon layer in a relatively small thickness. Further in this embodiment, the annealing time after the irradiation of silane gas is fixed to be 30 minutes. The result is shown in FIGS. 19(a) to 19(d), in which FIGS. 19(a) shows no-irradiation of silane gas, 19(b) shows irradiation for 5 minutes, 19(c) shows irradiation for 10 minutes, and 19(d) shows irradiation for 20 minutes. It is apparent from FIG. 19 that the HSG-Si formation density is lowered in accordance with shortage in irradiation time.

Figure 20:
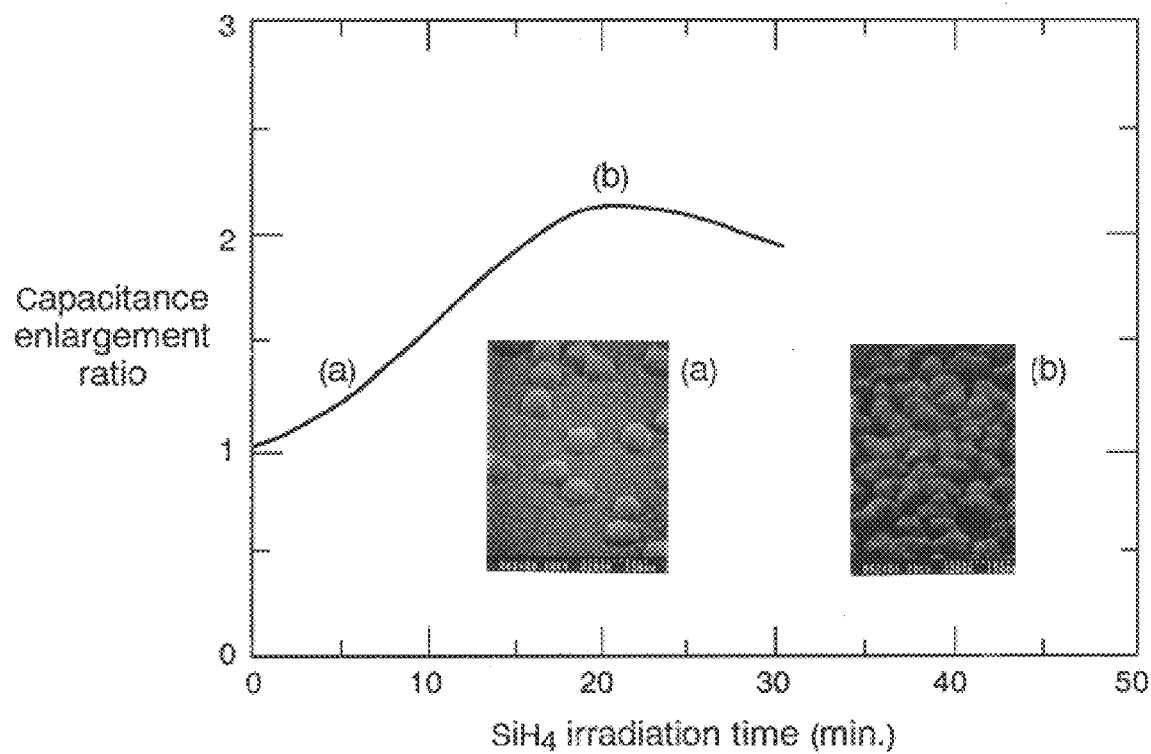
FIG. 20 is a graph illustrative of the capacitance enlargement ratio to a silane irradiation time.

The amorphous silicon layer thus formed may be used as a lower electrode for a capacitor. FIG. 20 shows a capacitance enlargement ratio to a change in silane gas irradiation time with fixing the time for annealing constant.

Embodiment 6

Referring now to FIGS. 21(a) to 21(e), the description will be made on a method of fabricating a dynamic random access memory device. It is to be noted that only two memory cells are illustrated.

Figure 21A:
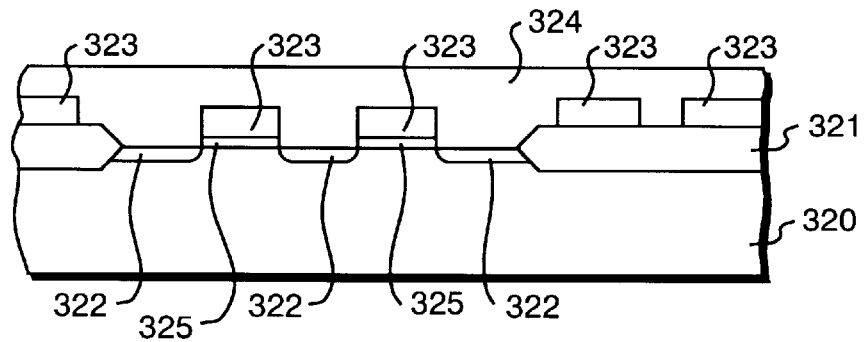
FIGS. 21(a) to 21(e) are cross section views illustrative of respective steps of fabricating a DRAM cell.

At first, as shown in FIG. 21(a), a P-type silicon substrate 320 is selectively covered with a field oxide layer 321 which is formed by the so-called LOCOS technique, followed by forming poly-silicon gates 323, which also serve as word lines, for transistors of the memory cells. In this drawing, two gates 323 are formed on the substrate 321 with intervention of gate insulating films 325 therebetween, and other word lines 323 extending from the gates of other transistors are formed on the field oxide layer 321. By ion-implantation of N-type impurities such as phosphorus and arsenic using these the gates 323 and the field oxide layer 321 as a mask, N-type impurity regions 322 as source/drain regions are formed in the substrate 320. Thereafter, an interlayer insulating layer 324 such as silicon oxide, silicon oxide containing boron and/or phosphorus and the like is deposited over the entire surface.

Figure 21B:
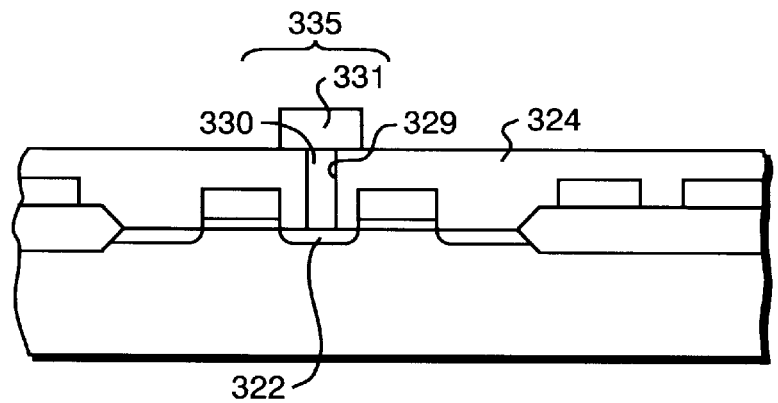

As shown in FIG. 21(b), a bit line contact hole 329 is formed in the insulating layer 324 to expose a part of the region 322 which is used in common for the two cells, followed by being filled with a poly-silicon film 330 doped with impurities. A refractory metal silicide layer 331 such as tungsten silicide is formed in contact with the poly-silicon layer 330. A bit line 335 is thus formed.

Figure 21C:
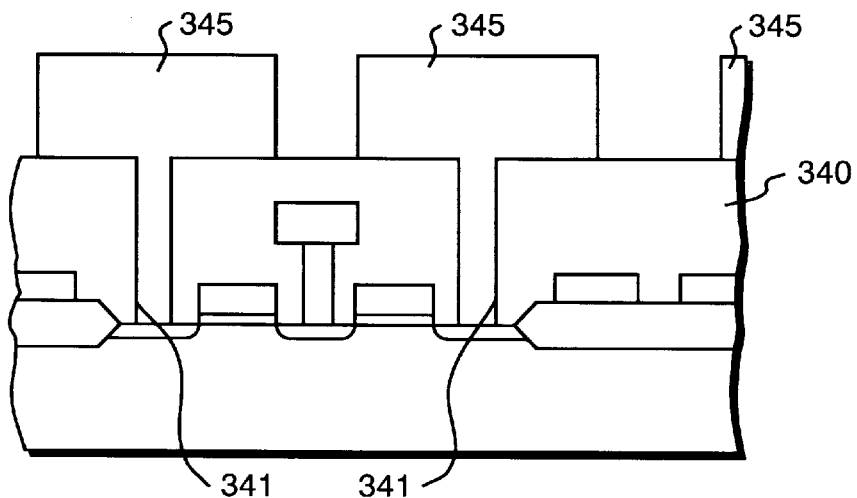

As shown in FIG. 21(c), an insulating layer such as silicon oxide is deposited over the entire surface to form a thick interlayer insulating layer 340. Capacitor contact holes 341 are thereafter formed in the insulating layer 340 to expose respective parts of the regions 322 of the cell transistors. An amorphous silicon layer doped with phosphorus is then deposited over the entire surface filling the contact holes 341, followed by being patterned to form amorphous silicon storage electrodes 345 for the cell capacitors.

Figure 21D:
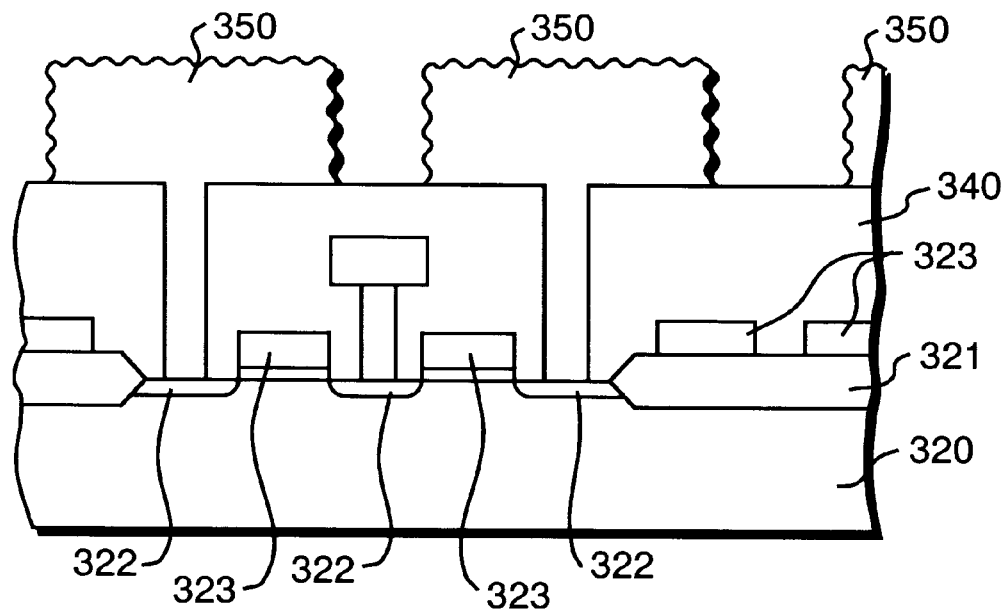

Thereafter, the natural oxide films formed on the amorphous silicon electrodes 345 are removed to obtain a clean surface thereof in such a manner as described above, followed by depositing a non-doped, thin amorphous silicon layer on the cleaned surface of the electrodes 3345 by the irradiation of a silane gas in such a manner as also described above. The annealing process is performed continuously in an inert gas to form and grow hemispherical or spherical silicon grains on the surface of the storage node electrode 345. Thus, amorphous silicon storage node electrodes 350 having an uneven surface are formed, as shown in FIG. 21(d).

Figure 21E:
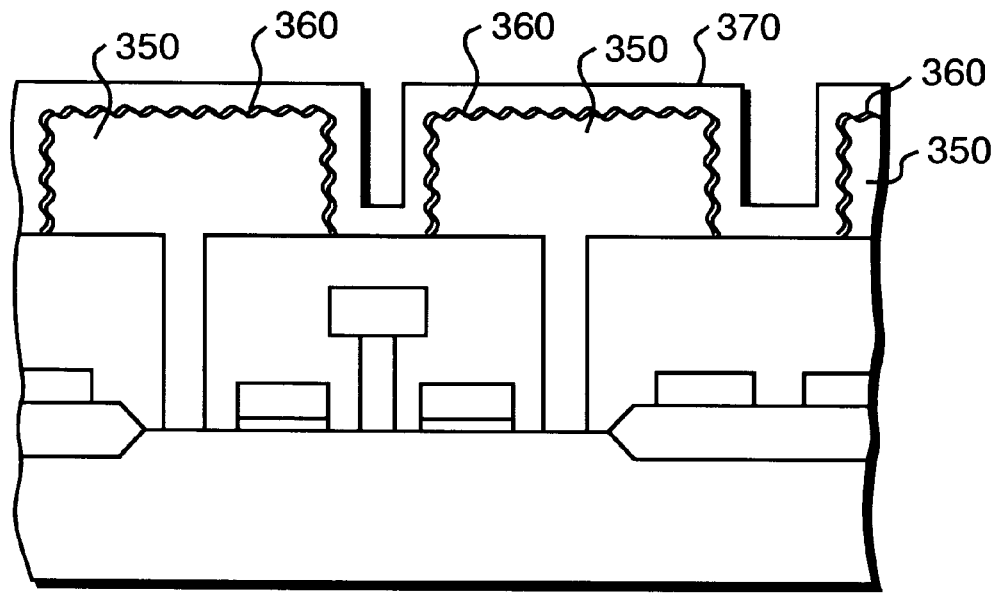

Next, the annealing process is performed in a nitrogen-containing atomosphere to thereby form dielectric films 360 including a thermal silicon nitride film, as shown in FIG. 21(e). At this time, phosphorus impurities are diffused into each of the silicon grains from the internal of the electrodes 350 together with polycrystallizing each electrode 350, as described hereinbefore. Subsequently, a cell plate electrode 370 is formed over the surface by depositing an amorphous silicon or polysilicon layer doped with impurities.

Figure 22A:
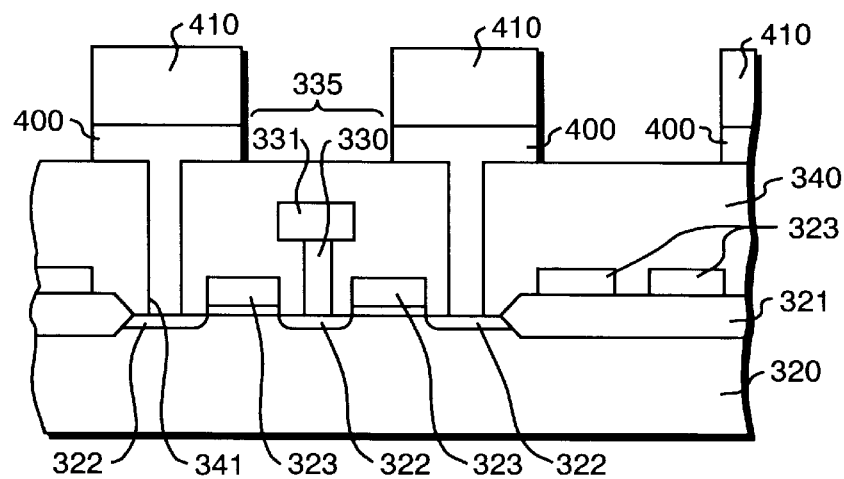
FIGS. 22(a) to 22(c) are cross section views illustrative of respective steps of fabricating another DRAM cell.
Figure 22B:
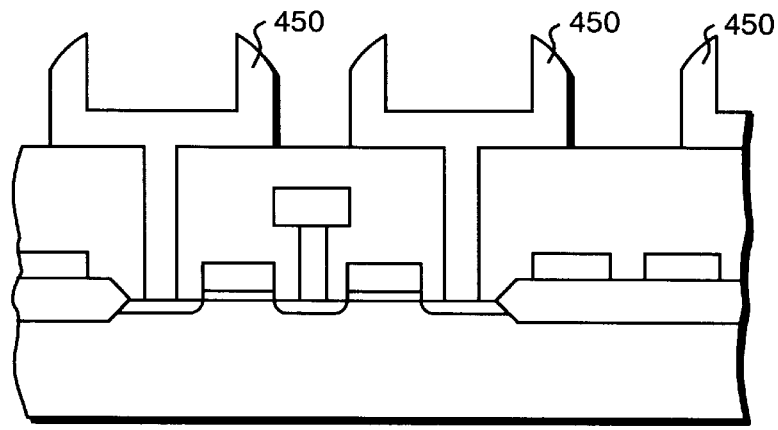
Figure 22C:
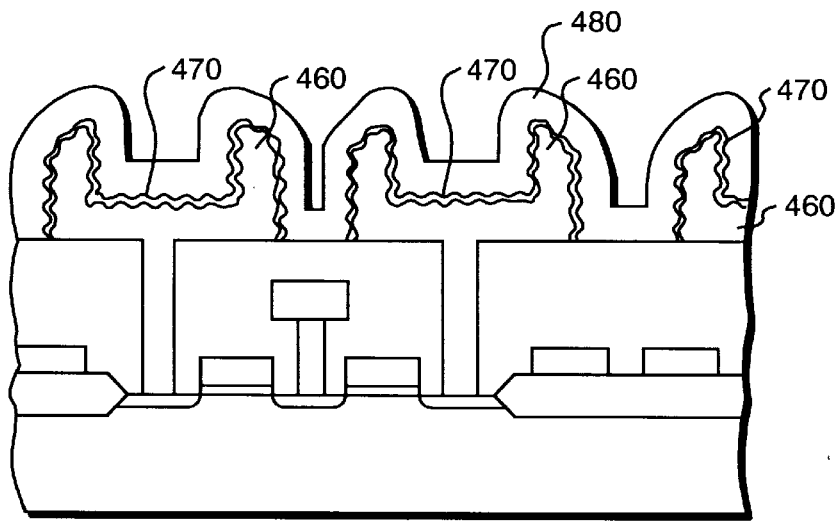

Turning to FIGS. 22(a) to 22(c), there are shown respective steps of a method of fabricating a DRAM cell of the so-called cylinder type, in which the same consituents as those shown in FIG. 21 are denoted by the same reference numerals to omit the further description thereof.

After capacitor contact holes 341 are formed in the interlayer insulating layer 340 in accordance with the steps as shown in FIGS. 21(a) to 21(c), an amorphous silicon layer doped with phosphorus is deposited over the entire surface with filling the contact holes 341, and an insulating layers such as silicon oxide is formed, these two layer being then patterned. As a result, as shown in FIG. 22(a), amorphous silicon layers 400, which fill the corresponding contact holes 341 and are covered with the corresponding insulating layers 410, are formed.

An amorphous silicon layer doped with phosphorus is deposited over the entire surface, followed by being etched-back until the surfaces of the insulating layers 410 are exposed. By removing the insulating layers 410, cylinder-type amorphous silicon electrodes 450 doped with impurities are formed as shown in FIG. 22(b).

The surface of each cylinder electrode 450 is then cleaned to remove a natural silicon oxide film therefrom, and thereafter, a relatively thick, non-doped amorphous silicon film is deposited on each electrode 450, followed by performing annealing process in an inert gas in such a manner as described above. Thus, cylindrical silicon electrodes 460 are formed with an uneven surface caused by the hemispherical or spherical silicon grains, as shown in FIG. 22(c) Subsequently, dielectric films 470 are formed in the same way as described with reference to FIG. 21(e), and a cell plate electrode layer 480 is deposited thereover, as also shown in FIG. 22(c).

Thus, the DRAM cells having large capacitance are formed with a small area.

Embodiment 7

As briefly described above, it is also possible to produce a silicon layer having an even surface. An explanation will now be given regarding a method in which no irregularities are formed by annealing after the formation of the amorphous silicon. Specifically, this is a method of providing a silicon film with a smooth surface, without forming micro-crystals on the surface of the amorphous silicon, by continuously introducing hydrogen or an oxidizing gas into the chamber and decreasing the temperature while being maintained in the atmosphere.

The provision is accomplished when hydrogen is applied, since the surface migration of the silicon atoms is suppressed. Contrary, in the case of irradiation of oxygen, the surface migration of the silicon atoms on the surface of the silicon film is suppressed since approximately one atom layer of the film surface is oxidized. A silicon film with a smooth surface is formed by decreasing the temperature in the course of the treatment.

Hereunder, it is proved that hydrogen produces the above-mentioned effects. Here, an explanation will first be given about the role of the hydrogen when the surface of the amorphous silicon is irradiated with disilane gas to form micro-crystal nuclei, and then about accomplishment of an even film surface with no crystal nuclei formed thereon after irradiation of the surface of the amorphous silicon with silane gas.

First, there is presented a description of experimental conditions for the formation of HSG-Si by irradiation with disilane gas and annealing in a high vacuum. First, a non-doped amorphous silicon film having an even film surface was deposited on a thermally oxidized silicon substrate. The non-doped amorphous silicon film was formed by a LPCVD method at 540° C. and 1 Torr using silane gas. This film was patterned by exposure to light and reactive ion etching. Thereafter, the film was washed with a solution prepared by mixing ammonia, an aqueous hydrogen peroxide and purified water to remove off the spontaneous oxide film on the surface of the electrode with a dilute aqueous solution of HF.

A UHV-CVD (Ultra High Vacuum Chemical Vapor Deposition) apparatus (SRE612 manufactured by ANEL VA) was used for the formation of HSG-Si. Air was exhausted from the growth chamber to a degree of vacuum of $8.5 \times 10^{-10}$ Torr with a turbo-molecular pump, The inside wall of the growth chamber is cooled, and the heating mechanism section and the reaction chamber are separated from each other by the substrate itself. This configuration prevents a decomposition reaction of the gas in portions other than the substrate. Heating of the wafer was accomplished by thermal radiation from a carbon heater. Irradiation with disilane gas and annealing treatment for the-formation of HSG-Si were conducted continuously in the growth chamber.

Unless otherwise indicated, the irradiation temperature of the disilane gas is the same as the annealing temperature. The control of the flow rate of the disilane gas (100%) was conducted with a mass flow controller. In addition, for comparison with the case of the disilane irradiation process, another experiment was effected wherein irradiation with silicon molecular beams was conducted under the conditions: flux density, $3.5 \times 10^{14}$ (atoms/cm$^2$•sec), at 605° C. for 30 seconds, and then the temperature was decreased. An electron beam evaporator was used as the silicon molecular beam source.

First, there is presented a description of results of investigation of the mechanism for forming nuclei in cases where irradiation with disilane gas was utilized for the formation of the nuclei on the amorphous silicon.

Figure 23:
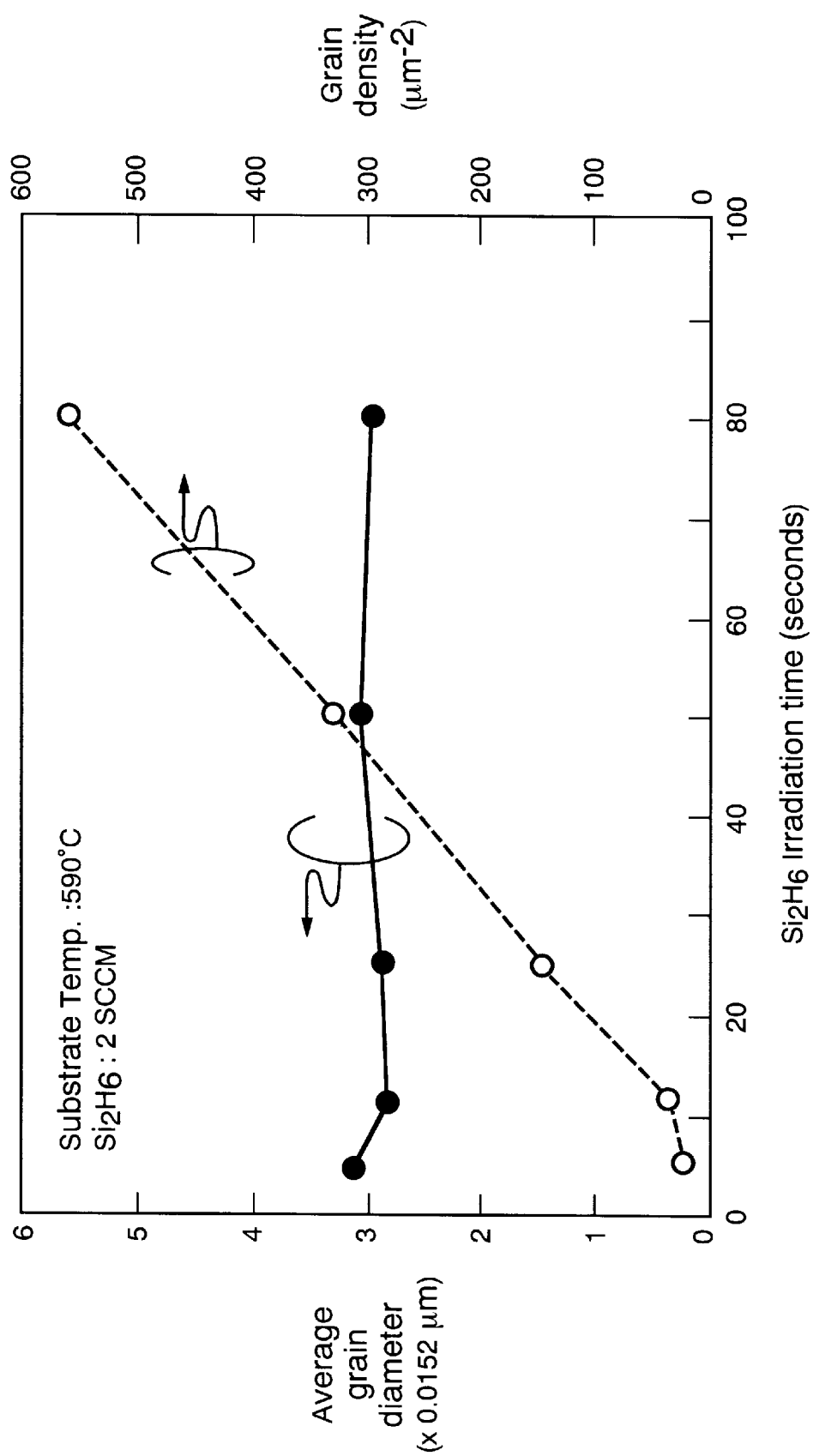
FIG. 23 is a graph illustrative of average grain diameter to disilane irradiation time.

FIG. 23 illustrates dependency of the density of the hemispheric grains formed on the amorphous silicon (grain density) and the average size of the grains (average grain diameter) on the disilane gas irradiation time ($Si_2H_6$ irradiation time). In this experiment, the amorphous silicon heated to 590° C. was irradiated with 2 SCCM of disilane gas, and was then annealed at the same temperature for 20 minutes, after which the temperature of the substrate was decreased.

Referring to the same drawing, the density of the hemispheric grains increases linearly as the irradiation time of disilane gas increases. On the other hand, it is apparent that the grain sizes are almost constant regardless of the irradiation time. These facts prove that the formation of the nuclei on the surface of the amorphous silicon is caused by the irradiation with disilane gas, and that no grains grow during the formation of the nuclei by the irradiation with disilane gas.

Figure 24:
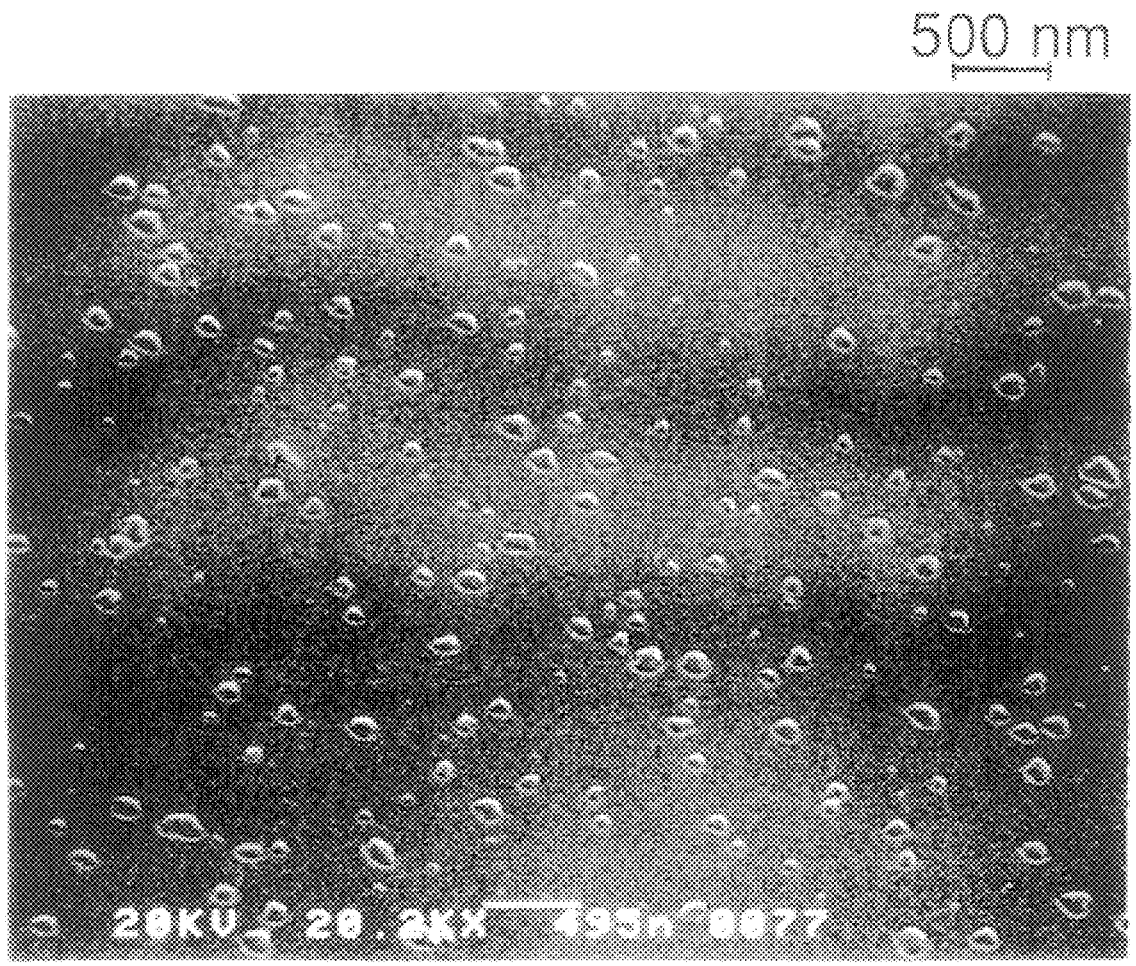
FIG. 24 is a diagram illustrative of grain grown on an amorphous silicon layer by irradiation with silicon molecular beams.

Subsequently, in order to investigate whether the reason for very little difference in the sizes of the HSG-Si even with different disilane gas irradiation times is inherent to the irradiation with disilane gas, silicon molecular beams were applied onto amorphous silicon to form HSG-Si. FIG. 24 is a photograph illustrative of the surface of the film which was irradiated with silicon molecular beams at the substrate temperature of 605° C. for 30 seconds, taken with a Scanning Electron Microscope (hereunder abbreviated to "SEM"). Referring to the same drawing, it is apparent that the sizes of the SHG-Si are nonuniform in cases where the irradiation with silicon molecular beams was effected at 605° C.

The reason for the formation of the grains with nonuniform sizes is believed that different times spent for the formation of the nuclei influenced the growth times of the respective grains. In other words, the nonuniform grain sizes may be concluded to have resulted from a great difference in growth time between the nuclei formed immediately after the start of the irradiation with molecular beams and the nuclei formed immediately before the completion of the irradiation with molecular beams.

From this, it has been found that the reason why the grain sizes are uniform regardless of the irradiation time in the case of the irradiation with disilane gas is a phenomenon characteristic of the irradiation with disilane gas. Such being the case, it is necessary to determine the effects of the irradiation with disilane gas alone.

In practice, however, it is impossible to cool the wafer so quickly after the completion of the irradiation with disilane gas that the wafer becomes insensitive to annealing, because of a large effect of the thermal capacity of the silicon substrate, the heater, etc. Therefore, the post-annealing effect was controlled by applying disilane gas at 600° C. for 20 seconds, decreasing the temperature to 530° C. and 380° C. while continuing the irradiation with disilane gas and then stopping the irradiation with disilane gas.

In this experiment, a comparison in performance was also made between different doses, specifically 20 SCCM and 0.5 SCCM of disilane gas.

Figure 25:
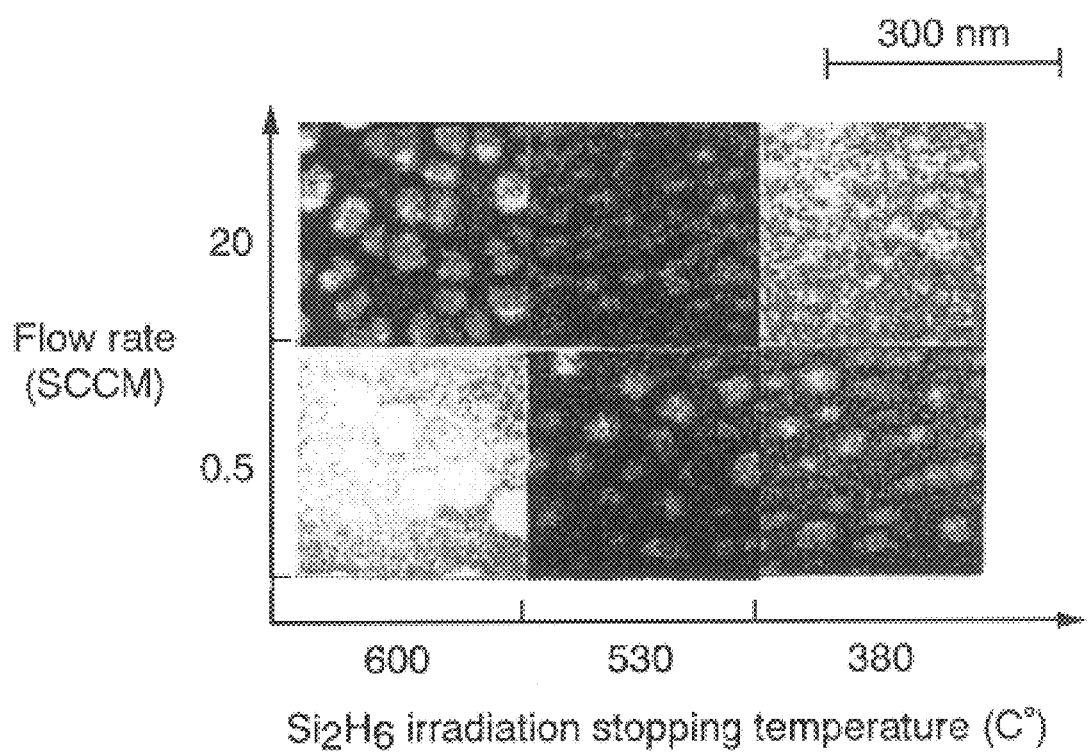
FIG. 25 is a diagram illustrative of a surface state of a silicon layer with respect to a flow rate to disilane irradiation stopping temperature.

FIG. 25 shows the results of observation of the surface state of the silicon film at different doses of disilane gas and different irradiation stopping temperatures.

Referring to the same drawing, it is apparent that stopping the disilane gas irradiation at lower temperatures result in smaller sizes of the hemispheric grains. Further, it is understood that a greater flow rate of disilane gas results in smaller-sized grains and higher particle densities. Particularly, production of only nuclei with a fineness on the order of a few nanometers is confirmed in cases where the temperature is decreased to 380° C. while continuing a 20 SCCM flow of disilane gas.

In this way, it has been revealed that the grains grow little without post-annealing after the disilane gas is cut off. In other words, it is understood that the grains grow little during the irradiation with disilane gas. However, it has also been found that the formation of micro-crystal nuclei occurs during the irradiation.

Figure 26:
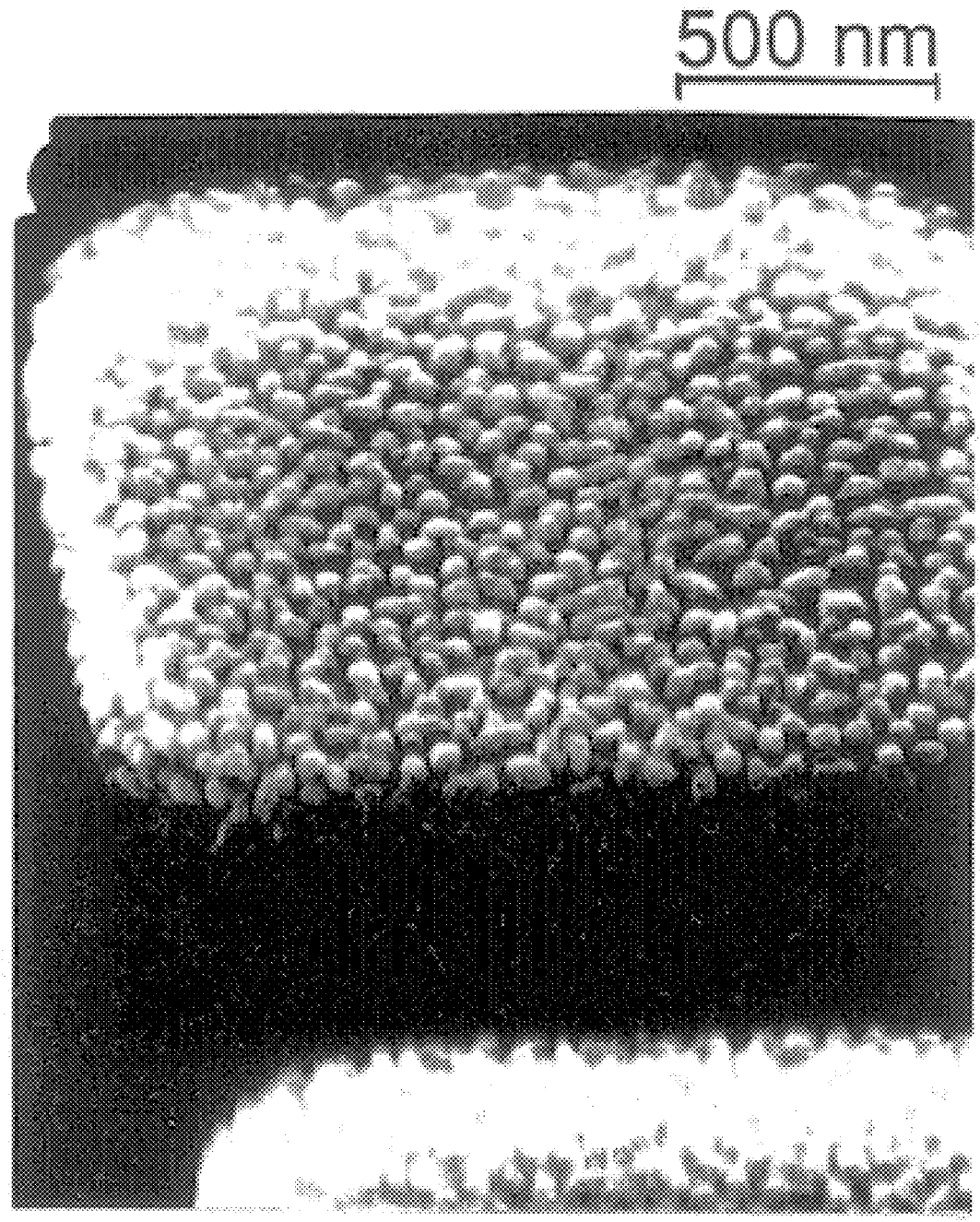
FIG. 26 is a diagram illustrative of a state of silicon grain.

FIG. 26 shows the state of the surface of the electrode when HSG-Si was formed, through irradiation. with disilane gas at a dose of 13 SCCM, on the amorphous silicon electrode heated to 580° C.

Referring to the same drawing, it is apparent that HSG-Si is densely formed also on the side surface of the electrode in the same manner as on the top surface thereof. It is also found that no nuclei are formed on the oxide film, and HSG-Si is formed on the electrode of amorphous silicon.

The condition for the formation of this HSG-Si is the factor in determining the reaction rate of the disilane gas, and the process of substitution of radicals (free radicals) produced by decomposition of the disilane gas for the hydrogen adsorbed on the surface of the film is the stage which determines the rate of the formation of the film in the same manner as in the case of epitaxial growth. For this, it is believed that the radicals produced by the decomposition of the disilane gas are not adsorbed on the oxide film having oxygen-terminated bonds, and thus no nuclei are formed. In addition, being the reaction rate-determining condition, HSG-Si is formed uniformly on the top and side surfaces of the electrode regardless of its shape.

The mechanism to form the nuclei on the amorphous silicon by irradiation with disilane gas will bow be considered based on the results of the experiments mentioned above.

It has been mentioned that the formation of the nuclei using disilane gas results in the formation of hemispheric or spheric grains of uniform size. First, the reason therefor will now be discussed.

The grains have nonuniform sizes when the surface of the amorphous silicon is irradiated with silicon molecular beams. Upon formation of micro-crystal nuclei on the clean surface of the amorphous silicon, the silicon migrating on the surface is captured by the nuclei, and the micro-crystal nuclei start to grow.

In cases where the nuclei were formed with silicon molecular beams, times required for the formation of the micro-crystals on the amorphous silicon spread. This causes the nonuniformity of the grain sizes.

In cases where disilane gas is employed to form micro-crystal nuclei on the amorphous silicon, however, the density of the nuclei increase depending on the irradiation time, whereas the growth of the nuclei does not depend on the irradiation time. This means that during the irradiation of disilane gas a factor works which prevents the growth of the nuclei.

In order to determine the factor, the difference in effect between the irradiation with silicon molecular beams and the irradiation with disilane gas will now be discussed focusing attention on the state of the film surface.

Prior to the formation of the nuclei on the amorphous silicon, the spontaneous oxide film on the surface of the amorphous silicon which had been formed by a LPCVD method as mentioned above was removed by treatment with HF. It is well known that dangling bonds (uncombined bonds) on the silicon film are terminated, with hydrogen.

Thereafter, irradiation with silicon molecular beams or disilane gas was effected in a vacuum apparatus. In cases where the irradiation was effected with silicon molecular beams, the silicon atoms were applied directly to the hydrogen-terminated surface.

Here, since the processing temperature is on the order of 600° C., it is believed that the silicon atoms applied to the surface of the amorphous silicon are substituted for the hydrogen, and eventually the hydrogen is eliminated and thus no hydrogen remains on the surface of the film It is also believed that many dangling bonds of silicon are present in the uppermost surface of the silicon film after the irradiation with silicon molecular beams.

On the other hand, it is known that during low-temperature growth of silicon with disilane gas, the elimination of the hydrogen present on the surface of the deposited silicon determines the rate of the growth of the silicon film. This suggests that the bonds in the uppermost surface of the silicon film formed with disilane gas are always terminated with hydrogen. Another possible cause is the effect of the termination of the dangling bonds of the silicon present on the surface of the amorphous silicon with the hydrogen radicals produced by the decomposition of the disilane gas.

For the foregoing reasons, it is believed that the most different point between the irradiation with silicon molecular beams and that with disilane gas molecular beams resides in the fact that the irradiation with disilane gas results in the termination of the uppermost surface of the film with hydrogen.

Figure 27:
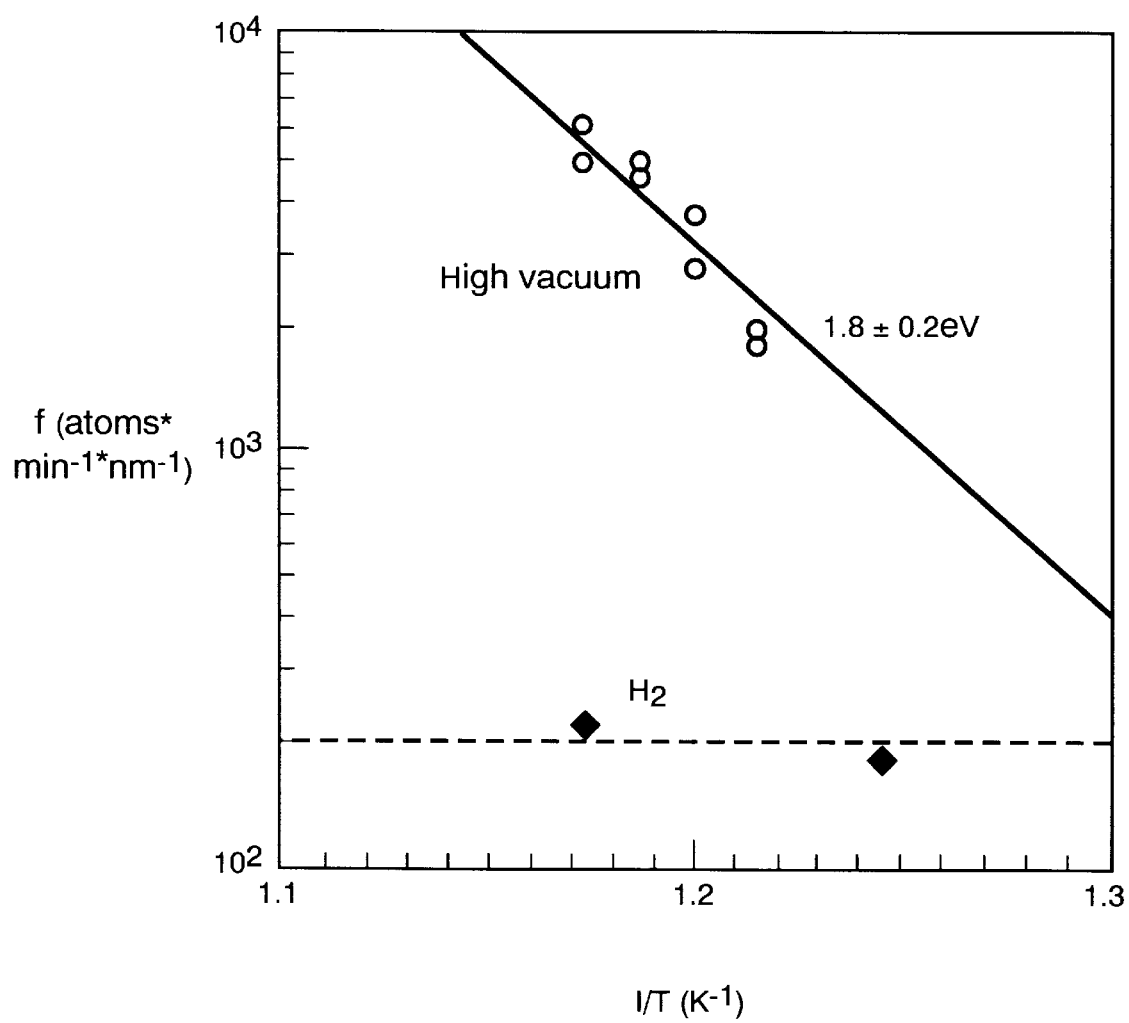
FIG. 27 is a graph illustrative of growth of grain when annealed in a high vacuum and in hydrogen.

FIG. 27 illustrates the state of growth of the grains when annealed in a high vacuum or in hydrogen ($H_2$). The same drawing shows that growth of grains does not occur on the amorphous silicon film annealed in hydrogen gas. On the other hand, the growth of grains was observed when annealed in nitrogen gas, in the same manner as in the case of the annealing in a high vacuum. The above-mentioned facts suggest that hydrogen works as the factor in completely preventing the growth of the grains.

As mentioned above, the grains grow since the silicon atoms migrating on the surface of the film are supplied for the formation of the micro-crystal nuclei. This suggests that the migration of the silicon atoms on the surface of the film is completely prevented when the silicon bonds on the surface of the silicon are terminated with hydrogen. Accordingly, it is imagined that the reason why the micro-crystal nuclei do not grow during the irradiation with disilane gas is also the termination with hydrogen on the surface of the silicon. In fact, it is known that upon irradiation with hydrogen, the silicon bonds are terminated with the hydrogen.

Turning back to FIG. 25, it is apparent that greater doses of disilane gas provide smaller-sized grains. Although being a very strange phenomenon, this is believed to be the result of the increased supply of disilane gas which caused increased times of decomposition of the disilane gas on the surface of the amorphous silicon to cover the surface of the film with an increased amount of hydrogen-terminated silicon atoms thereby reducing the number of the silicon atoms dispersed on the surface correspondingly, which reduction led to the phenomenon In fact, the coverage of the surface of the film with hydrogen atoms is enhanced due to greater doses of disilane gas. Also, as mentioned above, the disilane gas is decomposed only on the surface of the silicon film. This allows the selective formation of the nuclei only on the amorphous silicon.

Furthermore, hemispheric grains were hard to form on the sidewall, etc. of the electrode in cases where the microcrystals were formed on the amorphous silicon by the method for irradiation with silicon molecular beams. This is believed to be contributable to high directivity of the silicon molecular beams and to a high attachment coefficient of the beams. On the other hand, the use of the irradiation process with disilane gas resulted in formation of hemispheric grains not only on the top surface but also the side surface of the electrode. This is believed to have resulted from no directivity of the disilane gas applied to the wafer and a sufficient supply of the gas to the sidewall by reflection from the top surface of the wafer, because the decomposition of the disilane gas on the silicon surface determined the reaction rate.

A description will be now presented regarding the fact that the rate of the growth of the grains during the annealing after the irradiation with disilane gas is determined by the elimination of the hydrogen.

Figure 28A:
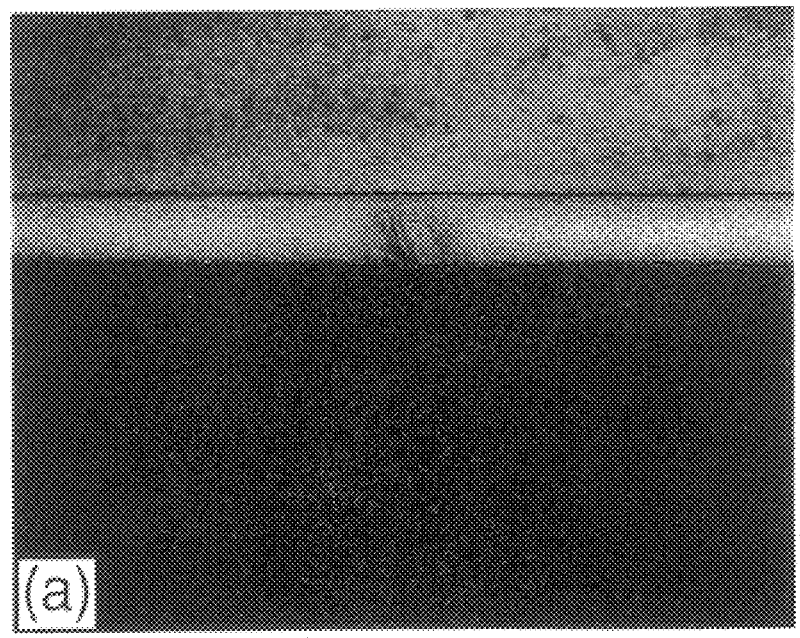
FIGS. 28(a) and 28(b) are diagrams illustrative of difference in grain size and shape between two silicon grains.
Figure 28B:
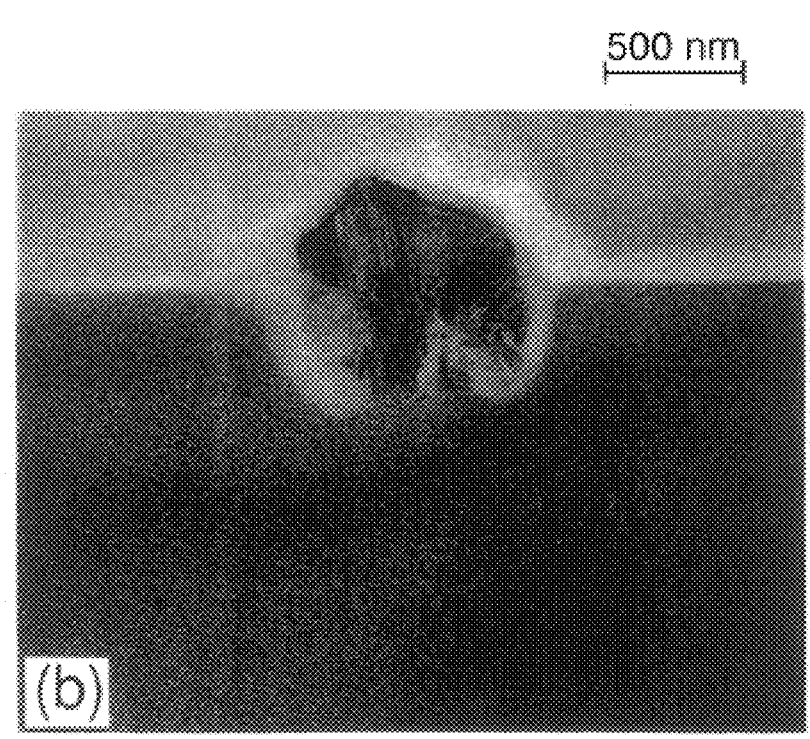

FIG. 28 shows photographs of sections of the grains formed on the amorphous silicon by irradiation with disilane gas and annealing in a high vacuum, taken with a Transmission Electron Microscope (hereunder referred to as "TEM"). Here, FIG. 28(*a*) is a photograph of a section of a grain with a particle diameter of 40 nm, while FIG. 28(*b*) is a photograph of a section of a grain with a particle diameter of 90 nm. Referring to FIG. 28(*a*), in case where the particle diameter is as small as 40 nm, hemispheric crystal grains lie on the amorphous silicon. On the other hand, FIG. 28(*b*) shows that grains 90 nm in particle diameter are almost spheric. It is apparent that the area of contact with the amorphous silicon is only on the order of 50 nm, though each grain has a size increased to approximately 90 nm. This reflects the fact that shapes of the grains are coupled with the grain sizes.

The amorphous silicon film surrounding the grains has local, deep dents along their perimeters. In addition, laminating faults and twin planes are present extending from the center of each grain toward its surface. The central portion of each grain in which these transition planes are interwoven is located at the same level as the surface of the amorphous silicon. This means that the center of each grain corresponds to each core formed on the surface of the amorphous silicon.

Figure 29:
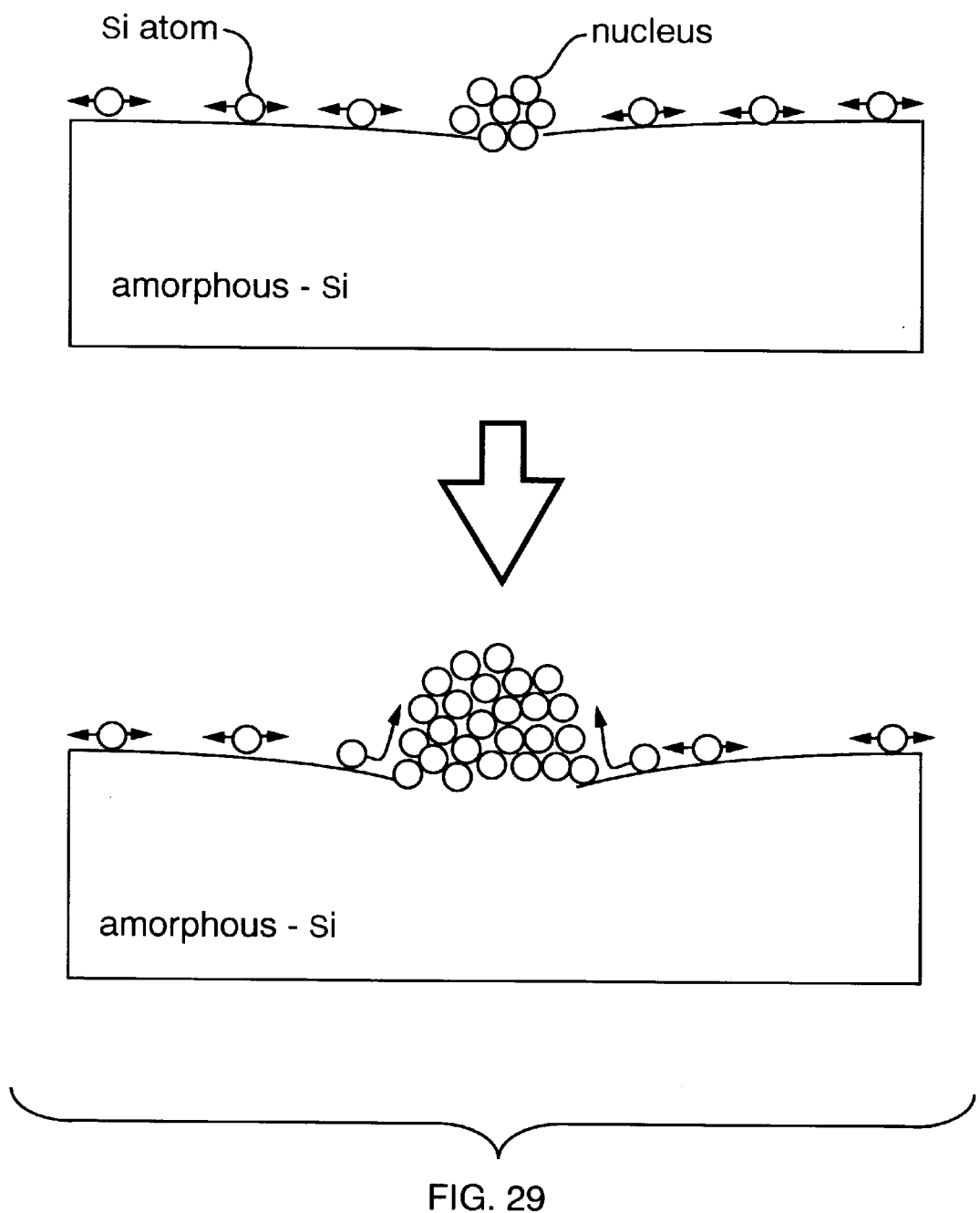
FIG. 29 is a diagram illustrative of process of growth of grains on an amorphous silicon layer not-terminated by hydrogen.

In this connection, FIG. 29 is a schematic view illustrative of the typical process of growth of the HSG-Si formed by annealing, in a high vacuum, amorphous silicon with a clean surface. The same drawing shows the process of growth of a grain on amorphous silicon which is not terminated with hydrogen. In FIG. 29, a grain grows as indicated by the arrow through capture of silicon atoms (Si atoms) migrating on the surface by a nucleus formed on the amorphous silicon (amorphous-Si). That is, HSG-Si grows around the nucleus. Also, the silicon to be used up for the growth of the HSG-Si is made up for by supply from the amorphous silicon surrounding the grain.

Referring to FIG. 28(*a*) again, in the case of the hemispheric grain on the order of 40 nm, the amorphous silicon has a slight dent on the order of 40 nm along the perimeter of the grain. On the other hand, referring to FIG. 28(*b*), when the grain has grown, the amorphous silicon surrounding the HSG-Si has a deep dent section. It is apparent that silicon is supplied mainly through this dent section of the amorphous silicon.

A discussion will now be given on the cause of the process which determines the rate of formation of the HSG-Si on the non-doped amorphous silicon.

As mentioned above, the hemispheric grains are formed only after silicon atoms has started to disperse on the surfaces of the grains. Possible factors in determining the rate of the growth of the grains may be classified into the following two categories. 1) The process of capture of the silicon atoms dispersing on the surface of each grain; and 2) the process of dispersion of the silicon atoms to be supplied to the surface of each grain, or the process of production of the migrating atoms.

Figure 30:
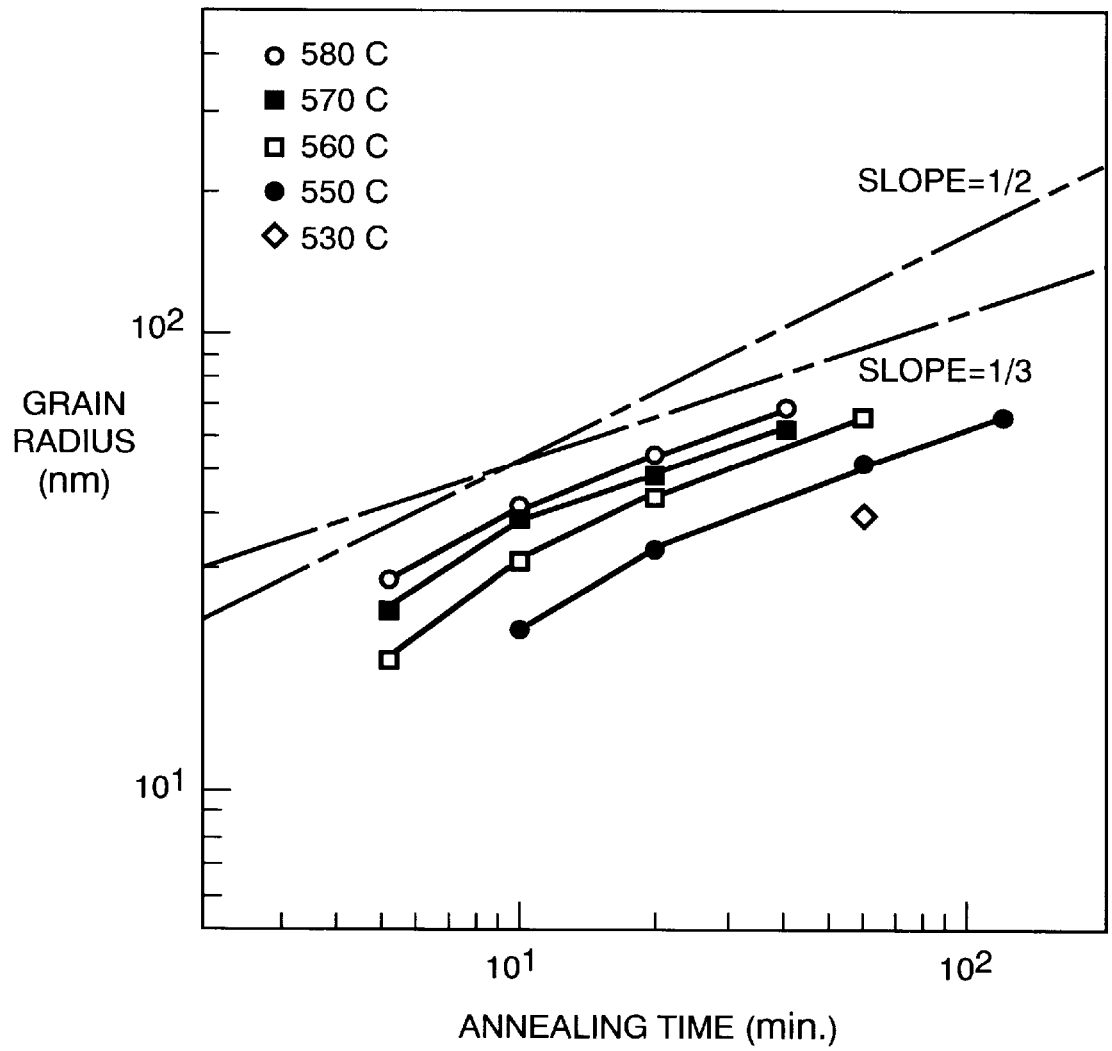
FIG. 30 is a graph illustrative of grain radius to annealing time in irradiation of disilane gas.

In order to determine the rate-determining process, an investigation was carried out regarding how the sizes of the grains on the amorphous silicon film changes with a change in the annealing time in a high vacuum after the irradiation with disilane gas. The results are shown in FIG. 30. The same drawing shows the results of experiments which involved irradiation with disilane gas and annealing at temperatures of 530° C, 550° C., 560° C., 570° C. and 580° C.

If the increase in the radius (r) of each grain is linear with respect to time (t), then the slope should be 1. In practice, however, it has been found that the slope is ½ in early stages of the growth of the gains, and the slope approaches ⅓ around when the grains exceed 50 nm. This means that the particle diameter (2r) of the HSG-Si increases in such a manner that $r^2$ is in proportion to t in early stages of the growth (while the grain sizes are small), and $r^3$ is in proportion to t as the annealing time is prolonged (after the grain sizes have been increased).

If the process of capture of the silicon atoms dispersed on the surfaces of the grains determines the rate of the growth of the micro-crystals on the surface of the silicon, it is supposed that more silicon atoms are supplied to the grains than the atoms captured on the surfaces of the grains. Accordingly, assuming that the possibility of capture of the atoms on the surfaces of the grains remains unchanged along the entire surfaces of the grains, the rate of increase of the radius (r) of each grain should become larger linearly with respect to time.

However, since r is not in proportion to t, that process is understood not to be the rate-determining process. To the contrary, if the process of dispersion of the silicon atoms to be supplied to the surfaces of the grains or the process of production of the migrating atoms is rate-determining, then the volume $r^3$ of each grain should increase in proportion to time.

It is known that the rate of the growth of the HSG-Si is determined by the process of supply of silicon atoms to the grains. The same document includes the following description of the phenomenon of increase in the particle diameter of the HSG-Si according to $r^2=a \cdot t$.

Figure 31:
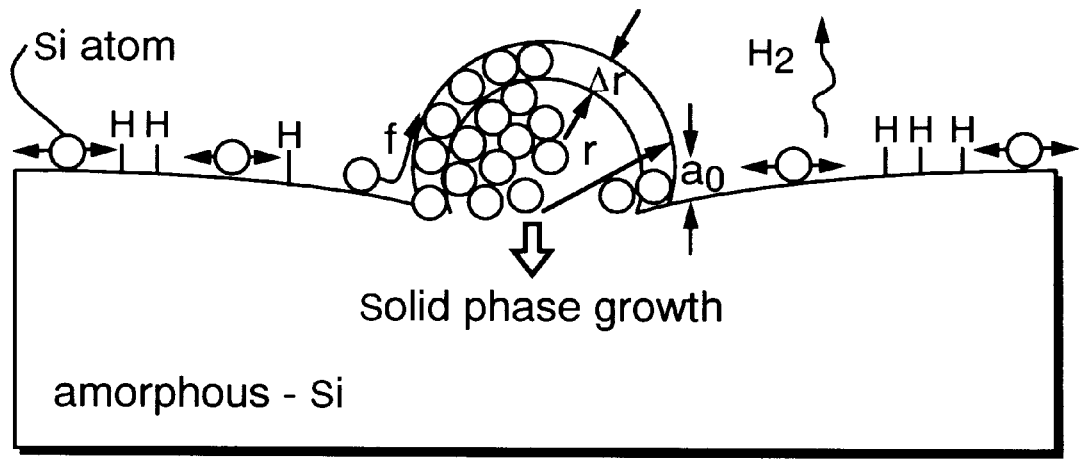
FIG. 31 is a diagram illustrative of size and shape of a silicon grain.

As the formation of the HSG-Si advances, the area of the perimeter of each grain which becomes in contact with the amorphous silicon increases as shown in FIG. 31. The length of the periphery along the contact between each grain and the amorphous silicon defines the uptake port for the silicon atoms dispersing on the surface. In brief, since the area of the uptake section for the migrating silicon atoms which are necessary for the growth of the HSG-Si increases linearly with respect to time, the number of the captured atoms increases in proportion to time. The process of this growth is suggested to be expressed by the following equation:

$$d(2\pi r(t)^3/3V_p)/dt = 2\pi r(t)a_0 f \quad (1)$$

The above equation leads to the following equation:

$$R_2 = 2a_0 V_0 ft \quad (2)$$

Here, $V_0$ is the volume of the silicon atoms (nm$^3$), $a_0$ is the thickness of the section of contact between the amorphous silicon and the HSG-Si (nm) (the thickness of the section into which the supplied silicon atoms flow; a one-atom layer in practice), and f is the flow rate of the atoms which flow into each grain from the amorphous silicon per unit time (atoms·min$^{-1}$·nm$^{-2}$).

Also in the case of the irradiation with disilane gas, it is supposed that this phenomenon occurs in the region in early stages of growth of the grains when $r^2$ is in proportion to t, and thus the grains grow. This is confirmed by referring to FIG. 28(a) which shows the fact that the grains are hemispheric.

Now, consideration will be given to the process of the grain sizes increasing with a proportional relationship between $r^3$ and t, as shown in FIG. 30. A schematic view of progress of the growth during that process is presented as FIG. 32. The process of increase in the grain sizes with the proportional relationship with $r^3$ is observed in the stages of the grain sizes exceeding approximately 50 nm regardless of the annealing temperature. The TEM photograph shown in FIG. 28(b) proves that the section 2r* of contact between the almost hemispheric grain with a size increased to approximately 90 nm and the amorphous silicon is on the order of 50 nm.

This reflects the fact that the radius of the section of contact between the amorphous silicon and the HSG-Si remains almost unchanged after the sizes of the grains have attained 50 nm or more, This means that the uptake port for the silicon atoms supplied to each micro-crystal has a constant size. During this process of the growth of the grains, the amount of the silicon atoms supplied to each grain is believed to be constant. Accordingly, it is supposed that the growth of the grains advances according to the following equation:

$$d(4\pi r(t)^3/3V_0)/dt = 2\pi r^* a_0 f \quad (3)$$

This leads to the following equation:

$$r^3 = 3a_0 V_0 f r^* t/2 \quad (4)$$

Here, r* is the radius of the section of contact between the amorphous silicon and each grain, or 25 nm.

From the above-mentioned, it has been found that the grains grow as hemispheres with a proportional relationship between $r^2$ and f·t in early stages of the growth of the grains, and the grains grow and change almost to spheres with a proportional relationship between $r^3$ and f·t.

The change of the shapes of the grains from hemispheres to spheres does not occur rapidly. Accordingly, it is believed that the shift from Equation (2) to Equation (4), which regulate the growth of each grain, advances gradually after the size of each grain has attained 50 nm or more. This process will be discussed later.

Figure 33:
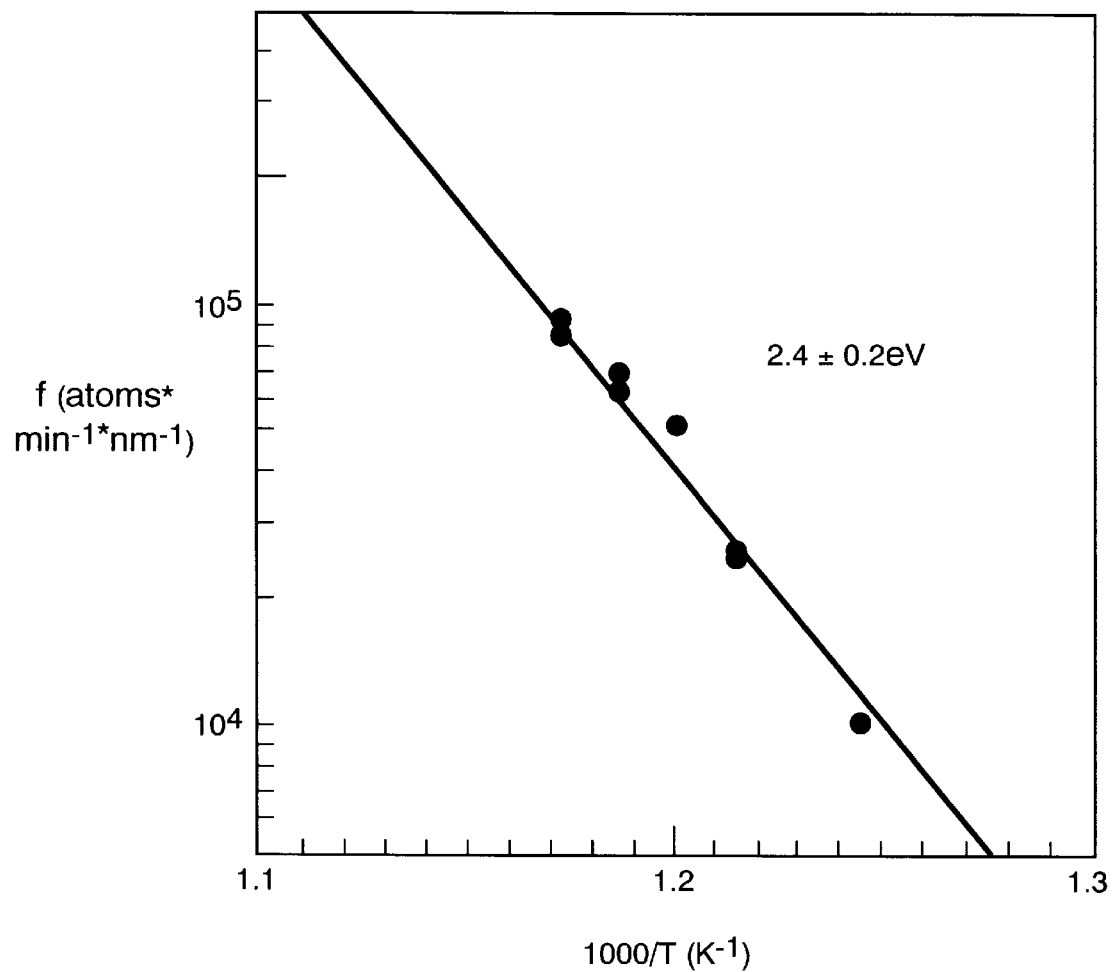
FIG. 33 is a graph illustrative of growth of spherical silicon grains.

The above-mentioned results prove that the rate of growth of the grains is determined by the number of the silicon atoms supplied onto the micro-crystals. Therefore, for further investigation of the process, FIG. 27 and FIG. 33 show, respectively, the results of Arrhenius plotting of f in the region with the proportional relationship between $r^2$ and f·t and in the region with the proportional relationship between $r^3$ and f·t.

Referring to these drawings, when treated by annealing in a high vacuum, the activation energy of the silicon atoms supplied to each grain was 1.8 eV in early stages of its growth. The activation energy attained approximately 2.4 eV in the region where the growth of the enlarged grains is observed with $r^3$ as the indicator. These facts prove that the region observed with $r^2$ and the region observed with $r^3$ have different factors in determining the rate of the growth of the grains on the non-doped amorphous silicon. Also, the results of treatment by annealing in an atmosphere of hydrogen are shown in FIG. 27. It is apparent from FIG. 27 that the growth of the grains does not depend on the temperature when treated by annealing in an atmosphere of hydrogen. The experiment was carried out by the following procedures:

First, hydrogen gas was introduced upon completion of irradiation with disilane gas, and the wafer was maintained in the atmosphere of hydrogen at 10 Torr and 580° C. for 30 minutes. Thereafter, the wafer was taken out after the temperature was decreased to 530° C. in the atmosphere of hydrogen and then the hydrogen gas was cut off.

On the other hand, in cases where the nuclei were formed at 530° C., the annealing was conducted under atmosphere of hydrogen at the same temperature for 30 minutes, the gas was cut off, and then the wafer was taken out.

When treated by annealing in an atmosphere of hydrogen, the increase in the grain sizes has no temperature-dependency. This means that in cases where the annealing was effected in an atmosphere of hydrogen, any of the phenomena which contribute to the growth of the grains completely failed to occur.

This phenomenon will be now considered.

As mentioned above, in cases where micro-crystals are formed by application of disilane gas onto the amorphous silicon, followed by annealing treatment in a high vacuum, hemispheric grains are formed in early stages of their growth according to Equation (2) and grow to spheric grains which grows according to Equation (4).

Hereunder, the process of such change in the shapes of the grains will be discussed.

From FIG. 27 and FIG. 8, it is apparent that the number f of the silicon atoms supplied to each grain increases nearly 20-fold when the grains proceed from the hemispheric stage to the spheric stage. In addition, the activation energy of the flow rate f of the silicon supplied to each grain was 1.8 eV in early stages of the growth, but increased to 2.4 eV after the grains changed to spheres.

For the foregoing facts, it is apparent that since different processes determine the rate of supply of the silicon atoms to the grains in the region where the grains grow as hemispheres and the region where the grains grow as spheres, the number of the silicon atoms supplied to the grains changed.

Incidentally, the greatest difference between the shapes of the respective grains shown in FIGS. 28($a$) and 28($b$) is in the state of dents in the amorphous silicon along the perimeters of the grains. As mentioned above, in the case of the 40 nm grain which grows as a hemisphere, only a dent on the order of 3 nm is formed along the perimeter of the grain, as shown in FIG. 28($a$). Accordingly, it is apparent that in the region where hemispheric grains grow, the supply of the silicon atoms to the grains is mainly effected in the vicinity of the uppermost surface of the amorphous silicon. In practice, referring to FIG. 28($a$), the number of the silicon atoms in the grain is on the order of 350,000. This number is almost the same as the number of the silicon atoms in the slightly denting section along the perimeter of the grain.

On the other hand, referring to FIG. 28($b$), it is understood that in the region where the grains grow as spheres, the supply of the silicon atoms to the spheric grains is mainly conducted at the local dent sections of the amorphous silicon near the grains. This is understood from the fact that the volume of the portion of each grain which is located higher than the level of the surface of the amorphous silicon is roughly the same as the volume of the dent section of the amorphous silicon. In other words, the silicon atoms are supposed to be supplied via portions which are hard to be influenced by the surface of the amorphous silicon.

The rate-determining process in the supply of the silicon atoms to the grains in early stages of the growth of the grains will be now discussed. As mentioned above, the activation energy of the feed rate f of the silicon atoms to each grain is 1.8 eV, and the silicon atoms are supplied in the vicinity of the surface of the amorphous silicon. Also, as mentioned above, since the surface of the amorphous silicon is terminated with hydrogen during the irradiation with disilane gas, the silicon atoms do not migrate. Accordingly, it is supposed that the hydrogen must be eliminated from the film surface for migration of the silicon atoms on the film surface.

In this connection, it is known that the activation energy for the limination of the hydrogen from the silicon surface is on the order of 1.9 eV. This value exactly matches with the activation energy in early stages of the growth which was found as a result of the experiments effected by the present inventors. The foregoing facts suggest that in early stages of the growth of the HSG-Si, the rate of growth of the grains is determined by the process of production of the silicon which migrates upon elimination of the hydrogen from the surface of the amorphous silicon.

With the silicon atoms on the uppermost surface alone, however, it is impossible to form grains with sizes on the order of 40 nm. Therefore, it is supposed that in practice there should exist the process of production of silicon, which migrates, from the silicon in a fresh uppermost surface so that the silicon atoms on the uppermost surface migrate upon extraction of the terminating hydrogen.

Examination of FIG. 28($a$) reveals that approximately 10 atoms layers are used up along the perimeter of the hemispheric grain. In other words, it is supposed that production of a local hole in the surface from which hydrogen has been extracted allows migration of silicon atoms in several layers lying under the uppermost surface. Since the production of the silicon which migrates advances in proportion to the area of the holes in the surface from which hydrogen has been extracted, it is supposed that the activation energy is equal to the energy for elimination of the hydrogen.

Figure 32:
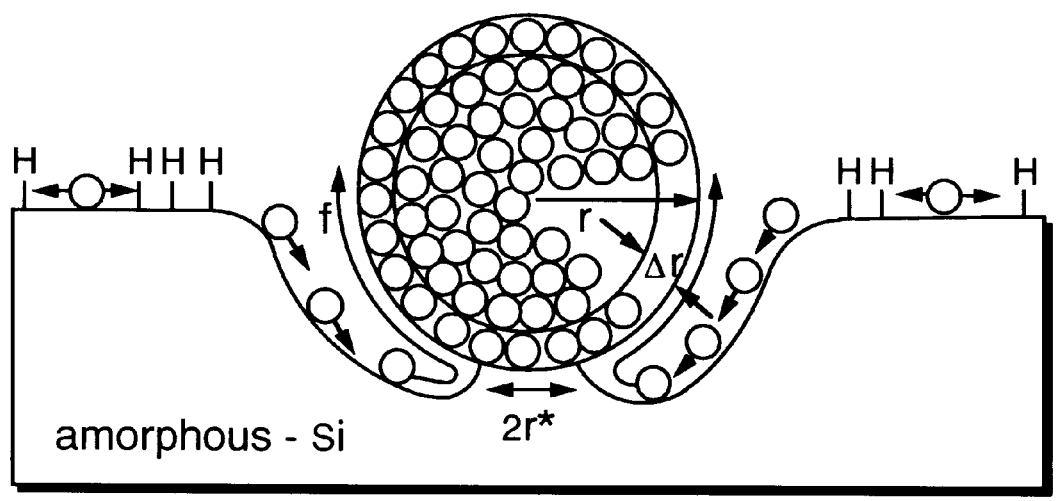
FIG. 32 is a diagram illustrative of size and shape of another silicon grain.

On the other hand, the change of the shapes of the grains to spheres is a result of the process of supply to the grains of the silicon atoms inside the film which are not terminated with hydrogen, as shown in FIG. 32. In other words, the number of the silicon atoms which are supplied from each dent section of the amorphous silicon to each grain should increase. Accordingly, it is important to know the difference in the amount of the silicon atoms which are supplied to each grain, which causes the change of the shape of each grain from a hemisphere to a sphere.

This difference is found by comparison in the f values. It is apparent from FIG. 27 and FIG. 8 that the f values in cases where the silicon atoms are supplied through the dent sections of the film increase to approximately 20 times or more the f values in cases where the silicon atoms are mainly supplied through the surface of the film. In brief, it is apparent that more number of silicon atoms are supplied to the crystal nuclei by migration through the uppermost surfaces of the dent sections of the amorphous silicon. This is believed to be because the silicon inside the film is not terminated with hydrogen.

That is, during this process elimination of the hydrogen in the surface sections of the silicon film along the perimeter of the micro-crystals presents a driving force for the growth of grains. Extraction of silicon atoms from the surface which follows elimination of the hydrogen facilitates the migration of silicon atoms in the regions neighboring the extracted silicon atoms, and the silicon atoms in these regions are used up preferentially for the formation of the grains.

Accordingly, the change in the activation energy is caused by the fact that most of the silicon atoms supplied to the grains are supplied through the dent sections of the amorphous silicon.

As mentioned above, the activation energy for the flow rate f of the silicon atoms supplied to each grain is 2.4 eV during growth of the spheric grains. Accordingly, it is understood that the grains are no longer influenced by the process of elimination of the hydrogen on the uppermost surface.

Hereunder, discussion will be focused on what determines the rate.

There are three possible definite phenomena which determine the supply process: the process of production of the silicon atoms which undergo surface diffusion on the amorphous silicon, the process of surface diffusion on the amorphous silicon and the process of diffusion of the atoms from the amorphous silicon to the crystal nuclei.

First, a discussion will be given on the case where the process of production of the silicon atoms which migrate on the amorphous silicon determines the rate. As mentioned above with reference to FIG. 28(b), silicon atoms used up for the growth of each grain are mainly supplied through the surface of the dent section along the perimeter of each grain. The area of each dent section producing the silicon which migrates, increases as each grain grows.

Accordingly, if the production of the silicon which migrates determines the rate, then the number of the silicon atoms supplied to each grain should increase as the area of the dent section along the perimeter of each grain increases. However, the flow rate f of the silicon supplied to each grain is constant regardless of the area of each section for producing the silicon atoms which migrate. This suggests that during the formation of the spheric grains the process of production of the silicon which migrates does not determine the rate of the growth of the grains.

Accordingly, it is supposed that the process which determines the growth of the grains is the process of transfer of the silicon atoms from the amorphous silicon to the micro-crystals, or the process of diffusion of the migrating silicon on the amorphous silicon.

In summary, it has been found that the disilane gas decomposes at temperatures below the crystallization temperature of the amorphous silicon and forms micro-crystals selectively only on the surface of the amorphous silicon. Occurrence of this phenomenon is greatly different from the selective growth of the amorphous silicon by the irradiation with silane gas which was described in Embodiment 1.

It has also been found that in cases where hydrogen is adsorbed to the surface of the amorphous silicon, the surface migration of the silicon atoms is suppressed and eventually the growth of the nuclei does not advance.

On the other hand, it has been found that in cases where the disilane gas irradiation is followed by annealing treatment in a high vacuum, the grain grows at a rate determined by the elimination of hydrogen. This finding supports the fact that the hydrogen suppresses the surface migration of the silicon atoms.

Although the present example does not include a detailed description of the case of the use of silane gas, the use of this gas results in formation of amorphous silicon on the amorphous silicon in the same manner as in Embodiment 1. Effects of the hydrogen on the film is completely the same as the effects mentioned above.

Accordingly, in cases where the temperature is lowered during the irradiation with hydrogen gas, no micro-crystals are formed on the surface of the amorphous silicon film, and a silicon film with a smooth surface is formed. With a prototype of a TFT (thin-film transistor) manufactured using this film in practice, the on-state current increased to around 10 times as compared with the case of the use of a conventional polycrystal silicon film. On the other hand, in cases where no treatment with hydrogen was conducted, micro-crystals are formed on the surface of the film in the same manner as described in Embodiment 2.

With a TFT manufactured using this film, the on-state current dropped to approximately one-twentieth as compared with the case of the use of a polycrystal silicon film. This is believed to have been caused by the change in mobility of the carriers due to the irregularities of the surface of the film.

Also, the results of the experiments conducted with a cold-wall type system were described in the present example. In cases where this system was used, the selectivity was not impaired until after approximately 5 minutes. This is because the atoms are hard to decompose even upon collision with the chamber. As mentioned in Embodiment 1, however, the selectivity can be maintained only for approximately 3 minutes in cases where a hot-wall system is used. Also, it has been confirmed that in cases where silane gas is employed, the selectivity can be maintained for over 60 minutes with either a hot-wall system (the system where the wall of the reaction chamber is heated to almost the same temperature as the wafer) or a cold-wall system (the system where the wall of the reaction chamber is maintained at a temperature lower than the temperature of the wafer).

In addition, it has been confirmed that the same effect is produced using oxygen instead of the hydrogen. This is because oxidation at low oxygen pressures results in oxidation of the surface of the amorphous silicon film, which leads to suppression of the surface migration of the atoms.

However, effects different from the above-mentioned may be produced in cases where the degree of oxidation is low.

Since the above-mentioned effect becomes more remarkable by using radicalized gas regardless whether the oxidation or the surface passivation by hydrogen is utilized, the radicalization is desired.

Also, in cases where disilane gas is used, the formation of nuclei on the amorphous silicon starts upon irradiation with the gas, and growth of grains start after completion of the irradiation. This leads to formation of uniform grains On the other hand, in cases where silane gas is irradiated, formation of micro-crystals start during annealing after the gas irradiation.

Accordingly, this process is inferior to the disilane gas irradiation process from a point of view of formation of grains of uniform size. That process, however, may be improved to accomplish control of the grain density and sizes.

Embodiment 8

Since the surface of an amorphous silicon formed by Embodiment 7 is made even, such a silicon layer can be used a silicon layer as a thin-film-transistor for a SRAM cell, as described below as the eighth embodiment of the present invention.

Figure 34A:
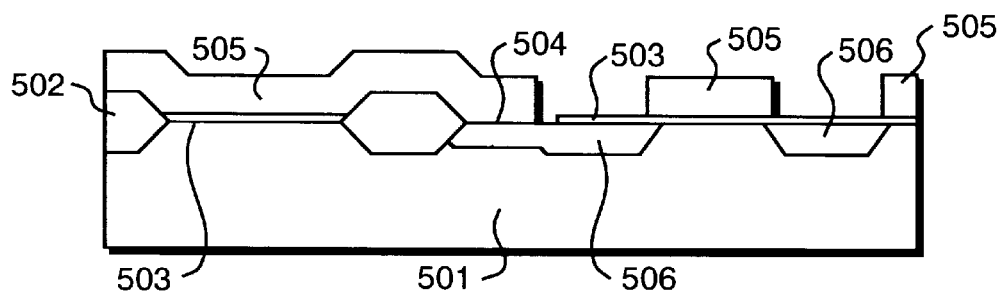
FIGS. 34(a) to 34(g) are cross section views illustrative of respective steps of fabricating an SRAM cell.

More specifically, as shown in FIG. 34(a), a P-type silicon substrate 501 is selectively covered with a field oxide layer 502 formed by the so-called LOCOS method to define active areas Gate oxide layers 503 are then formed on the active areas by the thermal oxidation, followed by being selectively removed to form a contact hole 504. Gate electrodes/wirings 505 are thereafter formed in desired patterns. Each gate electrode 505 consists of in-situ phophorous-doped silicon layer and tungsten silicide layer formed thereon. One of the gate electrodes 505 is in contact with the part of substrate 501 through the contact hole 504. N-type impurity ions such as arsenic ions are then implanted into the substrate 501 by using the gates 505 and the field oxide layer 502 as a mask, followed by performing annealing process. Thus, the implanted impurity ions are activated together with doping impurities from the poly-silicon gate layer 503 into the substrate, so that N-type regions 506 are selectively formed in the substrate 501.

Figure 34B:
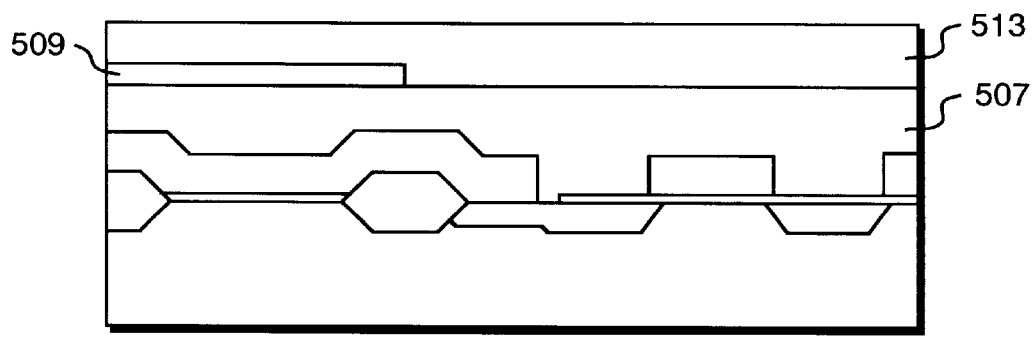

As shown in FIG. 34(b), a silicon oxide layer 507 as an interlayer insulating film is deposited over the entire surface. Thereafter, although not shown in the drawing, a ground contact hole is selectively formed in the layer 507 to expose a part of the region 506, and a ground wiring layer 509 is then formed on the layer 507 in contact with that part of the region 506 through the ground contact hole. Another interlayer insulating layer 513 such as a silicon oxide film is thereafter deposited over the entire surface.

Figure 34C:
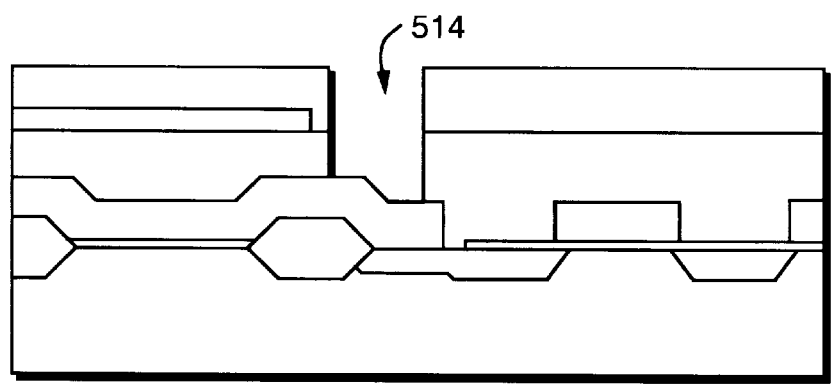

Next, dry-etching process is performed to form a contact hole 514 which penetrates the insulating layers 507 and 513 to expose a part of the gate 505 on the contact hole 504, as shown in FIG. 34(c).

Figure 34D:
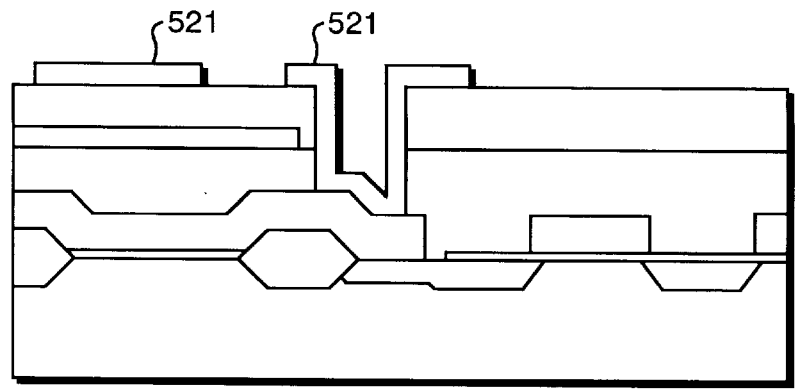

A poly-silicon layer is then deposited over the entire surface by the LPCVD and doped with N-type or P-type impurities by the ion-implantation, followed by being patterned. Poly-silicon layers 521 are thus formed, as shown in FIG. 34(d). As illustrated, the left-side poly-silicon layer 521 is formed in contact with the gate layers 505 through the contact hole 514.

Figure 34E:
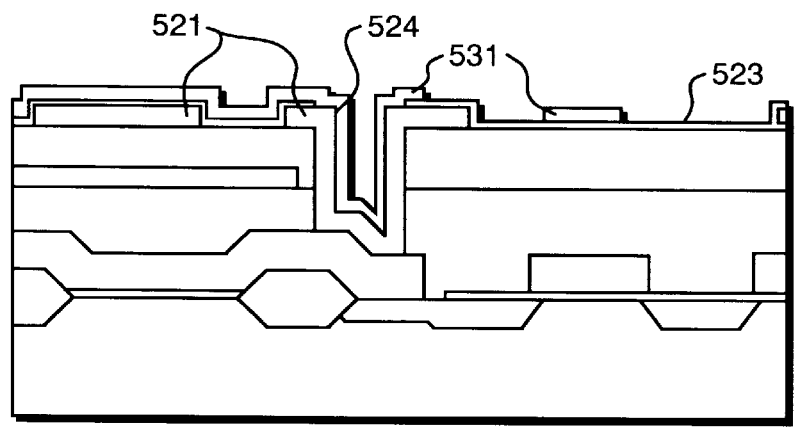

Subsequently, as shown in FIG. 34(e), a gate oxide film 523 made of silicon oxide is deposited on the entire surface by the LPCVD using $SiH_2$, $N_2$ and $O_2$ gases at a temperature of 800° C. The film thus deposited has an excellent step-coverage to serve as a good gate insulating film. If desired, other layers such as composite layers of oxide and nitride layers or an oxi-nitride layer may be used as the layer 523. Subsequently, the gate insulating film 523 is selectively removed to form a hole 524 by dry etching using a photoresist layer (not shown) as a mask. A part of the poly-silicon layer 521 is thereby exposed by the hole 524. The photoresist layer is then removed, and the exposed part of the polysilicon layer 521 is cleaned in a manner as described above to remove a native oxide film therefrom. An amorphous silicon layer is then deposited over the entire surface by LPCVD using a silane gas in a thickness of 15 nm. The flow rate of the silane gas is 200 cc/min in an vacuum atmosphere of 0.1 Torr. Simultaneously with the completion of the deposition of the amorphous silicon layer, a hydrogen gas is introduced at a pressure of 1 Torr, and an annealing is performed at a temperature of 600° C. for three hours. As a result, such an amorphous silicon layer that has an even surface is formed. N-type impurities such as arsenic are then implanted, followed by annealing and patterning. As a result, N-type impurities-doped poly-silicon layers 531 is formed as shown in FIG. 34(e).

Figure 34F:
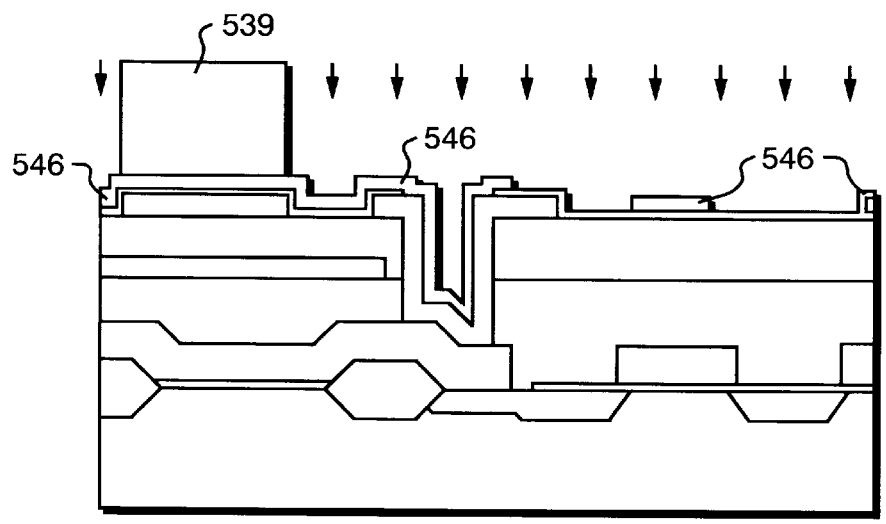

Subsequently, as shown in FIG. 34(f), a photoresist layer 539 is selectively formed, and boron-implantation is carried out using the photoresist layer 539 as a mask. Accordingly, selected-parts 546 of the poly-silicon layer 531 is converted into a P-type to serve as source/drain regions.

Figure 34G:
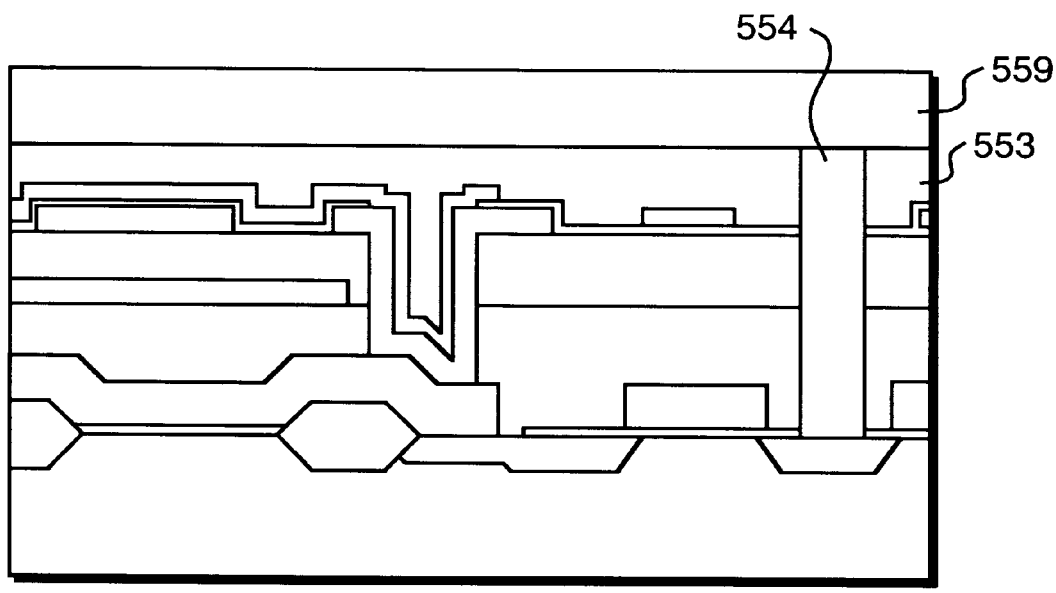

As shown in FIG. 34(g), after removing the photoresist layer 539, an interlayer insulating film 553 is deposited over the entire surface, followed by forming a bit contact hole 554. A bit line 559 is thereafter formed with filling the contact hole 554.

It is apparent that the present invention is not limited to the above embodiments but may be modified and changed without departing from the scope and spirit of the invention.

What is claimed is:

1. A method of producing a silicon film comprising:
   loading a substrate into a chamber;
   introducing a material gas into said chamber at a first temperature to deposit a silicon layer on said substrate;
   stopping introducing said material gas; and
   following stopping introducing said material gas, introducing an oxygen gas into said chamber with reducing a temperature of said chamber from said first temperature to a second, lower temperature.

2. The method as claimed in claim in claim 1, wherein said material gas includes at least one of a silane gas and a disilane gas.

* * * * *

UNITED STATES PATENT AND TRADEMARK OFFICE
CERTIFICATE OF CORRECTION

PATENT NO. : 5,910,019

DATED : April 2, 1997

INVENTOR(S) : Hirohito Watanabe and Ichiro Honma

It is certified that error appears in the above-identified patent and that said Letters Patent is hereby corrected as shown below:

Title page, add reference to item

--[30] Foreign Application Priority Data
March 6, 1995 [JP] Japan ....... 7-072276
October 5, 1995 [JP] Japan ....... 7-284485--.

Signed and Sealed this

Eleventh Day of January, 2000

Attest:

Q. TODD DICKINSON

*Attesting Officer*        *Acting Commissioner of Patents and Trademarks*